US007889111B2

(12) United States Patent
Kawahito

(10) Patent No.: US 7,889,111 B2
(45) Date of Patent: Feb. 15, 2011

(54) ANALOG DIGITAL CONVERTER, A/D CONVERSION STAGE, METHOD FOR GENERATING DIGITAL SIGNAL CORRESPONDING TO ANALOG SIGNAL, AND METHOD FOR GENERATING SIGNAL INDICATING CONVERSION ERROR IN THE A/D CONVERSION STAGE

(75) Inventor: Shoji Kawahito, Hamamatsu (JP)

(73) Assignee: National University Corporation Shizuoka University (JP)

( * ) Notice: Subject to any disclaimer, the term of this patent is extended or adjusted under 35 U.S.C. 154(b) by 7 days.

(21) Appl. No.: 12/303,909

(22) PCT Filed: Jun. 8, 2007

(86) PCT No.: PCT/JP2007/061635

§ 371 (c)(1),
(2), (4) Date: Apr. 24, 2009

(87) PCT Pub. No.: WO2007/142328

PCT Pub. Date: Dec. 13, 2007

(65) Prior Publication Data
US 2009/0243900 A1 Oct. 1, 2009

(30) Foreign Application Priority Data

Jun. 8, 2006 (JP) ............................ P2006-160159
Jul. 20, 2006 (JP) ............................ P2006-198380

(51) Int. Cl.
H03M 1/40 (2006.01)
(52) U.S. Cl. ..................... 341/162; 341/163; 341/172
(58) Field of Classification Search ................ 341/118, 341/120, 161, 162, 163, 172
See application file for complete search history.

(56) References Cited
U.S. PATENT DOCUMENTS
5,027,116 A 6/1991 Armstrong et al.

5,212,486 A 5/1993 Nagaraj
5,327,129 A * 7/1994 Soenen et al. ............... 341/120
5,510,789 A 4/1996 Lee
6,535,157 B1 3/2003 Garrity et al.

(Continued)

FOREIGN PATENT DOCUMENTS
GB 2 419 047 12/2006

(Continued)

OTHER PUBLICATIONS
English translation of the International Preliminary Report on Patentability issued Jan. 22, 2009 in corresponding PCT Application.

(Continued)

Primary Examiner—Howard Williams
(74) Attorney, Agent, or Firm—Ostrolenk Faber LLP

(57) ABSTRACT

A conversion operation B is performed with respect to a sample value R in an A/D conversion stage 101 to generate a conversion result D3, and a sampling operation A is performed with respect to this conversion result D3 in an A/D conversion stage 103. The conversion operation B is performed with respect to a sample value in an A/D conversion stage 105 to generate a conversion result D4, and the sampling operation A is performed with respect to the conversion result D4 in an A/D conversion stage 107. The conversion operation B is performed with respect to a sample value in an A/D conversion stage 107 to generate a conversion result D5, and the sampling operation A is performed with respect to this conversion result D5 in an A/D conversion stage 101. The conversion operation B is performed with respect to a sample value in the A/D conversion stage 103 to generate a conversion result D6, and the sampling operation A is performed with respect to the conversion result D6 in the A/D conversion stage 105.

42 Claims, 35 Drawing Sheets

U.S. PATENT DOCUMENTS

| | | | |
|---|---|---|---|
| 6,750,799 B1 * | 6/2004 | Opris | 341/161 |
| 6,784,824 B1 * | 8/2004 | Quinn | 341/172 |
| 6,967,611 B2 * | 11/2005 | Atriss et al. | 341/172 |
| 7,009,549 B1 * | 3/2006 | Corsi | 341/161 |
| 7,187,310 B2 * | 3/2007 | El-Sankary et al. | 341/120 |
| 2005/0024250 A1 | 2/2005 | Atriss et al. | |
| 2005/0078026 A1 | 4/2005 | Cai | |

FOREIGN PATENT DOCUMENTS

| | | |
|---|---|---|
| JP | 2006-33304 | 2/2006 |
| WO | 94/27373 | 11/1994 |
| WO | 2005/041419 | 5/2005 |

OTHER PUBLICATIONS

International Search Report issued Sep. 11, 2007.

European Search Report issued Apr. 28, 2009 in connection with corresponding European Application No. 07744951.0-2206.

Garrity, et al. "A 10 bit, 2Ms/s, 15mW BiCMOS Cyclic RSD A/D Converter," Bipolar/BiCMOS Circuits and Technology Meeting (1996).

Ming, et al., "An 8-bit 80-Msample/s Pipelined Analog-to-Digital Converter With Background Calibration," IEEE Journal of Solid-State Circuits, vol. 36(10), (2001).

Matsuura, et al., "A 10-bit 3-Msample/s CMOS Multipath Multibit Cyclic ADC," IEICE Trans. Electron., vol. E83-C (2) (2000).

Tsukamoto, K., et al., "A Pipelined Charge-Balancing A/D Converter," Instrumentation and Measurement Technology Conference, IMTC/93, Conference Record, IEEE, pp. 217-220, (1993).

Mase, M., et al., "A 19.5b Dynamic Range CMOS Image Sensor with 12b Column-Parallel Cyclic A/D Converters," Solid States Circuit Conference, Digest of Technical Papers, IEEE, International, pp. 350-351 and 603, vol. 1, (2005).

Chiu, Y., "Inherently Linear Capacitor Error-Averaging Techniques for Pipelined A/D Conversion," IEEE Transactions on Circuits and Systems II: Analog and Digital Signal Processing, vol. 47(3), pp. 229-232, (Mar. 2000).

Quinn, P., et al., "Capacitor Matching Insensitive 12-bit 3.3 MS/s Algorithmic ADC in 0.25 µm CMOS," Proc. 2003 Custom Integrated Circuits Conference, pp. 425-428, (2003).

Ginetti, B., et al., "A CMOS 13-b Cyclic RSD A/D Converter," IEEE Journal of Solid-State Circuits, vol. 27(7), pp. 957-965, (Jul. 1992).

Nagaraj, N., "Efficient Circuit Configurations for Algorithmic Analog to Digital Converters," IEEE Transactions on Circuits and Systems II: Analog and Digital Signal Processing, vol. 40(12), pp. 777-785, (Dec. 1993).

Lee, H., "A 12-b 600 ks/s Digitally Self-Calibrated Pipelined Algorithmic ADC," IEEE Journal of Solid-State Circuits, vol. 29(4), pp. 509-515, (Apr. 1994).

Ming, J. et al., "An 8b 80MSample/s Pipelined ADC with Background Calibration," IEEE International Solid-State Circuits Conference, pp. 42-43, (2000).

European Office Action issued Jun. 23, 2010 in connection with corresponding European Application No. 07 744 951.0.

* cited by examiner

ANALOG DIGITAL CONVERTER, A/D CONVERSION STAGE, METHOD FOR GENERATING DIGITAL SIGNAL CORRESPONDING TO ANALOG SIGNAL, AND METHOD FOR GENERATING SIGNAL INDICATING CONVERSION ERROR IN THE A/D CONVERSION STAGE

CROSS-REFERENCE TO RELATED APPLICATION

The present application is a 35 U.S.C. §371 national phase conversion of PCT/JP2007/061635 filed Jun. 8, 2007 and claims priority of JP2006-160159 filed Jun. 8, 2006 and JP2006-198380 filed Jul. 20, 2006, incorporated herein in their entirety.

TECHNICAL FIELD

The present invention relates to an analog-digital converter, an A/D conversion stage, a method of generating a digital signal corresponding to an analog signal, and a method of generating a signal indicating a conversion error in the A/D conversion stage.

BACKGROUND ART

Non-Patent Document 1 describes a pipelined analog-digital (A/D) converter. Non-Patent documents 2 to 5 and Patent Documents 1 to 4 describe cyclic analog-digital converters. A sample/hold (S/H) circuit is provided at the input of the cyclic analog-digital converter. The cyclic analog-digital converter includes two-stage circuit blocks connected in series. Non-Patent Document 6 describes background calibration. Furthermore, Patent Document 5 describes digital correction of capacity, and Patent Document 6 describes a pipelined A/D converter.

[Non-Patent Document 1] Yun Chin, "Inherently linear capacitor averaging techniques for pipelined A/D conversion," IEEE Trans. Circuits and Systems-IIm, vol. 47, no. 3, pp. 229-232, 2000.

[Non-Patent Document 2] P. Quinn, M. Pribytko, "Capacitor matching insensitive 12-bit 3.3 MS/s algorithmic ADC in 0.25 um CMOS, "Proc. 2003 Custom Integrated Circuits Conf., pp. 425-428, 2003.

[Non-Patent Document 3] B. Ginetti, P. G. Jespers, A. Vandemeulebroecke, "A CMOS 13-b cyclic RSD A/D converter", IEEE J. Solid-State Circuits vol. 27, no. 7, pp. 957-965, 1992.

[Non-Patent Document 4] K. Nagaraj, "Efficient circuit configuration for algorithmic analog to digital converters, "IEEE Trans. Circuits and Systems II, vol. 40, no. 12, pp. 777-785, 1993.

[Non-Patent Document 5] H. S. Lee, "A 12-b 600 ks/s digitally self-calibrated pipelined algorithmic ADC," IEEE J. Solid-State Circuits, vol. 29, No. 4, pp. 509-515, 1994.

[Patent Document 1] U.S. Pat. No. 5,027,116.

[Patent Document 2] U.S. Pat. No. 5,212,486.

[Non-Patent Document 6] J. Ming, S. H. Lewis, "An 8 b 80M Sample/s pipelined ADC with background calibration", IEEE Int. Solid-State Circuits Conf., pp. 42-43, 2000.

[Patent Document 3] U.S. Pat. No. 5,027,116.

[Patent Document 4] U.S. Pat. No. 5,212,486.

[Patent Document 5] U.S. Pat. No. 5,510,789.

[Patent Document 6] Japanese Patent Application Laid-open No. 2006-33304.

DISCLOSURE OF THE INVENTION

Problem to be Solved by the Invention

Each circuit block in the cyclic analog-digital converter includes an MDAC circuit and a sub A/D conversion circuit. The input of the circuit block of the first stage is connected to the output of the S/H circuit via a switch. The output of the circuit block of the second stage is connected to the input of the circuit block of the first stage via a switch. The sub A/D conversion circuit generates a (0, 1) two-value A/D conversion result of a (−1, 0, +1) 3-value A/D conversion result (digital value) with respect to this output. The MDAC circuit amplifies the input signal by a factor of two and performs "addition", "subtraction", or "no operation" of a reference voltage corresponding to the digital value. This operation is performed successively in each circuit block, and the output value from each circuit block passes through loop-like two-stage circuit blocks. The operation is controlled by a clock.

In such cyclic analog-digital converter, when a two-value A/D conversion is performed in each circuit block with respect to an analog signal received from the sample/hold (S/H) circuit, a 1-bit digital signal is obtained. Furthermore, when a three-value A/D conversion is performed in each circuit block, a 1.5-bit digital signal is obtained. Where the cyclic operation of N blocks is performed using two-stage circuit blocks, the 2N-bit (two-value A/D conversion) and 2N+1 bit (three-value A/D conversion) A/D conversion is performed. For example, where a 1-bit A/D conversion is performed per one stage, a 13-bit A/D conversion can be performed by 6.5-clock cyclic operation. Where a 1.5-bit A/D conversion per one stage is performed, a 14-bit A/D conversion can be performed by a 6.5-clock cyclic operation.

As far as known to the inventors, performing the A/D conversion of a predetermined bit number in parallel in the cyclic analog-digital converter would shorten the A/D conversion time per one sampling. Furthermore, such shortening of conversion time will make it possible not only to shorted the A/D conversion time per one sampling value, but also to increase the accuracy of A/D conversion in the cyclic analog-digital converter. However, in the cyclic A/D converters described in the aforementioned Patent Documents and Non-Patent Documents, no measures are taken against the offset voltage and fluctuations thereof and an even higher conversion accuracy is needed for applications where a very stable operation is required.

Therefore, what is needed is to shorten the A/D conversion time per one sampling value.

The present invention has been created in view with the above-described background and it is an object of the present invention to provide an analog-digital converter that can shorten the A/D conversion time per one sampling, and also to provide an A/D conversion stage for the analog-digital converter, and also to provide a method for generating a signal indicating a conversion error in the A/D conversion stage by using the analog-digital converter, and additionally to provide a method for generating a digital signal corresponding to an analog signal that can be used for shortening the A/D conversion time per one sampling.

Means for Solving the Problem

An analog-digital converter according to one aspect of the present invention comprises: (a) first to N-th A/D conversion stages connected in series, each of which has a stage input and a stage output; (b) an analog input for receiving an analog signal; (c) an input switch, connected between the analog input and the stage input of the first A/D conversion stage, for sampling first and second sample analog signals in first and second sampling periods, respectively; (d) a cyclic switch, connected between the stage input of the first A/D conversion stage and the stage output of the N-th A/D conversion stage, for providing a path from the N-th A/D conversion stage to the first A/D conversion stage in a cycle period, the cycle period being different from the first and second sampling periods; and (e) a digital operational circuit that receives the conversion result from each of the first to N-th A/D conversion stages and generates an A/D conversion digital code indicating a analog/digital conversion result. Each of the first to N-th A/D conversion stages includes a sub A/D conversion circuit, a control circuit, a D/A converter and a gain stage. The sub A/D conversion circuit generates a digital signal of a predetermined number of bits in response to a signal from the stage input. The digital signal indicates a conversion result. The control circuit generates a control signal from the digital signal. The D/A converter generates a predetermined voltage in accordance with the control signal. The gain stage has a first input that receives the signal from the stage input, a second input that receives one of the predetermined voltage and the signal from the stage input, and an output that is connected to the stage output. The number N of the first to N-th A/D conversion stages is 3 or 4.

According to the analog-digital converter, the first sample analog signal is sampled in the first sampling period and is provided to the first A/D conversion stage via the input switch, the second sample analog signal is sampled in the second sampling period and is provided to the first A/D conversion stage via the input switch, and each of the first to N-th A/D conversion stages generates an operational value associated with each of the first and second sample analog signals in the first and second sampling periods and in the cyclic period. The analog-digital converter, therefore, can shorten the A/D conversion time per one sampling.

In the analog-digital converter in accordance with the present invention, the number N of the first to N-th A/D conversion stages can be 4. The gain stage has first and second capacitors and an operational amplification circuit. The gain stage stores electric charges from the stage input in the first and second capacitor, rearranges the electric charges stored in the first and second capacitors in response to application of the predetermined voltage to one of the first and second capacitors to generate an operational value in an output of the operational amplification circuit.

According to this analog-digital converter, each of the four A/D conversion stages can perform an A/D conversion using the first and second capacitors and the operational amplification circuit.

In the analog-digital converter in accordance with the present invention, the gain stage has first and second capacitors and an operational amplification circuit. In the gain stage, electric charges from the stage input are stored in the first and second capacitors, an electric charge from the stage input is again stored in one of the first and second capacitors, the rearrangement of the electric charges is performed using the first and second capacitors and the operational amplification circuit in response to application of the predetermined voltage to one of the first and second capacitors, and the rearrangement of the rearranged electric charge is performed in the first and second capacitors in response to application of the predetermined voltage to the other one of the first and second capacitors, thereby generating the operational value in the output of the operational amplification circuit.

According to the analog-digital converter, each of the four A/D conversion stages not only performs the A/D conversion but also reduces the mismatch in capacitance between the first and second capacitors in the A/D conversion.

In the analog-digital converter in accordance with the present invention, in the gain stage in each of the A/D conversion stages, a mismatch value indicating a mismatch in capacitance between the first capacitor and the second capacitor is generated for the output of the operational amplification circuit, and each of the first to fourth A/D conversion stages generates an operational value for the mismatch value in the cyclic period.

According to the analog-digital converter, each A/D conversion stage generates the mismatch value, and this value is subjected to A/D conversion by using the first to fourth A/D conversion stages cyclically.

In the analog-digital conversion in accordance with the present invention, the gain stage has first and second mismatch correction operations. In the first mismatch correction operation, an input and the output of the operational amplification circuit and the second capacitor are connected to each other to equalize electric potentials of the operational amplification circuit and the second capacitor, an electric charge is stored in the first capacitor in response to application of a reference signal to the first capacitor, and the D/A converter provides the reference signal. In the second mismatch correction operation, the electric charge is rearranged in the first and second capacitors in response to application of the reference signal to the second capacitor to generate the mismatch value in the output of the operational amplification circuit.

According to the analog-digital converter, the mismatch value is generated by the first and second mismatch correction operation.

In the analog-digital converter in accordance with the present invention, the gain stage in the A/D conversion stage generates a finite gain error value, which indicates a finite gain of the operational amplification circuit, in the output of the operational amplification circuit. Each of the first to fourth A/D conversion stages generates an operational value for the finite gain error value in the cyclic period.

According to the analog-digital converter, each A/D conversion stage generates a finite gain error value and this value is subjected to A/D conversion by using the first to fourth A/D conversion stages cyclically.

In the analog-digital converter in accordance with the present invention, the gain stage has first and second finite gain correction operation. In the first finite gain correction operation, the input and the output of the operational amplification circuit are connected to each other to equalize an electric potential of the operational amplification circuit, and electric charges are stored in the first and second capacitors in response to application of a reference signal to the first and second capacitors, and the D/A converter provides the reference signal. In the second finite gain correction operation, the first capacitor is connected to the input and the output of the operational amplification circuit to rearrange the electric charges in the first and second capacitors in response to application of the reference signal to the second capacitor, and the gain error value is generated in the output of the operational amplification circuit.

According to the analog-digital converter, the first and second finite gain correction operations can provide the finite gain error value.

In the analog-digital converter in accordance with the present invention, in each of the first to fourth A/D conversion stages, the first and second capacitors are connected to the stage input in a first period for sampling the analog signal. The D/A converter provides the predetermined voltage to one terminal of the second capacitor in a second period for processing the analog signal, connects the one terminal of the second capacitor with a reference potential line in a third period for receiving a signal for compensating a capacitor mismatch, provides a reference voltage to the one terminal of the second capacitor in a fourth period for processing the signal for compensating a capacitor mismatch, a fifth period for receiving a signal for correcting a finite gain error, and a sixth period for processing the signal for compensating the finite gain error, and provides the reference voltage to one terminal of the first capacitor in the fifth period and the third period. The gain stage includes a feedback switch for connecting an inverting input to the output of the operational amplification circuit in the first, third and fifth periods, and a first switch for connecting the one terminal of the first capacitor to the output of the operational amplification circuit in the second, fourth and sixth periods.

In the analog-digital converter, the gain stage in each A/D conversion stage generates a mismatch value indicating a mismatch in capacitance between the first capacitor and the second capacitor in the output of the operational amplification circuit and also generates a finite gain error value due to a finite gain of the operational amplification circuit in the output of the operational amplification circuit. Each of the first to fourth A/D conversion stages generates an operational value for the mismatch value, and generates an operational value for the gain error value in the cyclic period. Accordingly, each of the first to fourth A/D conversion stages generates the finite gain error value and the mismatch value, and these values are individually subjected to A/D conversion by using the first to fourth A/D conversion stages cyclically.

In the analog-digital converter in accordance with the present invention, the number N of the N-th A/D conversion stage is 3. The gain stage has a first to third capacitors and an operational amplification circuit. The gain stage stores electric charges from the stage input in the first and second capacitors, the electric charges is rearranged in the first and second capacitors in response to application of the predetermined voltage to the first capacitor to generate an operational result in the output of the operational amplification circuit, the gain stage stores an electric charge associated with the operational result in the third capacitor, the electric charge and the rearranged electric charges are rearranged in the first to third capacitor in response to application of the predetermined voltage to the second capacitor to generate the operational value in the output of the operational amplification circuit.

According to the analog-digital converter, each of the three A/D conversion stages can perform A/D conversion using the first to three capacitors and the operational amplification circuit.

The analog-digital converter in accordance with the present invention comprises: (a) first to fourth A/D conversion stages connected in series, each stage having a stage input and a stage output; (b) an analog input that receives an analog signal; (c) an input switch that is connected between the stage input and the analog input of the first A/D conversion stage and serves for sampling first and second sample analog signals in first and second sampling periods, respectively; (d) a cyclic switch that is connected between the stage input of the first A/D conversion stage and the stage output of the fourth A/D conversion stage and serves to provide a path from the fourth A/D conversion stage to the first A/D conversion stage in a cyclic period different from the first and second sampling periods; and (e) a digital operational circuit that receives a conversion result from each of the first to fourth A/D conversion stages and generates an A/D conversion digital code indicating the analog/digital conversion result. Each of the first to fourth A/D conversion stages includes: (a1) a sub A/D conversion circuit that generates a digital signal indicating the conversion result of a predetermined number of bits in response to a signal from the stage input; (a2) a control circuit that generates a control signal corresponding to the digital signal; and (a3) a gain stage having a first input that receives a signal from the stage input, a second input that receives the control signal, and an output that is connected to the stage output. The gain stage comprises: a first capacitor having one terminal and another terminal; a second capacitor having one terminal and another terminal; a first switch for connecting the one terminal of the first capacitor to the stage input in a first period; a second switch for connecting the one terminal of the second capacitor to the stage input in the first period; an operational amplification circuit having, in a second period which differs from the first period, an inverting input connected to the other terminal of the first capacitor and to the other terminal of the second capacitor and an output connected to the stage output; a third switch for connecting the one terminal of the first capacitor to the output of the operational amplification circuit in the second period; and a D/A converter that provides a predetermined voltage corresponding to the control signal to the one terminal of the second capacitor in the second period.

According to the analog-digital converter, the first to fourth A/D conversion stages are connected in series to form a loop via the cyclic switch. Therefore, the A/D conversions of two sampling values can be performed in parallel.

The analog-digital converter according to one aspect of the present invention can have the below-described configuration. The gain stage comprises a fourth switch that is connected between the other terminal of the first capacitor and the inverting input of the operational amplification circuit and serves for disconnecting the other terminal of the first capacitor from the inverting input in a third period that is between the first period and the second period; and a fifth switch that is connected between the one terminal of the second capacitor and the output of the operational amplification circuit and serves for connecting the one terminal of the second capacitor to the output of the operational amplification circuit in a fourth period that is different from the first to third periods. The D/A converter supplies a predetermined voltage corresponding to the control signal to the one terminal of the first capacitor in the fourth period.

The analog-digital converter according to the present invention can provide a digital value enabling the correction of an error of the A/D conversion value due to variations in capacitance of the two capacitors in the gain stage.

The analog-digital converter according to one aspect of the present invention can have the below-described configuration. The digital operational circuit comprises: first to fourth storage circuits for storing digital signals, which is divided into first and second data groups associated with the first and second sample analog signals, from the first to fourth A/D conversion stages, respectively; a first circuit that is connected to the first to fourth storage circuits, and serves for generating a first digital code, associated with the first sample analog signal, by using the digital signals of the first data group; a second circuit that is connected to the first to fourth storage circuits, and serves for generating a second digital code, associated with the second sample analog signal, by using the digital signals of the second data group; and a correction circuit for correcting one of the first and second digital codes using another of the first and second digital codes to generate the A/D conversion digital code.

The analog-digital converter according to the present invention can correct an error of A/D conversion due to the analog-digital converter by use of the digital signals from the first to fourth A/D conversion stages.

The analog-digital converter according to another aspect of the present invention comprises: (a) first to third A/D conversion stages connected in series, each stage having a stage input and a stage output; (b) an analog input that receives an analog signal; (c) an input switch that is connected between the stage input and the analog input of the first A/D conversion stage and serves for sampling first and second sample analog signals in first and second sampling periods, respectively; (d) a cyclic switch that is connected between the stage input of the first A/D conversion stage and the stage output of the third A/D conversion stage and serves to provide a path from the third A/D conversion stage to the first A/D conversion stage in a cyclic period different from the first and second sampling periods; and (e) a digital operational circuit that generates an A/D conversion digital code indicating an analog/digital conversion result from each of the first to third A/D conversion stages. Each of the first to third A/D conversion stages includes: a sub A/D conversion circuit that generates a digital signal of a predetermined number of bits indicating the conversion result in response to a signal from the stage input; a control circuit that generates a control signal corresponding to the digital signal; and a gain stage having a first input that receives a signal from the stage input, a second input that receives the control signal, and an output that is connected to the stage output. The gain stage comprises: a first capacitor having one terminal and another terminal; a second capacitor having one terminal and another terminal; a third capacitor having one terminal and another terminal; a first switch for connecting the one terminal of the first capacitor to the stage input in a first period; a second switch for connecting the one terminal of the second capacitor to the stage input in the first period; an operational amplification circuit having an inverting input connected to the other terminal of the first capacitor and to the other terminal of the second capacitor and an output connected to the other terminal of the third capacitor and the stage output; a third switch that is connected between the one terminal of the second capacitor and the output of the operational amplification circuit and serves for connecting the one terminal of the second capacitor to the output of the operational amplification circuit in the second period that is different from the first period; a fourth switch that is connected between the one terminal of the first capacitor and the output of the operational amplification circuit and serves for connecting the one terminal of the first capacitor to the output in a third period that different from the first period and the second period; a D/A converter that provides a predetermined voltage corresponding to the control signal to the one terminal of the first capacitor in the second period and provides a predetermined voltage corresponding to the control signal to the one terminal of the second capacitor in the third period; a fifth switch that is connected between the one terminal of the third capacitor and the inverting input of the operational amplification circuit and serves for connecting the one terminal of the third capacitor to the inverting input of the operational amplification circuit in the third period; and a sixth switch that is connected between the one terminal of the third capacitor and a reference potential line and serves for providing the reference potential to the one terminal of the third capacitor in the first and second periods.

According to the analog-digital converter, the first to third A/D conversion stages are connected in series to form a loop via a cyclic switch. Therefore, the A/D conversion can be performed, while generating a compensating value for a mismatch in capacitance between the three capacitors of the first to third A/D) conversion stages.

The analog-digital converter according to the other aspect of the present invention can have the below-described configuration. The digital operational circuit includes: first to third storage circuits for storing digital signals, which is divided into first and second data groups associated with the first and second sample analog signals, from the first to third A/D conversion stages, respectively; a first circuit that is connected to the first to third storage circuits and serves for generating a first digital code, associated with the first sample analog signal, by using the digital signals of the first data group; a second circuit that is connected to the first to third storage circuits and serves for generating a second digital code, associated with the second sample analog signal, by using the digital signals of the second data group; and a correction circuit for correcting one of the first and second digital codes using another of the first and second digital codes to generate the A/D conversion digital code.

According to the analog-digital converter, an error of A/D conversion due to the analog-digital converter can be corrected from the digital signals from the first to third A/D conversion stages.

The analog-digital converter according to the one aspect and the other aspect of the present invention can have the below-described configuration. The sub A/D conversion circuit comprises a comparator that compares a signal from the stage input with a predetermined reference signal and provides a comparison result signal.

According to the analog-digital converter, a one-bit digital value is obtained. Where the number of comparators is increased, a digital signal with more than one bit can be obtained.

The analog-digital converter according to the one aspect and the other aspect of the present invention can have the below-described configuration. The sub A/D conversion circuit generates a three-value redundancy digital signal by comparing a signal from the stage input with two predetermined reference signals.

According to the analog-digital converter, a three-value digital signal is obtained because the input analog signal is compared with two predetermined reference signals.

The analog-digital converter according to the one aspect and the other aspect of the present invention can have the below-described configuration. The analog-digital converter further comprises a sample/hold circuit having an input that receives an input analog signal and an output that provides the analog signal to the analog input. The sample/hold circuit comprises an operational amplification circuit having an inverting input and a non-inverting output, and a feedback switch connected between the inverting input and the non-inverting output.

According to the analog-digital converter, a signal corresponding to an offset of the operational amplification circuit can be generated using the feedback switch of the sample/hold circuit.

The analog-digital converter according to the one aspect and the other aspect of the present invention can have the below-described configuration. Either of the first and second sample analog signals corresponds to the input analog signal, and the feedback switch of the sample/hold circuit is open in the entire period of one of the first and second sampling periods.

According to the analog-digital converter, the sample/hold circuit can provide an input analog signal that is the object of A/D conversion to the A/D conversion stage.

The analog-digital converter according to the one aspect and the other aspect of the present invention can have the below-described configuration. The feedback switch of the sample/hold circuit is closed in the other of the first and second sampling periods; and the other of the first and second sample analog signals is provided by opening the feedback switch of the sample/hold circuit.

According to the analog-digital converter, the sample/hold circuit can provide a compensation signal to the A/D conversion stage, and the compensation signal corresponds to the amount of offset in the operational amplification circuit. Where the first and second sample analog signals provided by the sample/hold circuit are subjected to A/D conversion, errors in the A/D conversion stage can be corrected by using these A/D conversion values (digital values).

The analog-digital converter according to the one aspect and the other aspect of the present invention can have the below-described configuration. The operational amplification circuit of the sample/hold circuit further comprises a non-inverting input and an inverting output, and the sample/hold circuit comprises another feedback switch connected between the non-inverting input of the operational amplification circuit and the inverting output of the operational amplification circuit.

According to the analog-digital converter, a sample/hold circuit of an entirely differential configuration can be provided.

A further aspect of the present invention resides in a method for generating a digital signal corresponding to an analog signal by using a gain stage. The gain stage comprises first and second capacitors and an operational amplification circuit. The method comprises the steps of: (a) generating a digital signal having a digital value of a predetermined number of bits, the digital signal being associated with one of first and second input analog signals; (b) storing an electric charge in the first capacitor and an electric charge in the second capacitor, the electric charges being associated with the first input analog signal; (c) after the electric charge has been stored in the first and second capacitors, holding the electric charge in one of the first capacitor and the second capacitor, and sampling the second input analog signal to store an electric charge in another of the first capacitor and the second capacitor, and the electric charge being associated with the second input analog signal; (d) after the sampling has been performed for the first and second capacitors, connecting the first capacitor between an output of the operational amplification circuit and an inverting input of the operational amplification circuit, and supplying a conversion analog signal to one terminal of the second capacitor to generate a first conversion value for the output of the operational amplification circuit and to rearrange the electric charges stored in the first and second capacitors, the conversion analog signal being associated with the digital signal; and (e) after the sampling has been performed in the first and second capacitors, connecting the second capacitor between the output and the inverting input of the operational amplification circuit, and supplying the conversion analog signal to one terminal of the first capacitor to generate a second conversion value for the output of the operational amplification circuit and to rearrange the electric charges stored in the first and second capacitors.

According to the method, when the first and second input analog signals are two signals from the gain stage of the previous stage, two conversion values are generated in the subsequent step (d) and step (e) in which the two signals from the gain stage of the previous stage are averaged and a mismatch between the first capacitor and second capacitor is averaged.

Further, where an electric charge corresponding to the second input analog signal is stored in the first and second capacitors and then an electric charge corresponding to the second input analog signal is sampled to the other one of the first capacitor and the second capacitor, when the second input analog signal is substantially identical to the first input analog signal, two conversion values corresponding to the mismatch in capacitance between first capacitor and the second capacitor are generated in the subsequent step (d) and step (e).

Yet another aspect of the present invention resides in a method of generating a digital signal corresponding to an analog signal by using first to fourth A/D conversion stages. Each of the first to fourth A/D conversion stages comprises first and second capacitors and an operational amplification circuit. The method comprises the steps of: (a) performing a predetermined conversion operation of an analog signal sampled in the first A/D conversion stage to generate a first conversion result in the first A/D conversion stage, performing a predetermined sampling operation of an first analog signal in the second A/D conversion stage, performing the predetermined conversion operation of an analog signal sampled in the third A/D conversion stage to generate a second conversion result in the third A/D conversion stage, and performing the predetermined sampling operation of an second analog signal in the fourth A/D conversion stage, the first analog signal being associated with the first conversion result, and the second analog signal being associated with the second conversion result; (b) performing the predetermined conversion operation of an analog signal sampled in the fourth A/D conversion stage to generate a third conversion result in the fourth A/D conversion stage, performing the predetermined sampling operation of an third analog signal in the first A/D conversion stage, performing the predetermined conversion operation of an analog signal sampled in the second A/D conversion stage to generate a fourth conversion result in the second A/D conversion stage, and performing the predetermined sampling operation of an fourth analog signal in the third A/D conversion stage, the third analog signal being associated with the third conversion result, and the fourth analog signal being associated with the fourth conversion result; and (c) repeating the step (a) and the step (b). The predetermined sampling operation comprises the step of storing electric charges in the first capacitor and the second capacitor, the electric charges are associated with an input analog signal supplied to the relevant A/D conversion stage. The predetermined conversion operation comprises the step of connecting the first capacitor between an output of the operational amplification circuit and an inverting input of the operational amplification circuit, and supplying a conversion analog signal to one terminal of the second capacitor to generate a conversion value in the output of the operational amplification circuit and rearrange the electric charges stored in the first and second capacitors. The conversion analog signal is associated with a digital signal, and the digital signal indicates an A/D conversion result in the relevant A/D conversion stage.

According to this method, one of the sampling operation and conversion operation is performed in any of the first to fourth A/D conversion stages. Therefore, no useless operation is performed in the first to fourth A/D conversion stage, and two signals are A/D converted in parallel.

A method according to yet another aspect of the present invention can have the following configuration. The method comprises the step of: prior to the steps (a) and (b), receiving a first sample analog signal in the first A/D conversion stage, and performing the predetermined sampling operation of the first sample analog signal; performing the predetermined conversion operation of an analog signal sampled in the first A/D conversion stage to generate a fifth conversion result in the first A/D conversion stage, and performing the predetermined sampling operation of an fifth analog signal in the second A/D conversion stage, the fifth analog signal being associated with the fifth conversion result; receiving a second sample analog signal in the first A/D conversion stage, performing the predetermined sampling operation of the second sample analog signal, performing the predetermined conversion operation of an analog signal sampled in the second A/D conversion stage to generate a sixth conversion result in the second A/D conversion stage, and performing the predetermined sampling operation of a six analog signal in the third A/D conversion stage, the six analog signal being associated with the sixth conversion result.

According to the method, by providing the first sample analog signal and second sample analog signal successively to the first A/D conversion stage, this makes it possible to establish a link to a procedure of performing one of the sampling operation and conversion operation in any of the first to fourth A/D conversion stages.

A method according to yet another aspect of the present invention can have the following configuration. The method comprises the steps of: sampling a signal to a sample/hold circuit, bringing the sample/hold circuit to a holding operation state to hold the sampled signal, and providing the held signal as one of the first and second sample analog signals, the sample/hold circuit having an operational amplification circuit; and closing a switch connected between an input of the operational amplification circuit of the sample/hold circuit and an output of the operational amplification circuit of the sample/hold circuit, opening the closed switch to bring the sample/hold circuit to a holding operation state, and preparing the held signal as another one of the first and second sample analog signals.

According to the method, the offset of the operational amplification circuit of the sample/hold circuit can be generated.

Still another aspect of the present invention resides in a method of generating a digital signal corresponding to an analog signal by using first to fourth A/D conversion stages. Each of the first to fourth A/D conversion stages comprises first and second capacitors and an operational amplification circuit. The method comprises the steps of: (a) performing a first conversion operation of an analog signal sampled in the first A/D conversion stage to generate a first conversion result in the first A/D conversion stage, performing a first sampling operation of a first analog signal in the second A/D conversion stage, performing the first conversion operation of an analog signal sampled in the third A/D conversion stage to generate a second conversion result in the third A/D conversion stage, and performing the first sampling operation of a second analog signal in the fourth A/D conversion stage, the first analog signal being associated with the first conversion result, and the second analog signal being associated with the second conversion result;

(b) performing a second conversion operation in the first A/D conversion stage to generate a third conversion result in the first A/D conversion stage after the first conversion operation in the first A/D conversion stage, performing a second sampling operation of a third analog signal in the second A/D conversion stage, performing the second conversion operation in the third A/D conversion stage to generate a fourth conversion result in the third A/D conversion stage after the first conversion operation in the third A/D conversion stage, and performing the second sampling operation of a fourth analog signal in the fourth A/D conversion stage, the third analog signal being associated with the third conversion result, and the fourth analog signal being associated with the fourth conversion result; (c) performing the first conversion operation of an analog signal sampled in the second A/D conversion stage to generate a fifth conversion result, performing the first sampling operation of an fifth analog signal in the third A/D conversion stage, performing the first conversion operation in the fourth A/D conversion stage to generate a sixth conversion result in the fourth A/D conversion stage, and performing the first sampling operation of a sixth analog signal in the first A/D conversion stage, the fifth analog signal being associated with the fifth conversion result, and the sixth analog signal being associated with the sixth conversion result; (d) performing the second conversion operation to generate a seventh conversion result after the first conversion operation in the second A/D conversion stage, performing the second sampling operation of a seventh analog signal in the third A/D conversion stage, performing the second conversion operation in the fourth A/D conversion stage to generate an eighth conversion result in the fourth A/D conversion stage after the first conversion operation in the fourth A/D conversion stage, and performing the second sampling operation in the first A/D conversion stage of a eighth analog signal, the seventh analog signal being associated with the seventh conversion result, and the eighth analog signal being associated with the eighth conversion result. The first sampling operation comprise the step of storing an electric charge in the first capacitor and storing an electric charge in the second capacitor, and the electric charge corresponds to a first input analog signal. The second sampling operation comprising the step of, prior to rearranging the electric charges of the first and second capacitors, holding an electric charge of one of the first capacitor and the second capacitor, and sampling an electric charge in another of the first capacitor and the second capacitor. This electric charge corresponds to a second analog signal. The first conversion operation comprises the step of connecting the first capacitor between the output of the operational amplification circuit and an inverting input of the operational amplification circuit, and supplying a conversion analog signal to another terminal of the second capacitor to generate a first conversion value for a subsequent A/D conversion stage in the output of the operational amplification circuit and rearrange the electric charges of the first and second capacitors. The first conversion value is associated with a first input analog signal, the conversion analog signal is associated with a digital signal, and the digital signal indicates an A/D conversion result in the relevant A/D conversion stage. The second conversion operation comprises the step of connecting the second capacitor between the output of the operational amplification circuit and the inverting input of the operational amplification circuit, and supplying a conversion analog signal to the other terminal of the first capacitor to generate a second conversion value for a subsequent A/D conversion stage in the output of the operational amplification circuit and rearrange the electric charges of the first and second capacitors. The second conversion value is associated with a second input analog signal, the conversion analog signal is associated with a digital signal, and the digital signal indicates an A/D conversion result in the relevant A/D conversion stage.

According to this method, one of the first and second conversion operations is performed together with the first and second sampling operation in the first to fourth A/D conversion stages. Therefore, the operation of the first to fourth A/D conversion stages can be performed effectively. Moreover, two signals are subjected to A/D conversion in parallel. In addition, the A/D conversion can be performed together with compensating the mismatch between capacitors of each A/D conversion stage.

According to still another aspect of the present invention, the following configuration can be provided. The above-described method further comprises a step of successively repeating the step (a) to the step (d).

According to this method, the A/D conversion of a desired number of bits can be performed together with compensating the mismatch between capacitors of each A/D conversion stage.

According to still another aspect of the present invention, the following configuration can be provided. The method comprising the steps of: prior to the steps (a) to (d), receiving a first sample analog signal in the first A/D conversion stage and successively performing the first and second sampling operations of the first sample analog signal; performing a first conversion operation of an analog signal sampled in the first A/D conversion stage to generate a ninth conversion result in the first A/D conversion stage, and performing a first sampling operation of a ninth analog signal in the second A/D conversion stage, the ninth analog signal corresponding to the ninth conversion result; after the first conversion operation in the first A/D conversion stage, performing a second conversion operation in the first A/D conversion stage to generate a tenth conversion result in the first A/D conversion stage, and performing a second sampling operation in the second A/D conversion stage of a tenth analog signal, the tenth analog signal being associated with the tenth conversion result; receiving a second sample analog signal in the first A/D conversion stage, performing the first sampling operation of the second sample analog signal, performing the first conversion operation of an analog signal sampled in the second A/D conversion stage to generate an eleventh conversion result in the second A/D conversion stage, and performing the first sampling operation of an eleventh analog signal in the third A/D conversion stage, the eleventh analog signal being associated with the eleventh conversion result; and performing the second sampling operation of the second sample analog signal in the first A/D conversion stage, and after the first conversion operation in the second A/D conversion stage, performing the second conversion operation in the second A/D conversion stage to generate a twelfth conversion result in the second A/D conversion stage, and performing a second sampling operation of a twelfth analog signal in the third A/D conversion stage, the twelfth analog signal being associated with the twelfth conversion result.

According to this method, by successively providing the first sample analog signal and second sample analog signal to the first A/D conversion stage, this makes it possible to establish a link to a procedure of performing one of the sampling operation and conversion operation in any of the first to fourth A/D conversion stages.

According to still another aspect of the present invention, the following configuration can be provided. The above-described method comprising the steps of: sampling a signal to a sample/hold circuit, then holding the sampled signal in the sample/hold circuit, and generating one of the first and second sample analog signals in the sample/hold circuit, the sample/hold circuit having an operational amplification circuit; and closing a switch connected between an input and an output of the operational amplification circuit, opening the closed switch to bring the sample/hold circuit to a holding operation stage to hold a signal, and preparing the held signal as another one of the first and second sample analog signals.

According to this method, the offset of the operational amplification circuit of the sample/hold circuit can be generated.

Yet another aspect of the present invention resides in a method of generating a digital signal corresponding to an analog signal by using first to third A/D conversion stages, wherein each of the first to third A/D conversion stages comprises an operational amplification circuit, first and second capacitors each having one terminal connected to an inverting input of the operational amplification circuit, and a third capacitor having one terminal connected to an output of the operational amplification circuit. This method comprises the steps of: (a) performing a first conversion operation of an analog signal sampled in the first A/D conversion stage to generate a first conversion value for the first A/D conversion stage, and after the first conversion operation in the second A/D conversion stage, performing a second conversion operation in the second A/D conversion stage to generate a second conversion value for the second A/D conversion stage in the second A/D conversion stage, and in the third A/D conversion stage, performing a sampling operation of an analog signal associated with the second conversion value; (b) after the first conversion operation in the first A/D conversion stage, performing a second conversion operation in the first A/D conversion stage to generate a second conversion value for the first A/D conversion stage, performing the sampling operation of an analog signal associated with the second conversion value in the second A/D conversion stage, performing the first conversion operation of an analog signal sampled in the third A/D conversion stage to generate a first conversion value for the third A/D conversion stage; (c) performing the first conversion operation of an analog signal sampled in the second A/D conversion stage to generate a first conversion value for the second A/D conversion stage, performing the second conversion operation in the third A/D conversion stage to generate a second conversion value in the third A/D conversion stage, and in the first A/D conversion stage, performing the sampling operation of an analog signal associated with the second conversion value. The sampling operation comprises a step of storing electric charges in the first capacitor and the second capacitor, the electric charges being associated with an analog signal inputted to the relevant A/D conversion stage. The first conversion operation comprises the steps of connecting the second capacitor between the output and the inverting input of the operational amplification circuit, and supplying a conversion analog signal to the other terminal of the first capacitor to generate the first conversion value in the output of the operational amplification circuit and rearrange the electric charges in the first and second capacitors and to store an electric charge in the third capacitor, the electric charge being associated with the first conversion value, the conversion analog signal being associated with a digital signal, and the digital signal indicating an A/D conversion result in the relevant A/D conversion stage. The second conversion operation comprises the step of connecting the first and third capacitors between the output of the operational amplification circuit and the inverting input of the operational amplification circuit, and supplying a conversion analog signal to another terminal of the second capacitor to generate the second conversion value for the output of the operational amplification circuit and rearrange the electric charges of the first, second and third capacitors. The conversion analog signal is associated with a digital signal, and the digital signal indicates an A/D conversion result in the relevant A/D conversion stage.

According to this method, one of the first and second conversion operations is performed together with the sampling operation in any of the first to third A/D conversion stages. Therefore, the operation of the first to third A/D conversion stages can be performed effectively. Moreover, two signals are subjected to A/D conversion in parallel. In addition, the A/D conversion can be performed together with compensating the mismatch between capacitors of each A/D conversion stage.

According to still another aspect of the present invention, the following configuration can be provided. The above-described method further comprises a step of successively repeating the step (a) to the step (c).

According to this method the A/D conversion of a desired number of bits can be performed together with generating a compensating value for the mismatch in capacitance between capacitors of each A/D conversion stage.

According to still another aspect of the present invention, the following configuration can be provided. The above-described method comprises the steps of: prior to the steps (a) to (c), receiving a first sample analog signal in the first A/D conversion stage and performing the sampling operation with respect to the first sample analog signal; prior to the steps (a) to (c), performing the first and second conversion operations of an analog signal sampled in the first A/D conversion stage, and, in the relevant second A/D conversion stage, performing a sampling operation of an analog signal associated with a conversion value obtained in the second conversion operation; and prior to the steps (a) to (c), receiving a second sample analog signal in the first A/D conversion stage, performing the sampling operation of the second sample analog signal, and performing the first conversion operation of an analog signal sampled in the second A/D conversion stage.

According to this method, by successively providing the first sample analog signal and second sample analog signal to the first A/D conversion stage, this makes it possible to establish a link to a procedure of performing one of the sampling operation and conversion operation in any of the first to fourth A/D conversion stages.

According to still another aspect of the present invention, the following configuration can be provided. The above-described method comprises the steps of: sampling a signal to a sample/hold circuit, then holding the sampled signal in the sample/hold circuit, and generating one of the first and second sample analog signals in the sample/hold circuit, the sample/hold circuit having an operational amplification circuit; and closing a switch connected between an input and an output of the operational amplification circuit of the sample/hold circuit, opening the closed switch to bring the sample/hold circuit to a holding operation stage to hold a signal, and preparing the held signal as another one of the first and second sample analog signals.

According to this method, the offset of the operational amplification circuit of the sample/hold circuit can be generated.

An A/D conversion stage in accordance with the present invention comprises: (a) a stage input; (b) a stage output; (c) a sub A/D conversion circuit that generates a digital signal in response to an analog signal from the stage input, the digital signal indicating a conversion result of a predetermined number of bits; (d) a control circuit that generates a control signal, the control signal being associated with the digital signal; and (e) a gain stage having a first input, a second input and an output, the first input receiving an analog signal from the stage input, the second input receiving the control signal, and an output being connected to the stage output. The gain stage includes (e1) a first capacitor having one terminal and another terminal; (e2) a second capacitor having one terminal and another terminal; (e3) a first sampling switch for connecting the one terminal of the first capacitor to the stage input in a first period for sampling the analog signal; (e4) a second sampling switch for connecting the one terminal of the second capacitor to the stage input in the first period; (e5) an operational amplification circuit having an inverting input and an output, the inverting input being connected to the other terminal of the first capacitor and to the other terminal of the second capacitor, and the output being connected to the stage output; (e6) a D/A converter having first and second outputs, the first and second outputs being connected to the one terminal of the first capacitor and the one terminal of the second capacitor, respectively, the D/A converter providing a predetermined voltage to the one terminal of the second capacitor in a second period for processing the analog signal, the predetermined voltage being associated with the control signal, the D/A converter providing the one terminal of the second capacitor with a reference potential in a third period for receiving a signal for compensating mismatch in capacitance, the D/A converter providing a reference voltage to the one terminal of the second capacitor in a fourth period for processing the signal for compensating the mismatch in capacitance, a fifth period for receiving a signal for correcting a finite gain, and a sixth period for processing the signal for correcting a finite gain, and the D/A converter providing the reference voltage to the one terminal of the first capacitor in the fifth period and the third period; (e7) a feedback switch for connecting the inverting input to the output of the operational amplification circuit in the first, third, and fifth periods; and (e8) a first switch for connecting the one terminal of the first capacitor to the output of the operational amplification circuit in the second, fourth, and sixth periods.

According to this A/D conversion stage, a digital value in the A/D conversion stage can be generated by the sub A/D conversion circuit, and the operation of the A/D conversion stage can be performed using the first and second period. A signal indicating the difference originating from the mismatch in capacitance between the two capacitors of the A/D conversion stage can be generated using the third and fourth periods. A signal indicating the difference originating from the finite gain of the operational amplification circuit of the A/D conversion stage can be generated using the fifth and sixth periods.

The A/D conversion stage in accordance with the present invention comprises: (a) a stage input; (b) a stage output; (c) a sub A/D conversion circuit that generates a digital signal in response to application of an analog signal from the stage input, the digital signal indicating a conversion result of a predetermined number of bits; (d) a control circuit that generates a control signal, the control signal being associated with the digital signal; and (e) a gain stage having a first input, a second input and an output, the first input receiving an analog signal from the stage input, the second input receiving the control signal, and the output being connected to the stage output. The gain stage includes: (e1) a first capacitor having one terminal and another terminal; (e2) a second capacitor having one terminal and another terminal; (e3) a first sampling switch for connecting the one terminal of the first capacitor to the stage input in a first period for sampling the analog signal; (e4) a second sampling switch for connecting the one terminal of the second capacitor to the stage input in the first period; (e5) an operational amplification circuit having an inverting input and an output, the inverting input being connected to the other terminal of the first capacitor and to the other terminal of the second capacitor, and the output being connected to the stage output; (e6) a D/A converter has first and second outputs, the first and second outputs being connected to the one terminal of the first capacitor and the one terminal of the second capacitor, respectively, the D/A converter providing a predetermined voltage to the one terminal of the second capacitor in a second period for processing the analog signal, the predetermined voltage being associated with the control signal, the D/A converter providing the one terminal of the second capacitor with a reference potential in a third period for receiving a signal for compensating mismatch in capacitance, the D/A converter providing a reference voltage to the one terminal of the first capacitor in the third period, and the D/A converter providing the reference voltage to the one terminal of the second capacitor in a fourth period for processing the signal for compensating the mismatch in capacitance; (e7) a feedback switch for connecting the inverting input to the output of the operational amplification circuit in the first and third periods; and (e8) a first switch for connecting the one terminal of the first capacitor to the output of the operational amplification circuit in the second and fourth periods.

According to this A/D conversion stage, a digital value in the A/D conversion stage can be generated by the sub A/D conversion circuit, and the operation of the A/D conversion stage can be performed using the first and second period. A signal indicating the difference originating from the mismatch in capacitance between capacitors of the A/D conversion stage can be generated using the third and fourth periods.

The A/D conversion stage in accordance with the present invention comprises: (a) a stage input; (b) a stage output; (c) a sub A/D conversion circuit that generates a digital signal in response to a signal from the stage input, the digital signal indicating a conversion result of a predetermined number of bits; (d) a control circuit that generates a control signal, the control signal being associated with the digital signal; and (e) a gain stage having a first input, a second input, and an output, the first input receiving an analog signal from the stage input, the second input receiving the control signal, and the output being connected to the stage output. The gain stage includes (e1) a first capacitor having one terminal and another terminal; (e2) a second capacitor having one terminal and another terminal; (e3) a first sampling switch for connecting the one terminal of the first capacitor to the stage input in a first period for sampling the analog signal; (e4) a second sampling switch for connecting the one terminal of the second capacitor to the stage input in the first period; (e5) an operational amplification circuit having an inverting input and an output, the inverting input being connected to the other terminal of the first capacitor and to the other terminal of the second capacitor, and the output being connected to the stage output; (e6) a D/A converter having first and second outputs, the first and second outputs being connected to the one terminal of the first capacitor and the one terminal of the second capacitor, respectively, the D/A converter providing a predetermined voltage to the one terminal of the second capacitor in a second period for processing the analog signal, the predetermined voltage being associated with the control signal, the D/A converter providing a reference signal to the one terminal of the second capacitor in a third period for receiving a signal for compensating a finite gain error and a fourth period for processing the signal for compensating the finite gain error, and the D/A converter providing the reference signal to the one terminal of the first capacitor in the third period; (e7) a feedback switch for connecting the inverting input to the output of the operational amplification circuit in the first and third periods; and (e8) a first switch for connecting the one terminal of the first capacitor to the output of the operational amplification circuit in the second and fourth periods.

According to this A/D conversion stage, a digital value in the A/D conversion stage can be generated by the sub A/D conversion circuit, and the operation of the A/D conversion stage can be performed using the first and second period. A signal indicating the error due to the finite gain of the operational amplification circuit can be generated using the third and fourth periods.

The analog-digital converter according to another aspect of the present invention comprises: (a) first to fourth A/D conversion stages connected in series, each stage having a stage input and a stage output; (b) an analog input that receives an analog signal; (c) an input switch that is connected between the stage input and the analog input of the first A/D conversion stage and serves for sampling first and second sample analog signals in first and second sampling periods, respectively; (d) a cyclic switch that is connected between the stage input of the first A/D conversion stage and the stage output of the fourth A/D conversion stage and serves to provide a path from the fourth A/D conversion stage to the first A/D conversion stage in a cyclic period different from the first and second sampling periods; and (e) a digital error correction circuit that generates an A/D conversion digital code indicating an analog/digital conversion result corresponding to a conversion result from each of the first to fourth A/D conversion stages. Each of the first to fourth A/D conversion stages can be the A/D conversion stage described in any one of the above.

According to the analog-digital converter, two analog signals can be subjected to A/D conversion in parallel. When the above-described A/D conversion stage is used, a signal indicating an error originating from the mismatch in capacitance between the two capacitors of the A/D conversion stage is generated and the A/D conversion of this signal can be performed in parallel with the A/D conversion of one analog signal. When the above-described A/D conversion stage is used, a signal indicating an error originating from the finite gain of the operational amplification circuit of the A/D conversion stage is generated and the A/D conversion of this signal can be performed in parallel with the A/D conversion of one analog signal.

The analog-digital converter in accordance with the present invention further comprises an S/H circuit having an input that receives an input analog signal and an output that provides the analog signal to the analog input. The sample/hold circuit comprises an operational amplification circuit having an inverting input and a non-inverting output and a feedback switch connected between the inverting input and the non-inverting output.

According to the analog-digital converter, a signal relating to the offset of the operational amplification circuit of the sample/hold (S/H) circuit can be generated using the feedback switch.

In the analog-digital converter in accordance with the present invention, one of the first and second sample analog signals corresponds to the input analog signal; and the feedback switch of the S/H circuit is open in the entire period of one of the first and second sampling periods.

According to the analog-digital converter, the S/H circuit provides an input analog signal that is the object of A/D conversion to the A/D conversion stage.

The analog-digital converter in accordance with the present invention can have the following configuration. The feedback switch of the S/H circuit is closed in part of the other one of the first and second sampling periods; and the other one of the first and second sample analog signals is provided after the feedback switch of the S/H circuit is opened. According to the analog-digital converter, the S/H circuit can provide a compensation signal corresponding to the amount of offset of the operational amplification circuit to the A/D conversion stage.

The analog-digital converter in accordance with the present invention can have the following configuration. The digital error correction circuit generates a correction digital code representing an error caused by at least one from among an offset of the S/H circuit, a noise caused by the feedback switching of the S/H circuit, a capacitor mismatch in the first to fourth A/D conversion stages, and a finite gain of the gain stage in the first to fourth A/D conversion stages, and corrects a digital code generated from a digital signal from the first to fourth A/D conversion stages and corresponding to the analog signal by using the correction digital code.

According to the analog-digital converter, a digital signal indicating an error of A/D conversion originating in the A/D conversion stage and S/H circuit can be generated and the A/D conversion value can be compensated using this digital value.

The analog-digital converter in accordance with the present invention can have the following configuration. The sub A/D conversion circuit comprises a comparator that compares a signal from the stage input with a predetermined reference signal and provides a comparison result signal.

According to the analog-digital converter, a one-bit digital value can be obtained. Furthermore, if the number of comparators is increased, a digital signal of a number of bits that is more than one can be obtained.

The analog-digital converter in accordance with the present invention can have the following configuration. The sub A/D conversion circuit generates a three-value redundancy digital signal by comparing a signal from the stage input with two predetermined reference signals.

According to the analog-digital converter, because the input analog signal is compared with two predetermined reference signals, a three-value digital signal can be obtained.

A further aspect of the present invention resides in a method for generating a signal indicating a conversion error of an A/D conversion stage for generating a digital signal corresponding to an analog signal. The A/D conversion stage comprises first and second capacitors and an operational amplification circuit having an inverting input connected to one terminal of the first and second capacitors, and the conversion error includes an error relating to a mismatch between the first and second capacitors. The method comprises the steps of: (a) connecting an output of the operational amplification circuit and the inverting input of the operational amplification circuit and connecting another terminal of the second capacitor to a reference potential line, and applying a reference voltage to the other terminal of the first capacitor to generate a first conversion value in the output of the operational amplification circuit and arrange electric charges in the first and second capacitors; and (b) connecting the first capacitor between an output and the inverting input of the operational amplification circuit and applying the reference voltage to the other terminal of the second capacitor to generate a second conversion value in the output of the operational amplification circuit and rearrange electric charges in the first and second capacitors.

According to this method, an error due to the mismatch in capacitance between the first and second capacitors is included in the conversion values generated in these two steps.

The method of generating a signal indicating a conversion error in the A/D conversion stage is used in a method for generating a digital signal corresponding to an analog signal. The invention in accordance with the present invention is a method for generating a digital signal corresponding to an analog signal by using A/D conversion stages, which are STG1 to STG4 connected in a loop. Each of the A/D conversion stages comprises first and second capacitors and an operational amplification circuit having an inverting input connected to one terminal of the first and second capacitors and generates a signal indicating a digital value in the A/D conversion stage. The method comprises the steps of: (a) connecting another terminal of the second capacitor to a reference potential line, connecting an output of the operational amplification circuit and the inverting input of the operational amplification circuit with each other, and applying a reference voltage to another terminal of the first capacitor to arrange electric charges in the first and second capacitors of the A/D conversion stage STG1, and further performing a predetermined conversion operation with of an analog signal in the A/D conversion stage STG2 to generate a conversion value in the output of the operational amplification circuit, and providing the conversion value to the A/D conversion stage STG3, and performing a predetermined sampling operation in the A/D conversion stage STG3, the conversion value corresponding to the analog signal; (b) after the step (a), connecting the first capacitor between an output and the inverting input of the operational amplification circuit in the A/D conversion stage STG1 and applying the reference voltage to the other terminal of the second capacitor to generate a conversion value in the output of the operational amplification circuit, to supply the conversion value to the A/D conversion stage STG2 and to perform the predetermined sampling operation in the A/D conversion stage STG2, and further performing the predetermined conversion operation of a signal sampled in the A/D conversion stage STG3 to generate a conversion value in the output of the operational amplification circuit, supplying this conversion value to the A/D conversion stage STG4 to perform the predetermined sampling operation in the A/D conversion stage STG4, the conversion value being associated with the sampled signal; (c) performing the predetermined conversion operation of a signal sampled in the A/D conversion stage STG2 to generate a conversion value in the output of the operational amplification circuit, and supplying this conversion value to the A/D conversion stage STG3, the conversion value being associated with the sampled signal, and further performing the predetermined sampling operation in the A/D conversion stage STG3, then performing the predetermined conversion operation of a signal sampled in the A/D conversion stage STG4 to generate a conversion value in the output of the operational amplification circuit, and supplying this conversion value to the A/D conversion stage STG1 to perform the predetermined sampling operation in the A/D conversion stage STG1, the conversion value being associated with the sampled signal; and (d) performing the predetermined conversion operation of a signal sampled in the A/D conversion stage STG3 to generate a conversion value in the output of the operational amplification circuit, supplying this conversion value to the A/D conversion stage STG4 to perform the predetermined sampling operation in the A/D conversion stage STG4, the conversion value being associated with the sampled signal, and further performing the predetermined conversion operation of a signal sampled in the A/D conversion stage STG1 to generate a conversion value in the output of the operational amplification circuit, supplying this conversion value to the A/D conversion stage STG2 to perform a predetermined sampling operation in the A/D conversion stage STG2. The conversion value is associated with the sampled signal. The predetermined sampling operation comprises the step of storing an electric charge in the first capacitor and the second capacitor, the electric charge corresponding to an input analog signal. The predetermined conversion operation comprises the step of connecting the first capacitor between an output of the operational amplification circuit and an inverting input of the operational amplification circuit, and supplying a conversion analog signal to another terminal of the second capacitor to generate a conversion value in the output of the operational amplification circuit and rearrange the electric charges of the first and second capacitor. The conversion analog signal is associated with a digital signal, and the digital signal indicates an A/D conversion result in the A/D conversion stage.

According to this method, the A/D conversion of a signal including an error due to the mismatch in capacitance between the first and second capacitors can be performed in parallel with the A/D conversion of the input analog signal.

In the method in accordance with the present invention, a sample/hold circuit is connected to an input of any one A/D conversion stage from among the A/D conversion stages STG1 to STG4; and the analog signal in the step (a) is associated with a sample analog signal.

Yet another aspect of the present invention resides in a method for generating a signal indicating a conversion error in an A/D conversion stage for generating a digital signal corresponding to an analog signal. The A/D conversion stages comprises first and second capacitors and an operational amplification circuit having an inverting input connected to one terminal of the first and second capacitors, and the conversion error includes an error relating to a gain of the operational amplification circuit. The method comprises the steps of: (a) connecting an output of the operational amplification circuit and the inverting input of the operational amplification circuit and applying a reference voltage to another terminal of the second capacitor to another terminal of the first capacitor to generate a first conversion value in the output of the operational amplification circuit and arrange electric charges in the first and second capacitors; and (b) connecting the first capacitor between an output of the operational amplification circuit and the inverting input of the operational amplification circuit, and applying the reference voltage to the other terminal of the second capacitor to generate a second conversion value in the output of the operational amplification circuit and rearrange electric charges in the first and second capacitors.

According to this method, the conversion values generated in these two steps include an error due to the finite gain of the conversion amplifier, and this error is provided as a difference between a reference value and a value indicating the second conversion value.

The method for generating a signal indicating a conversion error in the A/D conversion stage is used in a method of generating a digital signal corresponding to an analog signal. The invention in accordance with the present invention relates to a method for generating a digital signal corresponding to an analog signal, and this method generates a digital signal corresponding to an analog signal by using four A/D conversion stages STG1, STG2, STG3, STG4 connected in a loop. Each of the A/D conversion stages comprises first and second capacitors and an operational amplification circuit having an inverting input connected to one terminal of the first and second capacitors and generates a signal indicating a digital value in the A/D conversion stage. The method comprises the steps of: (a) connecting an output and the inverting input of the operational amplification circuit and applying a reference voltage to another terminal of the second capacitor and another terminal of the first capacitor to arrange electric charges in the first and second capacitors in the A/D conversion stage STG1, and further performing a predetermined conversion operation of an analog signal in the A/D conversion stage STG2 to generate a conversion value in the output of the operational amplification circuit, supplying this conversion value to the A/D conversion stage STG3 to perform a predetermined sampling operation in the A/D conversion stage STG3, the conversion value corresponding to the analog signal; (b) after the step (a), connecting the first capacitor between an output and the inverting input of the operational amplification circuit in the A/D conversion stage STG1 and applying the reference voltage to the other terminal of the second capacitor to generate a conversion value in the output of the operational amplification circuit, supply the conversion value to the A/D conversion stage STG2, and perform the predetermined sampling operation in the A/D conversion stage STG2, and further performing the predetermined conversion operation of a signal sampled in the A/D conversion stage STG3 to generate a conversion value, providing this conversion value to the A/D conversion stage STG4, and performing the predetermined sampling operation in the A/D conversion stage STG4, the conversion value being associated with the sampled signal for the output of the operational amplification circuit; (c) performing the predetermined conversion operation of a signal sampled in the A/D conversion stage STG2 to generate a conversion value in the output of the operational amplification circuit, and supplying this conversion value to the A/D conversion stage STG3 to perform the predetermined sampling operation in the A/D conversion stage STG3, the conversion value being associated with a sampled signal, and further performing the predetermined conversion operation of a signal sampled in the A/D conversion stage STG4 to generate a conversion value in the output of the operational amplification circuit, and supplying this conversion value to the A/D conversion stage STG1 to perform the predetermined sampling operation in the A/D conversion stage STG1, the conversion value being associated with a sampled signal; and (d) performing the predetermined conversion operation of a signal sampled in the A/D conversion stage STG3 to generate a conversion value in the output of the operational amplification circuit, supplying this conversion value to the A/D conversion stage STG4 to perform the predetermined sampling operation in the A/D conversion stage STG4, the conversion value being associated with the sampled signal, and further performing the predetermined conversion operation of a signal sampled in the A/D conversion stage STG1 to generate a conversion value in the output of the operational amplification circuit, supplying this conversion value to the A/D conversion stage STG2 to perform the predetermined sampling operation in the A/D conversion stage STG2. The conversion value is associated with the sampled signal. The predetermined sampling operation comprises the step of storing an electric charge in the first capacitor and the second capacitor, the electric charge being associated with an input analog signal. The predetermined conversion operation comprises the step of connecting the first capacitor between an output of the operational amplification circuit and an inverting input of the operational amplification circuit, and supplying a conversion analog signal to the other terminal of the second capacitor to generate a conversion value in the output of the operational amplification circuit and rearrange the electric charges of the first and second capacitors. The conversion analog signal is associated with a digital signal, and the digital signal indicates an A/D conversion result in the relevant A/D conversion stage.

According to this method, the A/D conversion of a signal including an error due to the finite gain of the operational amplification circuit can be performed in parallel with the A/D conversion of the input analog signal.

In the method in accordance with the present invention, a sample/hold circuit is connected to an input of any one of A/D conversion stage from among the A/D conversion stages STG1 to STG4; and the analog signal in the step (a) is associated with a sample analog signal.

Effects of the Invention

According to one aspect and another aspect of the present invention, an analog-digital converter is provided in which the A/D conversion time per one sampling value can be shortened. According to the further aspect, yet another aspect, one more aspect, and still another aspect of the present invention, a method is provided for generating a digital signal corresponding to an analog signal, this method being suitable for shortening the A/D conversion time per one sampling value. In addition, the present invention provides an A/D conversion stage for such an analog-digital converter. Moreover, the present invention provides a method for generating a signal indicating a conversion error in the A/D conversion stage by using the analog-digital converter.

BRIEF DESCRIPTION OF THE DRAWINGS

The above-described and other objects, features and advantages of the present invention will become more apparent from the following detailed description of preferred embodiments of the present invention taken in conjunction with the accompanying drawings.

Figure 1:
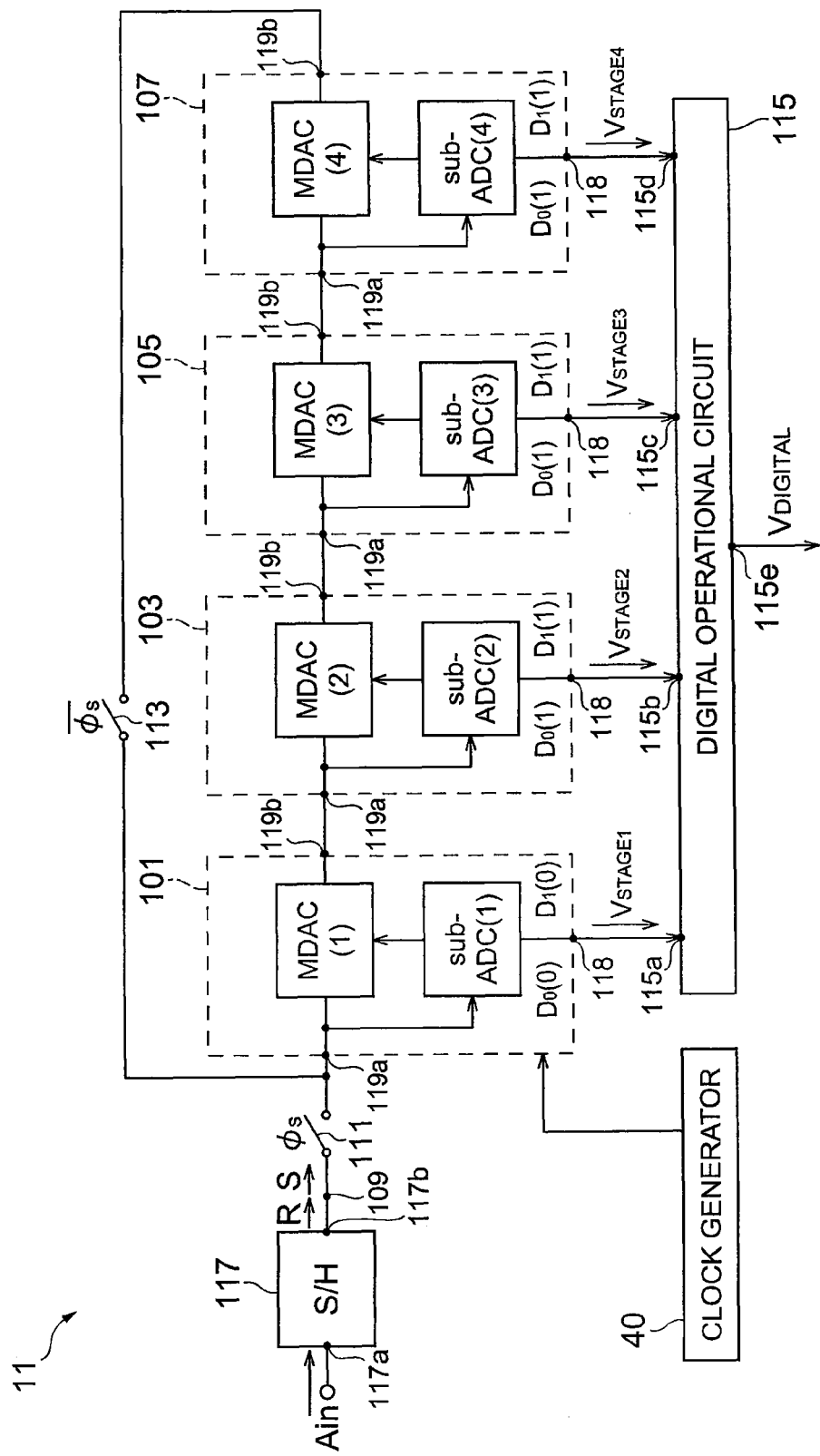
FIG. 1 is a block diagram illustrating an analog-digital converter of the present embodiment.

EXPLANATION OF REFERENCE NUMERALS 11, 11a, 11b . . . analog-digital converter, 12 . . . A/D conversion stage, 13 . . . input, 15 . . . gain stage, 16 . . . gain stage, 17 . . . first sampling switch, 19 . . . second sampling switch, 21 . . . operational amplification circuit, 23 . . . feedback switch, 25 . . . first capacitor, 27 . . . second capacitor, 29, 31, 32, 34, 35, 37 . . . switch, 33 . . . third capacitor, 39 . . . ground line, 41 . . . sub A/D conversion circuit, 42 . . . D/A conversion circuit, 43 . . . logic circuit, 44 . . . D/A conversion circuit, 45 . . . D/A conversion circuit, 46 . . . D/A conversion circuit, 47 . . . first voltage source, 49 . . . second voltage source, 51a, 51b, 51c, 51d, 51e, 51f . . . switch, 52a, 52b, 52c, 52d, 52e . . . switch, 53 . . . logic circuit, 59a to 59d . . . first to fourth switches, 101 . . . first A/D conversion stage, 103 . . . second A/D conversion stage, 105 . . . third A/D conversion stage, 107 . . . fourth A/D conversion stage, 109 . . . analog input, 111 . . . input switch, 113 . . . cyclic switch, 115 . . . digital operational circuit, 117 . . . sample/hold (S/H) circuit, 118 . . . digital output, 119a . . . stage input, 119b . . . stage output, 131 . . . first A/D conversion stage, 133 . . . second A/D conversion stage, 135 . . . third A/D conversion stage, 147 . . . stage input, 149 . . . stage output, 145 . . . digital operational circuit, $T_{S1}, T_{S2}$ ... first and second sampling period, $T_{FB}$ ... Cyclic period, $D_1, D_0$ ... digital signal, $V_{DIGITAL}$ ... A/D conversion digital code, $V_{DIG}$ ... digital signal, $V_{SWCONTO}$ ... control signal, $\phi_{DO}, \phi_{DP}, \phi_{DN}, \phi_{DO1}, \phi_{DP1}, \phi_{DN1}, \phi_{DO2}, \phi_{DP2}, \phi_{DN2}$ ... control signals, $V_i$ input analog signal, $V_{A/D}$ ... conversion analog signal, $V_{C1}$ signal for correction, $V_{C2}$ ... signal for correction, $T_1$ ... first period, $T_2$ ... second period, $T_3$ ... third period, $T_4$ ... fourth period, $T_5$ ... fifth period, $T_6$ ... sixth period, A ... sampling operation, B ... conversion operation, M1 ... first mismatch correction operation, M2 ... second mismatch correction operation, G1 ... first finite gain correction operation, G2 ... second finite gain correction operation, $A_{in}$ ... input analog signal, $V_{OFFSET}$ ... amount relating to offset of operational amplification circuit, $V_{CI}$ ... noise during operating and closing of feedback switch, 92 ... operational amplification circuit, 93 ... feedback switch, 109 ... analog input, 111 ... input switch, 113 ... cyclic switch, 116 ... digital difference correction circuit, 117 ... sample/hold (S/H), 118 ... digital output, 119a ... stage input, 119b ... stage output, 123, 125, 127, 129 ... first to fourth storage circuits, 131 ... first circuit, 133 ... second circuit, 136 ... correction value generation circuit, 151 ... first A/D conversion stage, 153 ... second A/D conversion stage, 155 ... third A/D conversion stage, 157 ... fourth A/D conversion stage, $D_S, D_R$ ... digital code, 119, 121 ... storage element, b11 to b18 ... digital signal, a11 to a18, a21 to a28, a31 to a38, a41 to a48, a51 to a58, 61a to a68 ... digital values, $S_{M1}, S_{M2}, S_{M3}, S_{M4}$ ... procedure for capacitor mismatch, m11 to m18, m21 to m28, m31 to m38, m41 to m48 ... digital values for correction, $S_{G1}, S_{G2}, S_{G3}, S_{G4}$ ... procedure for finite gain correction, g11 to g18, g21 to g28, g31 to g38, g41 to g48 ... digital values.

BEST MODE FOR CARRYING OUT THE INVENTION

The teaching of the present invention will be readily understood through the following detailed description with reference to the accompanied drawings shown as examples. Embodiments of the analog-digital converter, A/D conversion stage, and the method of generating a digital signal corresponding to an analog signal in accordance with the present invention will be explained below with reference to the appended drawings. When possible, parts identical to each other will be referred to with symbols identical to each other.

First Embodiment

FIG. 1 is a block-diagram illustrating an analog-digital converter of the present embodiment. An analog-digital converter 11 is provided with a first A/D conversion stage 101, a second A/D conversion stage 103, a third A/D conversion stage 105, a fourth A/D conversion stage 107, an analog input 109, an input switch 111, a cyclic switch 113, and a digital operational circuit 115. The first to fourth A/D conversion stages 101, 103, 105, 107 are connected in series, each having a digital output 118, a stage input 119a, and a stage output 119b. The first to fourth A/D conversion stages 101, 103, 105, 107 operate synchronously with a clock signal. The analog input 109 receives an analog signal.

The input switch 111 is connected between the stage input 119a of the first A/D conversion stage 101 and the analog input 109 and samples a first sample analog signal S and a second sample analog signal R in first and second sampling period TS1, TS2, respectively. The cyclic switch 113 is connected between the stage input 119a of the first A/D conversion stage 101 and the stage output 119b of the fourth A/D conversion stage 107 and provides a path from the fourth A/D conversion stage 107 to the first A/D conversion stage 101 in a cyclic period $T_{FB}$ that is different from the first and second sampling periods $T_{S1}, T_{S2}$. The digital operational circuit 115 generates an A/D conversion digital code $V_{DIGITAL}$ indicating the analog/digital conversion results corresponding to signals $V_{STAGE1}, V_{STAGE2}, V_{STAGE3}, V_{STAGE4}$ of conversion results from the first to fourth A/D conversion stages 101, 103, 105, 107. Further, the digital operational circuit 115 has inputs 115a, 115b, 115c, 115d connected to the first to fourth A/D conversion stages 101, 103, 105, 107, respectively, and an output 115e that provides the A/D conversion digital code $V_{DIGITAL}$. In a period including the first and second sampling periods $T_{S1}, T_{S2}$, the input switch 111 is closed in response to a clock $\phi_S$ and the cyclic switch 113 is opened. Further, in the cyclic period $T_{FB}$, the input switch 111 is opened in response to a clock $\phi_S$ and the cyclic switch 113 is closed. The analog-digital converter 11 is further provided with a sample/hold (S/H) circuit 117 that holds the received analog input $A_{in}$, and the S/H circuit 117 successively samples the analog signals that will be subjected to A/D conversion in the A/D converter and provides the sampled analog signals to the stage input 119a of the first A/D conversion stage 101 via the input switch 111. The S/H circuit 117 has an input 117a that receives the input analog signal $A_{in}$ and an output and 117b that provides analog signals S, R. A clock generator 40 provides clock signals shown in FIG. 1 to FIG. 3.

As can be clearly understood from the following explanation, with the analog-digital converter 11, because the first to fourth A/D conversion stages 101, 103, 105, 107 are connected in a loop-like fashion via the cyclic switch 113, the A/D conversion can be performed in parallel with respect to two sampling values.

Figure 2:
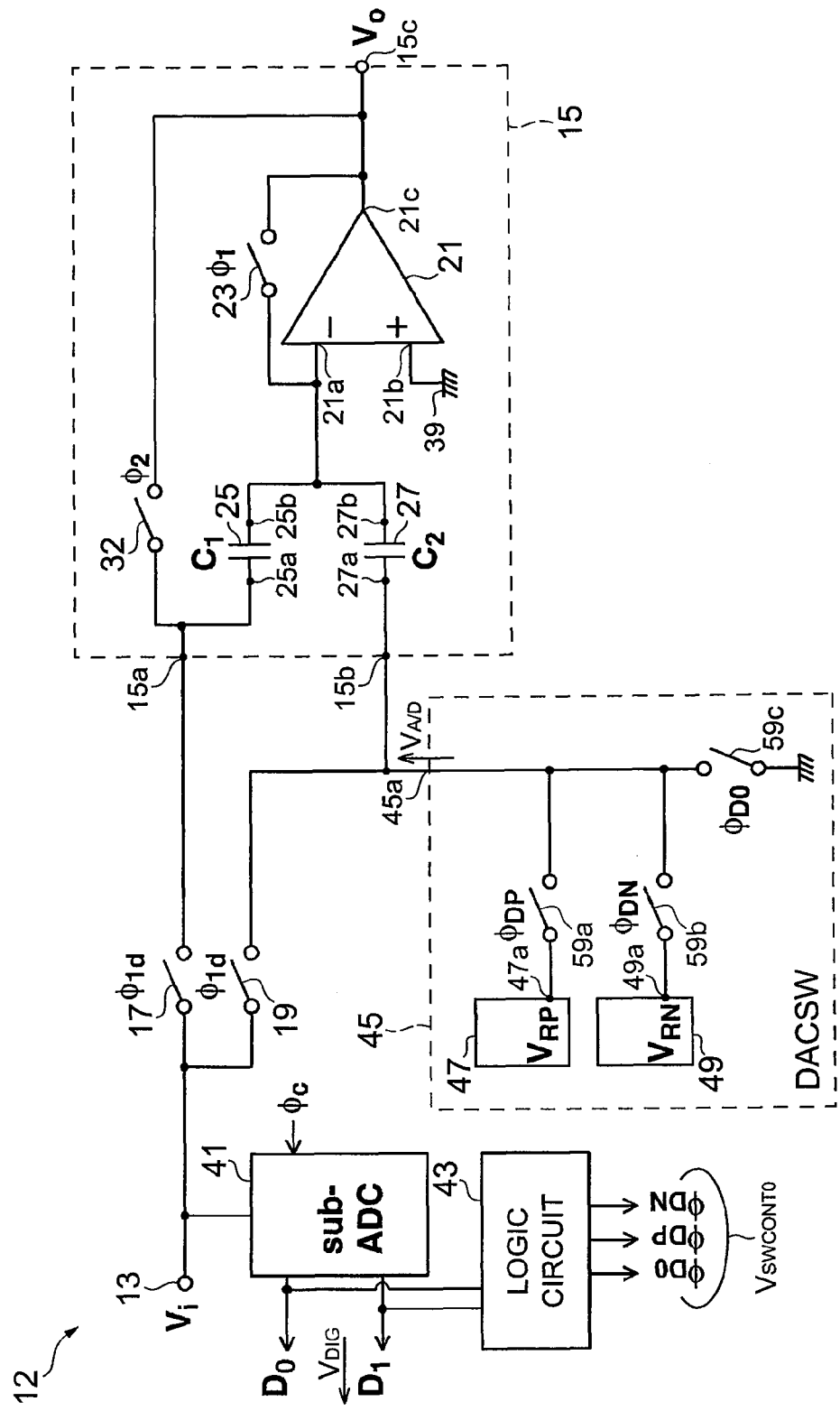
FIG. 2 is a circuit diagram illustrating an A/D conversion stage of the analog-digital converter.
Figure 3:
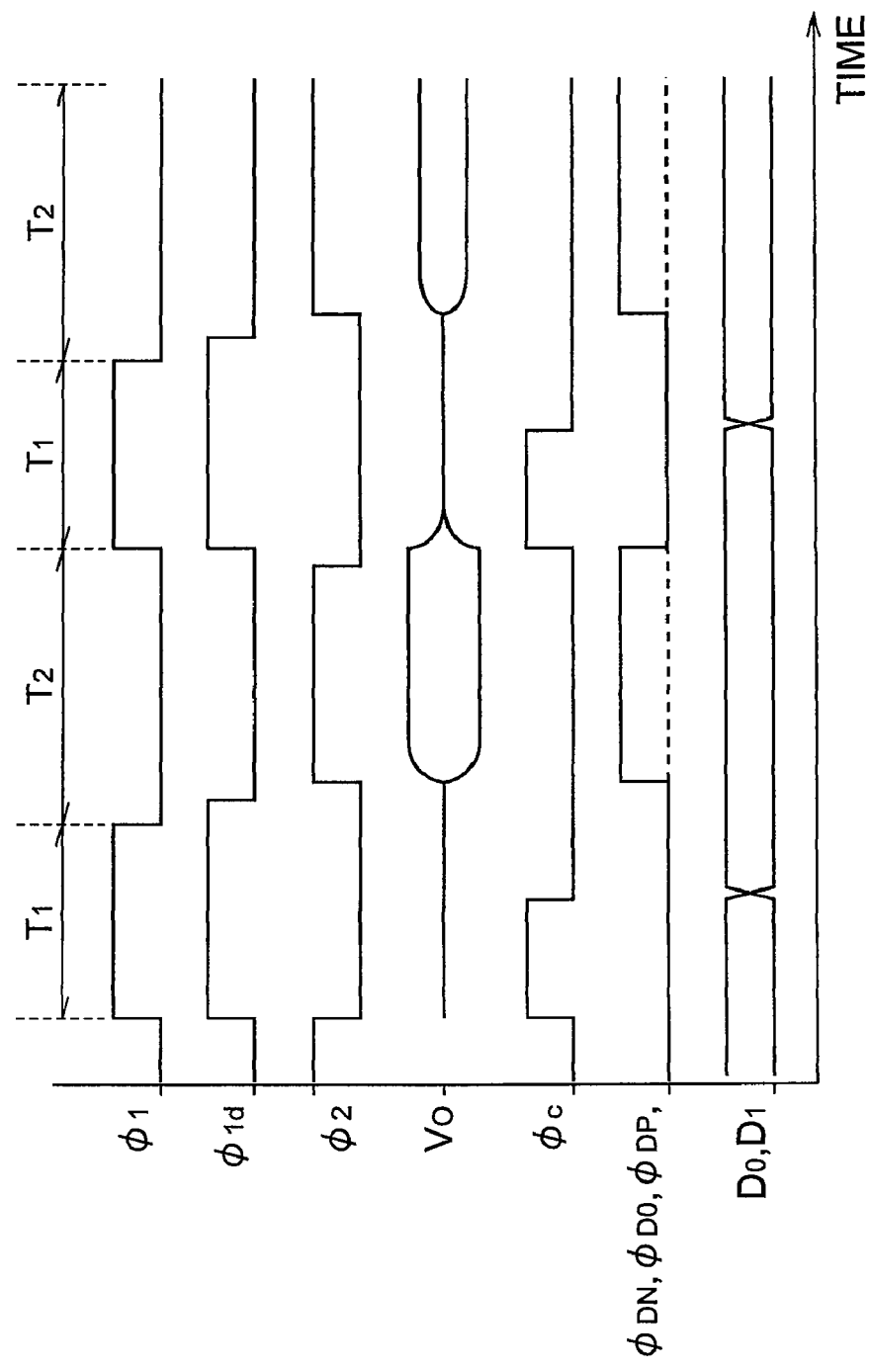
FIG. 3 is a timing chart for the A/D conversion stage shown in FIG. 2.

FIG. 2 is a circuit diagram illustrating the A/D conversion stage of the analog-digital converter. FIG. 3 is a diagram illustrating a timing chart for the A/D conversion stage shown in FIG. 2. The A/D conversion stage 12 for the first to fourth A/D conversion stages is provided with an input 13, a gain stage 15, a first sampling switch 17, and a second sampling switch 19.

The gain stage 15 includes a first input 15a and a second input 15b. The first input 15a is provided for receiving either of the two analog signals: an input analog signal $V_i$ and a conversion analog signal $V_{A/D}$. The second input 15b is provided for receiving either of the two analog signals: an input analog signal $V_i$ and a conversion analog signal $V_{A/D}$. The first sampling switch 17 is connected between the first input 15a and the input 13 and provided to perform the sampling of the input analog signal $V_i$ in the first period $T_1$. The second sampling switch 19 is connected between the second input 15b and the input 13 and provided to perform the sampling of the input analog signal $V_i$ in the first period $T_1$.

The gain stage 15 includes an operational amplification circuit 21, a feedback switch 23, a first capacitor 25, a second capacitor 27, and a first switch 32. The operational amplification circuit 21 includes an inverting input 21a, a non-inverting input 21b, and an output 21c.

The feedback switch 23 is connected between the inverting input 21a of the operational amplification circuit 21 and the output 21c of the operational amplification circuit 21 and connects the output 21c of the operational amplification circuit 21 to the inverting input 21a of the operational amplification circuit 21 in the first period $T_1$. The first capacitor 25 has one terminal 25a connected to the first input 15a and the other terminal 25b connected to the inverting input 21a. The second capacitor 27 has one terminal 27a connected to the second input 15b and the other terminal 27b connected to the inverting input 21a. The first switch 32 is connected between the one terminal 25a of the first capacitor 25 and the output 21c of the operational amplification circuit 21 and provided for connecting the first capacitor 25 to the output 21c and inverting input 21a of the operational amplification circuit 21 in a second period $T_2$, which is different from the first period $T_1$. The output 15c of the gain stage 15 is connected to the output 21c of the operational amplification circuit 21. The non-inverting input 21b of the operational amplification circuit 21 is connected to a reference potential line (for example, a ground line 39).

As shown in FIG. 2, the A/D conversion stage 12 can be provided with a sub A/D conversion circuit 41, a logic circuit 43, and a D/A conversion circuit 45. The sub A/D conversion circuit 41 is connected to the input 13 and generates a digital signal $V_{DIG}$ correspondingly to the inputted analog signal $V_i$. The digital signal $V_{DIG}$ takes a predetermined number of values and preferably has, for example, two values ("0", "1") or three values ("−1", "0", "+1"). The logic circuit 43 is connected to the sub A/D conversion circuit 41 and generates a control signal $V_{SWCONT0}$ in response to the digital signal $V_{DIG}$. The D/A conversion circuit 45 is connected to the logic circuit 43 and has an output 45a for providing a conversion analog signal $V_{A/D}$. The conversion analog signal $V_{A/D}$ is generated in response to the control signal $V_{SWCONT0}$. The control signal $V_{SWCONT0}$ is used to provide the conversion analog signal $V_{A/D}$ to the gain stage 15 in the second period $T_2$.

The sub A/D conversion circuit 41 can include, for example, one comparator. The comparator will compare the input analog signal with a predetermined reference signal and provide a signal indicating the comparison result. A 1-bit digital signal is obtained using such a conversion circuit. Where the number of comparators is increased, a digital signal with a number of bits in excess of 1 bit can be obtained. The sub A/D conversion circuit 41 can include, for example, two comparators. The comparators will compare the input analog signals with the predetermined respective reference signals $V_{REF1}$, $V_{REF2}$ and provide the comparison result signals $D_0$, $D_1$, as shown in FIG. 1. The reference signal $V_{REF1}$ can be, for example, −Vref/4, as shown in FIG. 3, and the reference signal $V_{REF2}$ can be, for example, +Vref/4.

Range of Input Analog Signal $V_i$, Digital Signals $$-V\mathrm{ref}/4 > V_i, -1 (D_1=0, D_0=0). \quad (1)$$

$$V\mathrm{ref}/4 \geqq V_i \geqq -V\mathrm{ref}/4, 0 (D_1=0, D_0=1). \quad (2)$$

$$V_i > +V\mathrm{ref}/4, +1 (D_1=1, D_0=1). \quad (3)$$

By comparing the input analog signal with two predetermined reference signals the sub A/D conversion circuit can generate a three-value redundant digital signal. With such a conversion circuit, the input analog signal is compared with two predetermined reference signals. Therefore, a three-value digital signal is obtained. The sub A/D conversion circuit 41 is preferably activated, for example, in the first period $T_1$, as shown in FIG. 3.

Further, the D/A converter 45 provides a predetermined voltage corresponding to control signals $\phi_{DO}$, $\phi_{DP}$, $\phi_{DN}$ to one terminal 27a of the second capacitor 27 in the second period T2. The D/A conversion circuit 45 includes a first voltage source 47 and a second voltage source 49. The first voltage source 47 provides a voltage $V_{RP}$. The second voltage source 49 provides a voltage $V_{RN}$. An output 47a of the first voltage source 47 is connected to the second input 15b via a first switch 59a and the output 45a, and an output 49a of the second voltage source 49 is connected to the second input 15b via a second switch 59b and the output 3a. The output 47a is connected to the ground line via a third switch 59c. As shown in FIG. 3, the logic circuit 53 generates control signals $\phi_{DO}$, $\phi_{DP}$, $\phi_{DN}$ for controlling the first to third switches 59a to 59c, respectively. The values of digital signals $D_1$, $D_0$ determine which of the control signals $\phi_{DO}$, $\phi_{DP}$, $\phi_{DN}$ becomes active.

Figure 4:
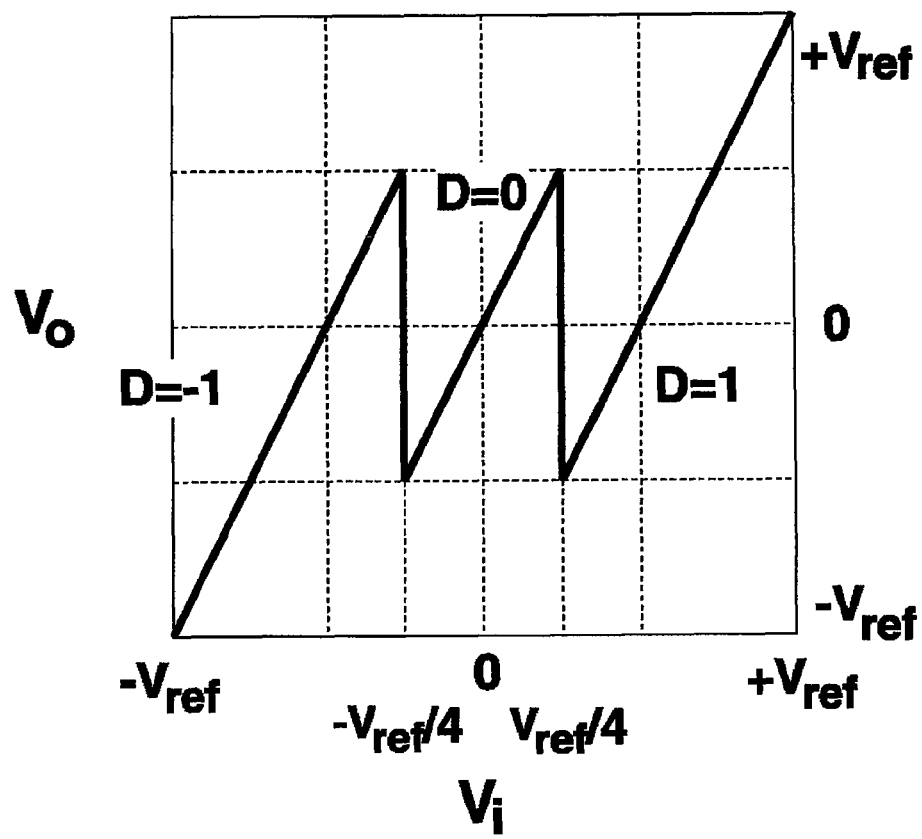
FIG. 4 illustrates a conversion characteristic of a D/A conversion circuit.

For example, as shown in FIG. 4, in response to control signals from the logic circuit 43, the D/A conversion circuit 45:

(1) provides $V_{A/D}$=Vref when the condition (−Vref/4>$V_i$) is satisfied;

(2) provides $V_{A/D}$=0 when the condition (Vref/4≧$V_i$≧−Vref/4) is satisfied;

(3) provides $V_{A/D}$=−Vref when the condition ($V_i$>+Vref/4) is satisfied.

A three-value A/D conversion is performed with respect to these three regions and "−1", "0", "+1" digital codes are allocated. The initial code is the most significant digit. The following computation is performed according to the characteristic shown in FIG. 4.

$$V_{OUT} = 2 \times V_{in} - D \times V\mathrm{ref}.$$

Thus, in this computation, the A/D conversion is successively performed from the high-order digit, the input of the gain stage is doubled, and the output of the gain stage is always confined in the −Vref to +Vrf range by performing:

(1) subtraction of a constant value Vref,
(2) addition of a constant value Vref,
(3) providing zero, depending on the A/D conversion value of the gain stage.

By thus performing the A/D conversion with three values, redundancy is provided in the digital value. This redundancy makes it possible to perform highly accurate A/D conversion, while greatly relaxing the accuracy requirement relating to the comparator in the sub A/D circuit. Each digit of binary number takes two values: "0" and "1", but the digital signal of each gain stage takes three values: "−1", "0", "+1". Therefore, it can be assumed that a 1.5-bit A/D conversion has been performed for one gain stage.

Figure 5:
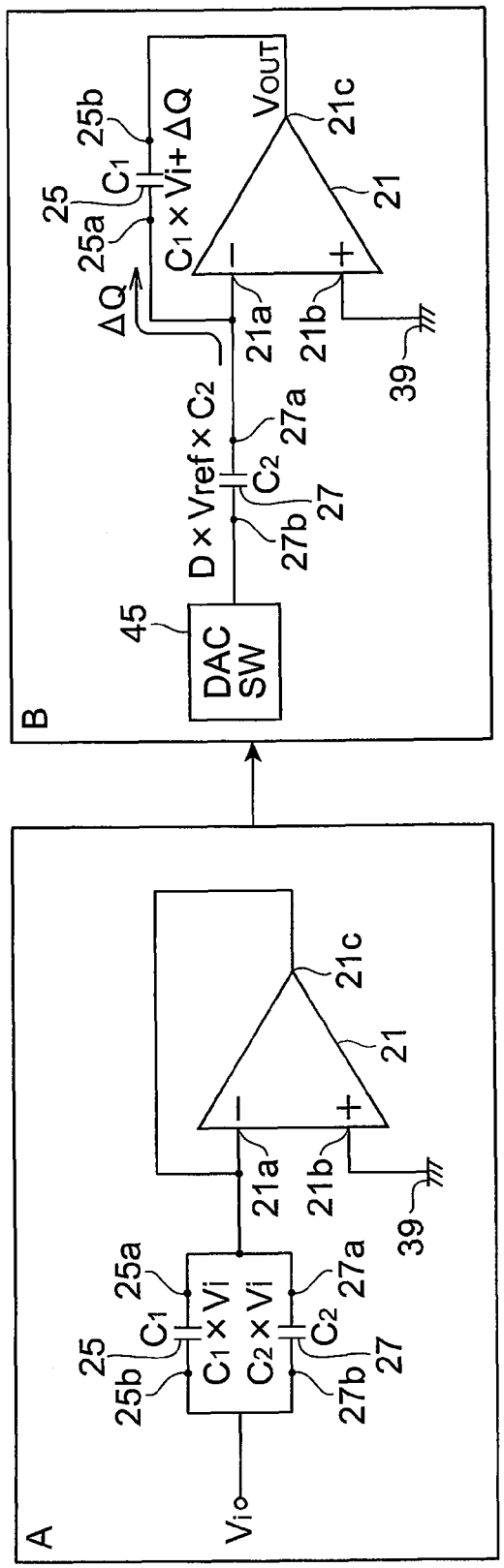
FIG. 5 explains the operation of the A/D conversion stage.

FIG. 5 is a diagram illustrating the operation of the A/D conversion stage. The operation of the A/D conversion stage will be understood from the explanation provided with reference to FIG. 5. A method for generating a digital signal corresponding to an analog signal that will be explained hereinbelow is implemented using four A/D conversion stages connected in series. Each of these A/D conversion stages includes first and second capacitors and an operational amplification circuit. The first to fourth A/D conversion stages can be configured, for example, by using the first to fourth A/D conversion stages 101, 103, 105, 107.

The operation of the A/D conversion stage includes a sampling operation A and a conversion operation B.

Sampling Operation A:

Electric charges $Q_1 = C_1 \times V_i$, $Q_2 = C_2 \times V_i$ corresponding to the input analog signal $V_1$ are accumulated in the first capacitor 25 and second capacitor 27.

Conversion Operation B:

A conversion value $V_{OUT}$ is generated at the output 21c of the operational amplification circuit 21 and the electric charges of the first and second capacitors 25, 27 are rearranged by connecting the first capacitor 25 between the output 21c of the operational amplification circuit 21 and the inverting input 21a and supplying a conversion analog signal VA/D corresponding to a digital signal indicating the A/D conversion result in the A/D conversion stage to the other terminal 27b of the second capacitor by using a D/A converter DACSW. The electric charge of the first capacitor 25 is $C_1 \times V_{OUT}$. An electric charge $\Delta Q = C_2 \times V_i - D \times Vref \times C_2$ moves from the second capacitor 27 to the first capacitor 25. As a result, the electric charge accumulated in the first capacitor 25 becomes $C_1 \times V_1 + \Delta Q$ according to a charge preservation rule. On the other hand, this electric charge is equal to $C_1 \times V_{OUT}$. Therefore, $$C_1 \times V_{OUT} = C_1 \times V_1 + \Delta Q = C_1 \times V_1 + C_2 \times V_1 - D \times Vref \times C_2.$$

$$V_{OUT} = (1 + C_2/C_1) \times V_i - D \times Vref \times C_2/C_1.$$

Figure 6:
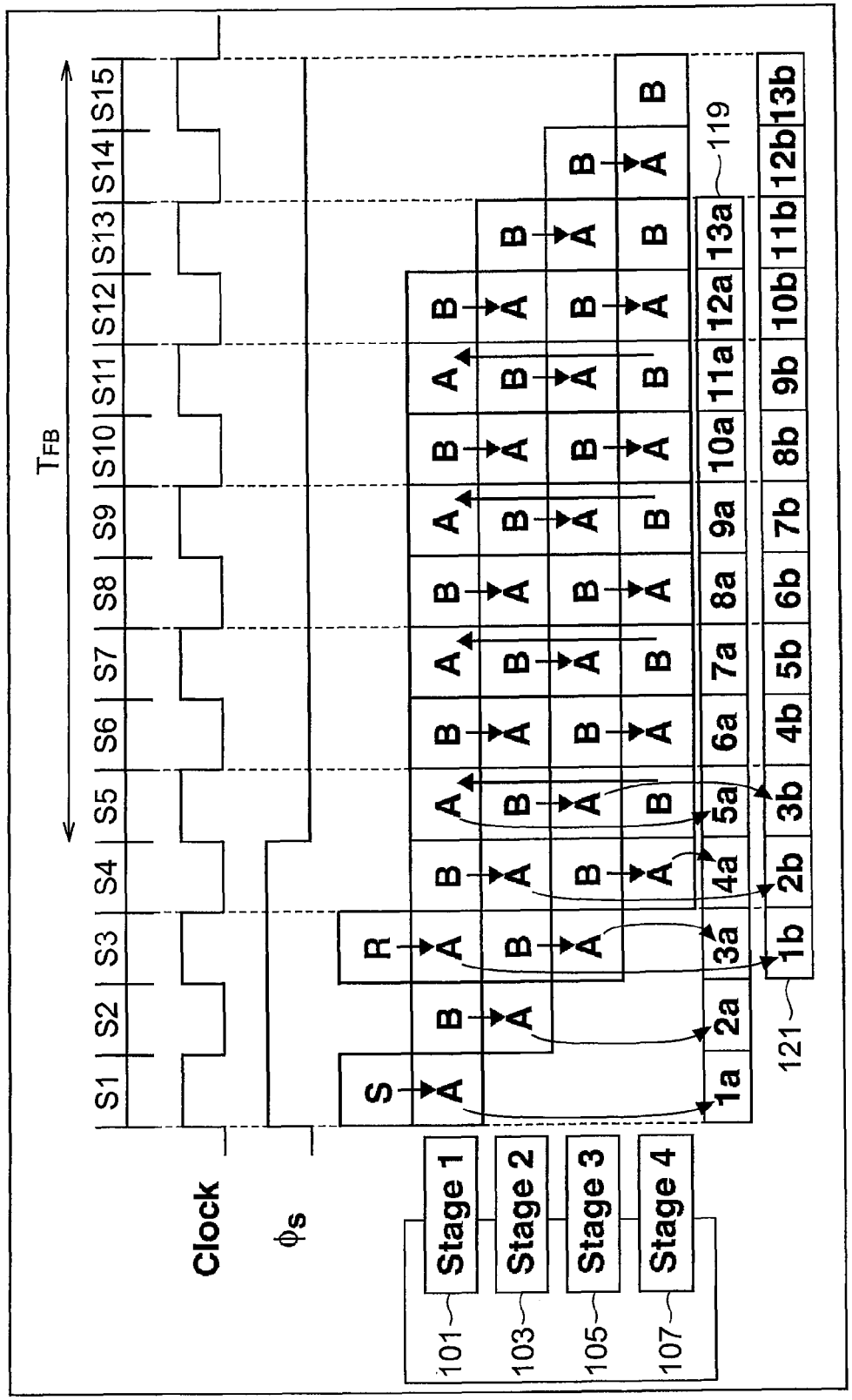
FIG. 6 illustrates a procedure of generating an A/D conversion digital code by using the analog-digital converter.

FIG. 6 is a diagram illustrating the procedure of generating an A/D conversion digital code by using the analog-digital converter 11. In the explanation below, this procedure will be described successively, starting from the sampling of analog signals. FIG. 6 shows steps S1 to S15.

Step S1: a first sample analog signal S is received by the first A/D) conversion stage Stage1, and the sampling operation A is performed with respect to the first sample analog signal S. The first A/D conversion stage Stage1 generates a digital signal 1a.

Step S2: the conversion operation B is performed with respect to the analog signal sampled in the first A/D conversion stage Stage1 and a first conversion result D1 is generated. The sampling operation A is performed in the second A/D conversion stage Stage2 with respect to the analog signal A1 corresponding to the first conversion result D1. The first A/D conversion stage Stage1 generates a digital signal 2a.

Step S3: the first A/D conversion stage Stage1 receives the second sample analog signal R, the sampling operation A is performed with respect to the second sample analog signal R, the conversion operation B is performed with respect to the analog signal A2 sampled in the second A/D conversion stage Stage2, a second conversion result D2 is generated, and the sampling operation A is performed in the third A/D conversion stage Stage2 with respect to an analog signal corresponding to the second conversion result D2. The second A/D conversion stage Stage2 generates a digital signal 1b. The first A/D conversion stage Stage1 generates a digital signal 3a.

By these operations, the analog signal is fetched as two sample analog signals to the A/D conversion stage. The first sample analog signal S and second sample analog signal R are successively provided to the first A/D conversion stage Stage1 thereby, as hereafter explained, making it possible to link any of the first to fourth A/D conversion stages to a procedure of performing either of the sampling operation A and conversion operation B.

Step S4: The conversion operation B is performed with respect to the analog signal R sampled in the first A/D conversion stage Stage1, a third conversion result D3 is generated, the sampling operation A is performed in the second A/D conversion stage Stage2 with respect to an analog signal A3 corresponding to the third conversion result D3, the conversion operation B is performed with respect to the analog signal sampled in the third A/D conversion stage Stage3, a fourth conversion result D4 is generated, and the sampling operation A is performed in the fourth A/D conversion stage Stage4 with respect to an analog signal A4 corresponding to the fourth conversion result D4. The second A/D conversion stage Stage2 generates a digital signal 2b. The first A/D conversion stage Stage1 generates a digital signal 4a.

Step S5: the conversion operation B is performed with respect to the analog signal sampled in the fourth A/D conversion stage Stage4, a fifth conversion result D5 is generated, the sampling operation A is performed in the first A/D conversion stage Stage1 with respect to an analog signal A5 corresponding to the fifth conversion result D5, the conversion operation B is performed with respect to the analog signal sampled in the second A/D conversion stage Stage2, a sixth conversion result is generated, and the sampling operation A is performed in the third A/D conversion stage Stage3 with respect to an analog signal A6 corresponding to the sixth conversion result. The first A/D conversion stage Stage1 generates a digital signal 5a. The second A/D conversion stage Stage2 generates a digital signal 3b.

With these steps, either of the sampling operation A and conversion operation B is performed in any of the first to fourth A/D conversion stages. Therefore, the first to fourth A/D conversion stages operate efficiently. Furthermore, two signals are A/D converted in parallel.

As shown in FIG. 6, steps S4 and S5 and also steps S6 and S7, steps S8 and S9, and steps S10 and S11 are repeated. As shown in FIG. 6, digital signals 1a to 13a are provided from step S1 to step S13. Digital signals 1b to 13b are provided from step S3 to step S15. The digital signals 1a to 13a, 1b to 13b are generated by the A/D conversion circuits located in the first to fourth A/D conversion stages. These digital signals are stored in storage elements 119, 121 located in the digital operational circuit 115.

The procedure shown in FIG. 5 represents steps for one input analog signal in an entirely differential circuit. Therefore, it is clear that two steps can be also applied to an entirely differential circuit, rather than only to a single-end circuit. In other words, although the gain stage 15 shown in FIG. 2 has a single-end circuit structure, a gain stage having an entirely differential structure also can be used in the present embodiment.

Figure 7:
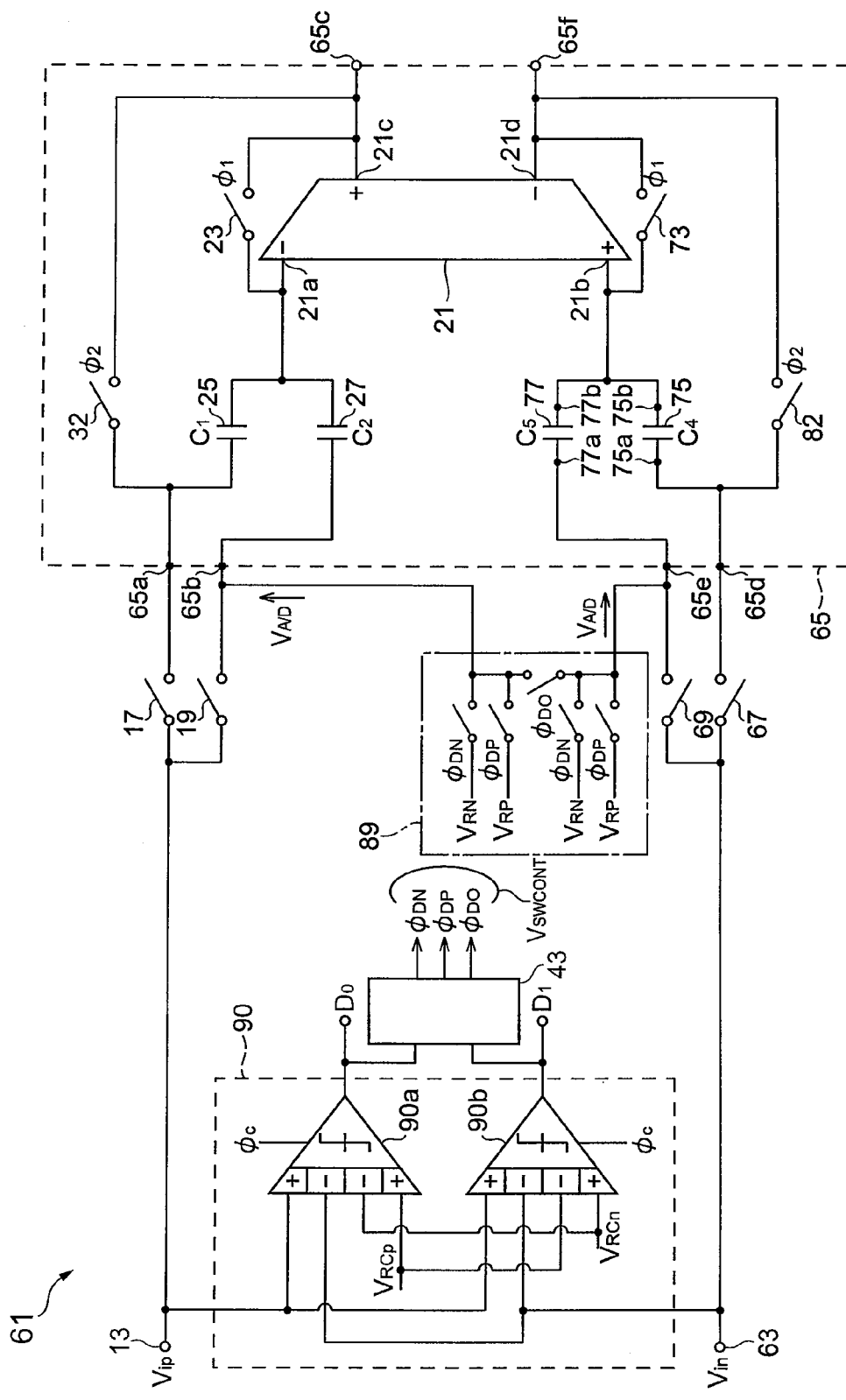
FIG. 7 is a circuit diagram illustrating a conversion circuit for the analog-digital converter.

FIG. 7 is a circuit diagram illustrating a conversion circuit for the analog-digital converter. As shown in FIG. 7, the conversion circuit has an entirely differential configuration. An A/D conversion stage 61 includes the input 13, first sampling switch 17 and second sampling switch 19 and is provided with a gain stage 65 instead of the gain stage 15. The gain stage 65 includes a first input 65a, a second input 65b, an output 65c, a first complementary input 65d, a second complementary input 65e, and a complementary output 65f. The first input 65a is provided for receiving an analog signal: either of the input analog signal $V_{ip}$ and the conversion analog signal $V_{A/D}$. The second input 65b is provided for receiving an analog signal: either of the input analog signal $V_{ip}$ and the conversion analog signal $V_{A/D}$. The first complementary input 65d is provided for receiving an analog complementary signal: either of the input analog complementary signal $V_{in}$ and the conversion analog complementary signal $V_{A/D}$. The second complementary input 65e is provided for receiving an analog complementary signal: either of the input analog complementary signal $V_{in}$ and the conversion analog complementary signal $V_{A/D}$.

The first sampling switch 17 is connected between the first input 65a and input 13 and provided for sampling the input analog signals $V_{ip}$ in the first period $T_1$. The second sampling switch 19 is connected between the second input 65d and input 13 and provided for sampling the input analog signals $V_{ip}$ in the first period $T_1$.

The conversion circuit 61 can be further provided with a complementary input 63, a third sampling switch 67, and a fourth sampling switch 69. The third sampling switch 67 is connected between the first complementary input 65d of the gain switch 65 and the complementary input 63 and provided for sampling the input analog complementary signals $V_{ip}$ in the first period $T_1$. The fourth sampling switch 69 is connected between the second complementary input 65e and complementary input 63 and provided for sampling the input analog complementary signals $V_{ip}$ in the first period $T_1$.

The gain stage 65 includes a feedback switch 73, a third capacitor 75, a fourth capacitor 77, and a second switch 82 in addition to the operational amplification circuit 21, feedback switch 23, first capacitor 25, second capacitor 25, and first switch 32. The third capacitor 75 has one terminal 75a connected to the first complementary input 65d and the other terminal 75b connected to the non-inverting input 21b. The fourth capacitor 77 has one terminal 77a connected to the second complementary input 65e and the other terminal 77b connected to the non-inverting input 21b. The feedback switch 73 is connected between the complementary output 21d and non-inverting input 21b of the operational amplification circuit 21.

The sub A/D conversion circuit 90 includes two comparators 90a, 90b, for example, of an entirely differential configuration. The comparator 90a generates the conversion result $D_0$. The comparator 90b generates the conversion result $D_1$. These conversion results are provided as digital signals to the logic circuit 43 and also to the digital output of the conversion circuit 61. The logic circuit 43 generates control signals $\phi_{DO}$, $\phi_{DP}$, $\phi_{DN}$ corresponding to digital signals ($D_0$, $D_1$).

In response to control signals from the logic circuit 43, the D/A conversion circuit 89:

(1) provides $V_{A/D}(N)=V_{A/D}(P)=$Vref when the condition $(-\text{Vref}/4 > V_i)$ is satisfied;

(2) connects the first input 65a and the first complementary input 65d to each other and also connects the second input 65b and the second complementary input 65e to each other when the condition Vref/4 $\geq V_i \geq -$Vref/4) is satisfied;

(3) provides $V_{A/D}(N)=V_{A/D}(P)=-$Vref when the condition $(V_i > +\text{Vref}/4)$ is satisfied. Here, $V_i=V_{ip}-V_{in}$. As described hereinabove, with the conversion circuit 61, the gain stage 65 of an entirely differential configuration is provided.

Figure 8:
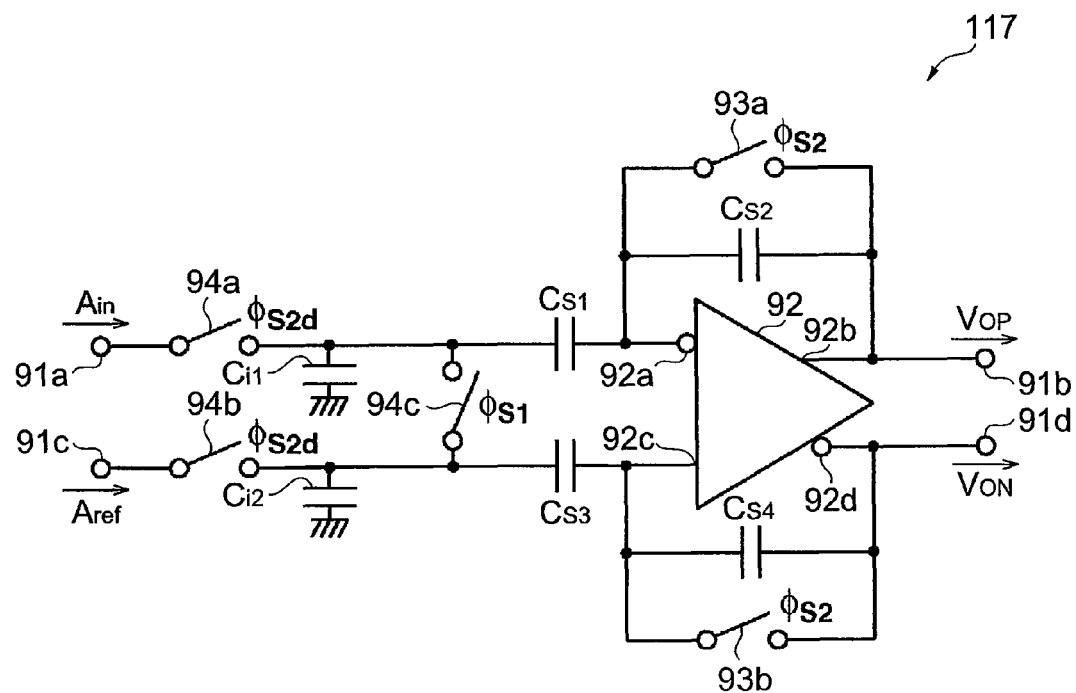
FIG. 8 is a circuit diagram illustrating an example of an S/H circuit.
Figure 9:
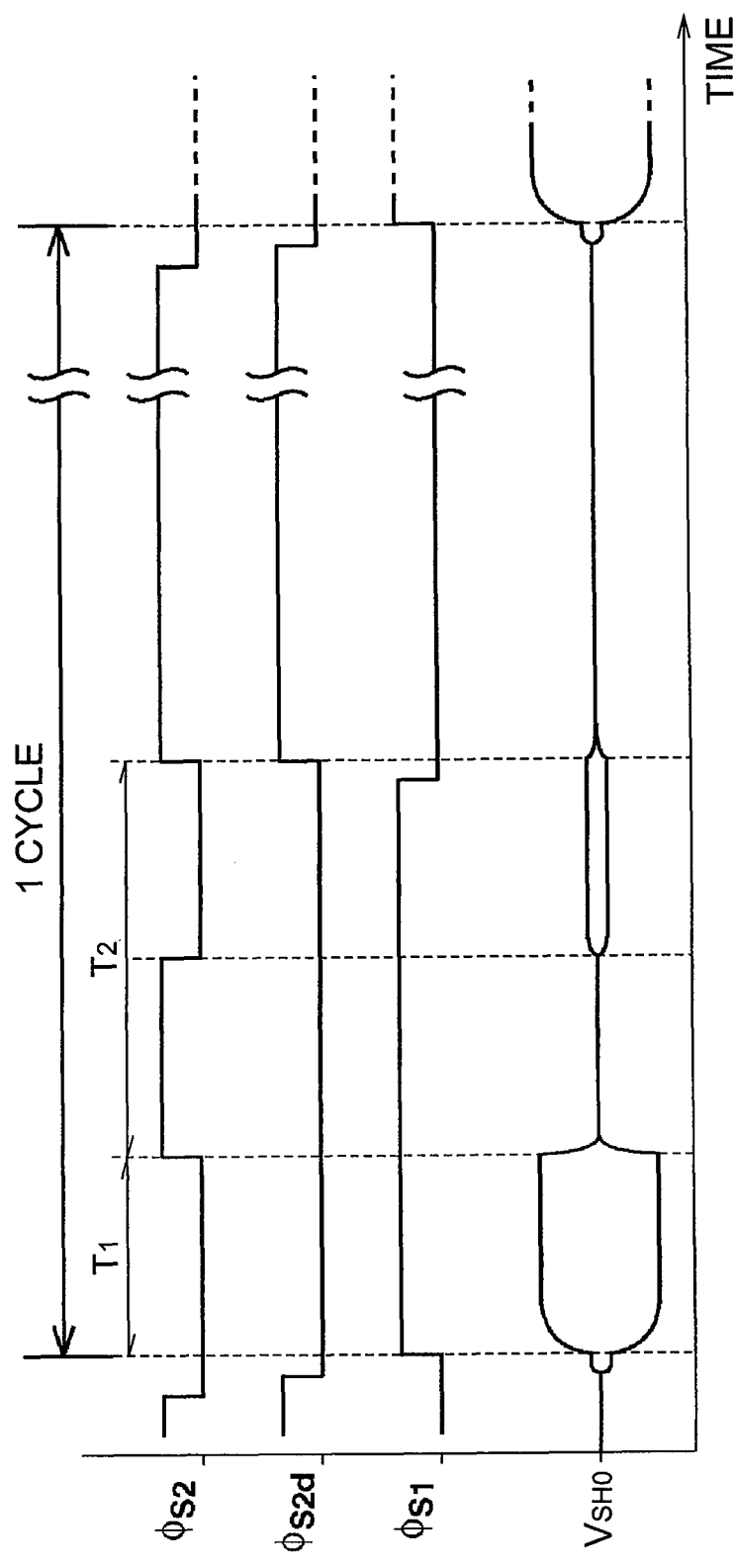
FIG. 9 illustrates a timing chart for the S/H circuit shown in FIG. 8.

Referring again to FIG. 1, the analog-digital converter 11 includes the S/H circuit 117. FIG. 8 is a circuit diagram illustrating an example of the S/H circuit. FIG. 9 is a diagram illustrating a timing chart for the S/H circuit shown in FIG. 8. The S/H circuit 117 has an input 91a for receiving an input analog signal $A_{in}$ and an output 91b for providing the analog signal $V_i$ to the analog input 109. The S/H circuit 117 can include the operational amplification circuit 92 and a feedback switch 93. The operational amplification circuit 92 has an inverting input 92a and a non-inverting output 92b. As will be described hereinbelow, the feedback switch 93a is connected between the inverting input 92a and non-inverting output 92b. By using the feedback switch 93a, it is possible to generate a signal corresponding to the offset amount of the operational amplification circuit 92. In the S/H circuit 117, a capacitor $C_{S1}$ is connected between the sample input 91a and inverting input 92a via a first switch 94a. The capacitor $C_{S2}$ is connected between the non-inverting output 92b and inverting input 92a. The first switch 94a is closed in a period serving for sampling and open in a period serving for A/D conversion.

The feedback switch 93a of the S/H circuit 117 is open in either the entire first sampling period or the entire second sampling period. In this period, the input analog signal $A_{in}$ is generated as either of the first and second sample analog signals. This signal can be provided to the A/D conversion stage as an analog signal serving as an A/D conversion object.

The S/H circuit 117 of the entirely differential configuration can include a feedback switch 93b. The operational amplification circuit 92 has a non-inverting input 92c and an inverting output 92d. The feedback switch 93b is connected between the non-inverting input 92c and inverting output 92d. By using the feedback switches 93a, 93b, it is possible to generate a signal corresponding to the offset amount of the operational amplification circuit 92. In the S/H circuit 117, a capacitor CS3 is connected between a sample input 91c and the non-inverting input 92 via a first switch 94b. A capacitor $C_{S4}$ is connected between the non-inverting output 92c and inverting input 92d. A second switch 94b is closed in the sampling period and open in the period for A/D conversion. A switch 94c is connected between one terminal of a capacitor CS1 and one terminal of the capacitor $C_{S3}$. Capacitors $C_{i1}$ and $C_{i2}$ are connected to the input 91a and sample input 91c, respectively.

The feedback switch 93a of the S/H circuit 117 is closed in part of the other of the first and second sampling periods, and the other of the first and second sample analog signals is held after the feedback switches 93a, 93b of the sample/hold circuit 117 have been opened. Where the feedback switches 93a, 93b are thus operated, a signal including the offset amount of the operational amplification circuit 92 can be provided to the A/D conversion stage.

For example, as shown in FIG. 9, the signal $A_{in}$ received by the input 91a is held in the initial sampling period $T_{S1}$. In the single-end S/H circuit, the non-inverting input 92a of the operational amplification circuit 92 is grounded. At this time, the S/H circuit provides an output value $V_{SHO1}$.

$$V_{SHO1}=V_{OP}-V_{ON}=(A_{IN}-A_{ref})\times C_{S1}/C_{S2}+V_{OFFSET}+V_{CI}.$$

In the first half of the next sampling period TS2, the switches 93a, 93b are closed in response to the clock signal $\phi_{S2}$, and after the sampling period $T_{S2}$, the S/H circuit provides an output $V_{SHO2}$. The output value $V_{SHO2}$ does not include the analog signal inputted to the S/H circuit. For this reason, the output value $V_{SHO2}$ includes an amount $V_{OFFSET}$ correlated with the offset of the operational amplification circuit 92, a noise $V_{CI}$ occurring when the switch 93a is opened and closed (for example, when the switch 93a is a MOS analog switch and the MOS analog switch is opened, the noise is generated by the channel charge), and other noise. This output value is represented by $$=V_{OP}-V_{ON}=V_{OFFSET}+V_{CI}.$$

These two signals, output value $V_{SHO1}$ and output value $V_{SHO2}$, are used as signals "S" and "R" shown in FIG. 6. Where the signals "S" and "R" are A/D converted, the respective conversion values $D_S$, $D_R$ can be represented as follows.

$$\begin{aligned}D_S &= D((A_{IN}-A_{ref})\times C_{S1}/C_{S2}+V_{OFFSET}+V_{CI})+D(V_{OS,ADC})\\ &= D((A_{IN}-A_{ref})\times C_{S1}C_{S2})+D(V_{OFFSET})+\\ &\quad D(V_{CI})+D(V_{OS,ADC})\end{aligned}$$

$$\begin{aligned}D_R &= D(V_{OFFSET}+V_{CI})\\ &= D(V_{OFFSET})+D(V_{CI})+D(V_{OS,ADC}).\end{aligned}$$

Here, D is an operator indicating A/D conversion. These signals "S" and "R" are subjected to A/D conversion. Further, the $V_{OS,ADC}$ is a term representing the offset generated in the gain stage of the A/D conversion stage. The conversion values DS, DR include the term $D(V_{OS,ADC})$ that is not included in the input signals $V_{SHO1}$, $V_{SHO2}$ of the A/D conversion sage. Therefore, in the present embodiment, the offset generated in the gain stage of the A/D conversion stage is also corrected.

Figure 10:
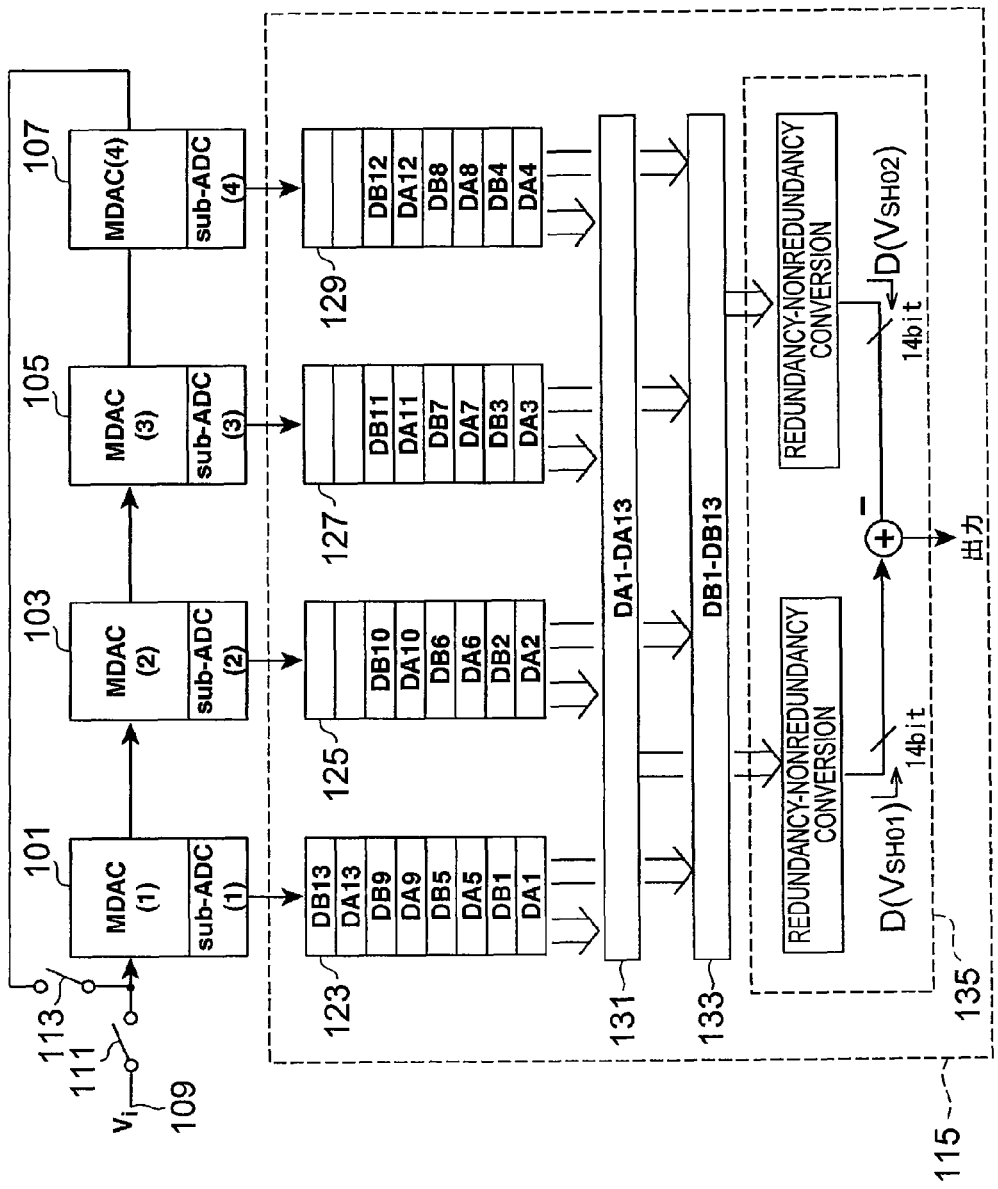
FIG. 10 is a block diagram of an analog-digital converter that can perform correction.

FIG. 10 is a block diagram illustrating an analog-digital converter that can perform the correction. A digital operational circuit 115 includes first to fourth storage circuits 123, 125, 127, 129, a first circuit 131, a second circuit 133, and a correction circuit 135. Each of the first to fourth storage circuits 123, 125, 127, 129 stores a first data group (DA1 to DA13) and a second data group (DB1 to DB13) composed of digital signals from the first to fourth A/D conversion stages 101, 103, 105, 017 and corresponding to the first and second sample signals S, R, respectively. The first circuit 131 is connected to the first to fourth storage circuits 123, 125, 127, 129 and generates a first digital code $D_S$ (for example, 14 bit) corresponding to the first sample analog signal S by using digital signals of the first data group (DA1 to DA13). The second circuit 133 is connected to the first to fourth storage circuits 123, 125, 127, 129 and generates a second digital code $D_R$ (for example, 14 bit) corresponding to the second sample analog signal R by using digital signals of the second data group (DB1 to DB13). The correction circuit 135 uses one of the first and second digital codes $D_S$, $D_R$, corrects the other of the first and second digital codes $D_S$, $D_R$, and generates an A/D conversion digital code (for example, 14 bit). In the, A/D conversion digital code, the offset of the S/H circuit 117 is cancelled and the effect of charge injection is removed. As a result, an A/D conversion value of improved accuracy is obtained.

Second Embodiment

Figure 11:
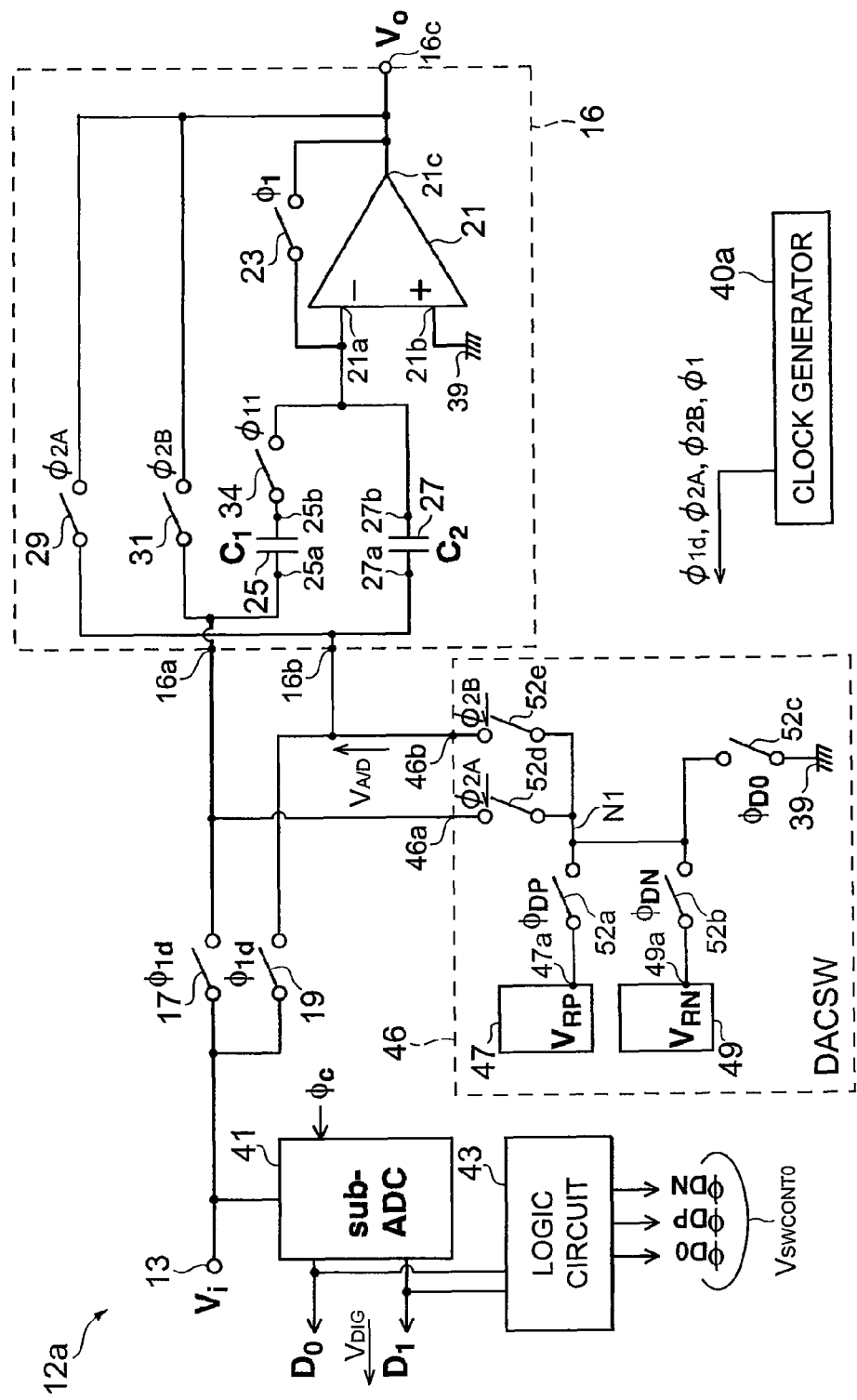
FIG. 11 is a circuit diagram illustrating a modification of the A/D conversion stage.

FIG. 11 is a circuit diagram illustrating another example of an A/D conversion stage. An A/D conversion stage 12a for the first to fourth A/D conversion stages is provided with an input 13, a gain stage 16, a first sampling switch 17, and a second sampling switch 19. A clock generator 40a provides clock signals described in FIG. 11 to FIG. 12. The A/D conversion stage 12a can be used for the analog-digital converter shown in FIG. 1 and, as will be clear from the subsequent explanation, can compensate the mismatch between the capacitors in the gain stage and also can compensate the offset of the S/H circuit and the effect of charge injection.

The gain stage 16 includes a first input 16a and a second input 16b. The first input 16a is provided for receiving either analog signal from among the input analog signal $V_i$ and conversion analog signal $V_{A/D}$. The second input 16b is provided for receiving either analog signal from among the input analog signal $V_i$ and conversion analog signal $V_{A/D}$. The gain stage 16 is provided with an operational amplification circuit 21, a feedback switch 23, a first capacitor 25, a second capacitor 27, a first switch 29, a second switch 31, and a third switch 34.

The second switch 31 is connected between the one terminal 25a of the first capacitor 25 and the output 21c of the operational amplification circuit 21 and provided for connecting the first capacitor 25 between the output 21c and inverting input 21a of the operational amplification circuit 21 in the second period $T_2$, which is different from the first period $T_1$. The output 16c of the gain stage 16 is connected to the output 21c of the operational amplification circuit 21. The third switch 34 is connected between the other terminal 25b of the first capacitor 25 and the inverting input 21a of the operational amplification circuit 21 and provided for disconnecting the other terminal 25b of the first capacitor 25 from the inverting input 21a in the third period $T_3$, which is between the first period $T_1$ and second period $T_2$. The feedback switch 23 connects the output 21c of the operational amplification circuit 21 to the inverting input 21a of the operational amplification circuit 21 in the first period $T_1$ and second period $T_2$. The first switch 29 is connected between the one terminal 27a of the second capacitor 27 and the output 21c of the operational amplification circuit 21 and provided for connecting the second capacitor 27 between the inverting input 21a and output 21c of the operational amplification circuit 21 in the fourth period $T_4$, which is different from the first period $T_1$, second period $T_2$, and third period $T_3$.

The D/A converter 46 provides the predetermined voltage corresponding to control signals $\phi_{DO}$, $\phi_{DP}$, $\phi_{DN}$ to the one terminal 27a of the second capacitor 27 in the second period $T_2$ and provides the predetermined voltage corresponding to control signals $\phi_{DO}$, $\phi_{DP}$, $\phi_{DN}$ to the one terminal 25a of the first capacitor 25 in the fourth period $T_4$. The D/A converter 46 has outputs 46a, 46b respectively connected to the inputs 16a, 16b of the gain stage 16. The first voltage source 47 provides the voltage $V_{RP}$. The second voltage source 49 provides the voltage $V_{RN}$. The output 47a of the first voltage source 47 is connected to a node $N_1$ via a switch 52a, and the output 49a of the second voltage source 49 is connected to the node $N_1$ via a switch 52b. Further, the node $N_1$ is connected to the reference potential line (for example, the ground line 39) via a switch 52c. The node $N_1$ is connected to the output 46a via a switch 52d and connected to the output 46b via a switch 52e.

The logic circuit 43 generates control signals $\phi_{DO}$, $\phi_{DP}$, $\phi_{DN}$ for controlling the first to third switches 52a to 52c, respectively. The values of digital signals $D_1$, $D_0$ determine which of the control signals $\phi_{DO}$, $\phi_{DP}$, $\phi_{DN}$ will be active. A three-value A/D conversion is performed with respect to these three regions and "−1", "0", "+1" digital codes are allocated. The initial code is a most significant digit (MSB).

In the preferred example, the capacity value $C_1$ of the first capacitor 25 is equal to the capacity value $C_2$ of the second capacitor 27. However, due of errors caused by a variety of factors, the capacity value $C_1$ of the first capacitor 25 is not equal to the capacity value $C_2$ of the second capacitor 27. In other words, there is a mismatch between the capacity value $C_1$ of the first capacitor 25 and the capacity value $C_2$ of the second capacitor 27. This mismatch has to be compensated to perform the analog-digital conversion with higher accuracy.

Figure 12:
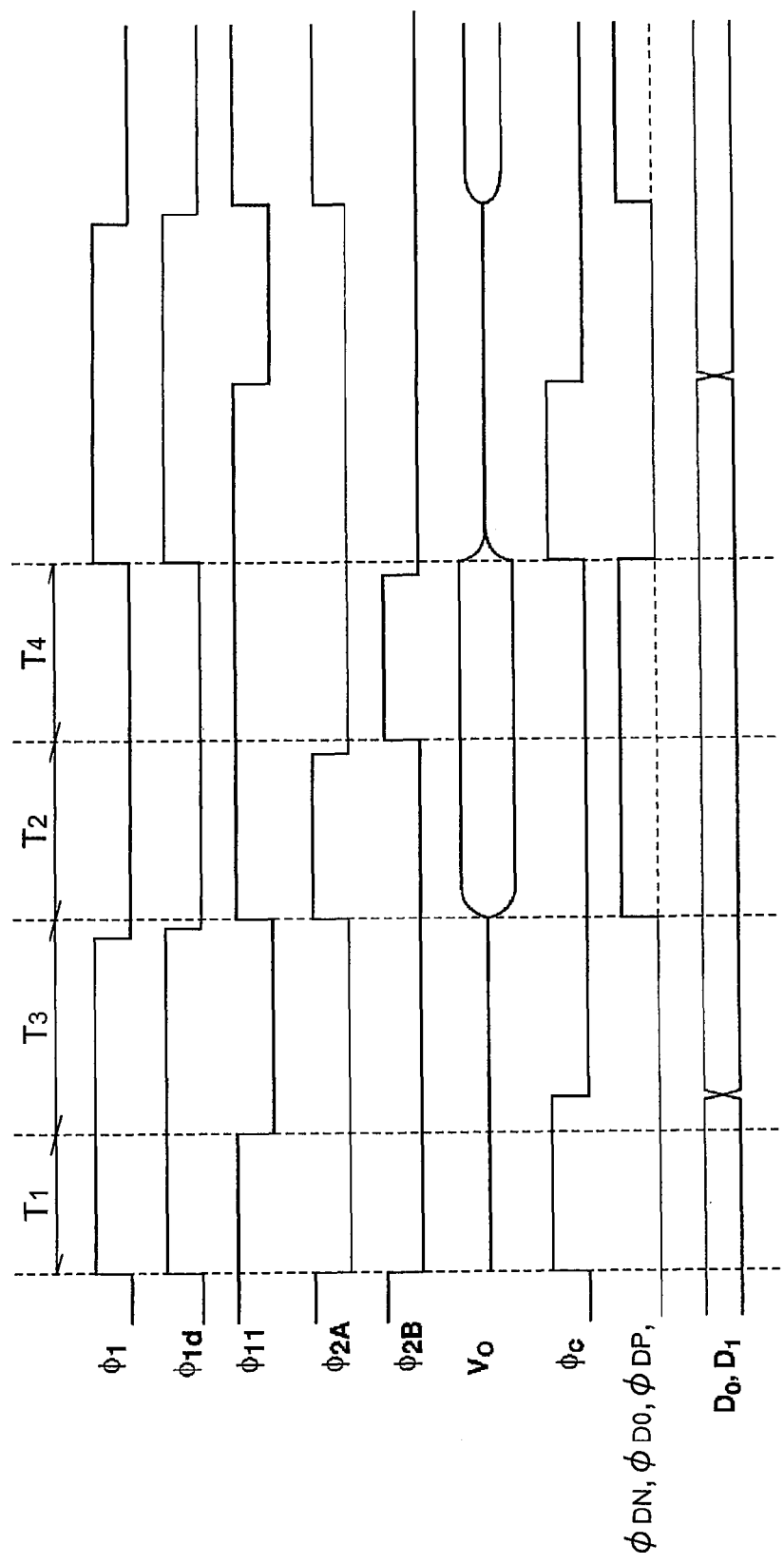
FIG. 12 illustrates a timing chart for the A/D conversion stage shown in FIG. 11

The operation of the A/D conversion stage and mismatch compensation will be explained below with reference to FIG. 12 and FIG. 13. The mismatch compensation is realized in the process of using the gain stage 11 and generating a digital signal corresponding to an analog signal.

Figure 13:
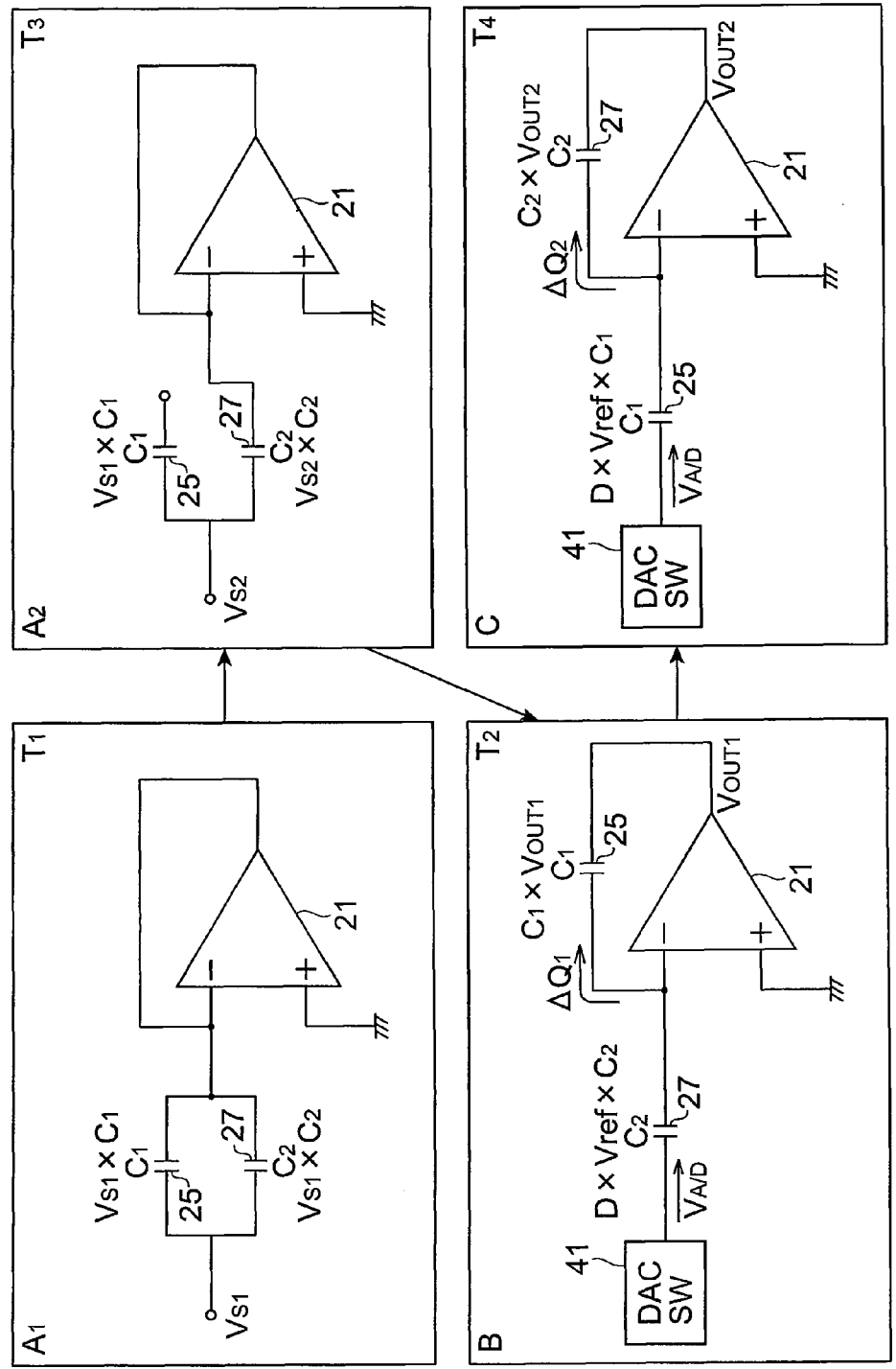
FIG. 13 explains the operation of the A/D conversion stage.

FIG. 13 illustrates the operation of an A/D conversion stage. The operation of an A/D conversion stage includes four steps.

First Sampling Operation A1 (Period $T_1$):

In the first sampling operation one terminal of the first and second capacitors 25, 27 is connected to the input 13 and the other terminal of the first and second capacitors 25, 27 is connected to the inverting input 21a of the operational amplification circuit 21 correspondingly to the clocks $\phi_{1d}$, $\phi_{1l}$, $\phi_{2A}$, $\phi_{2B}$. An electric charge corresponding to the first input analog signal $V_{S1}$ is accumulated in the first capacitor 25 and second capacitor 27.

Further, the sub A/D conversion circuit 41 generates the digital signal $V_{DIG}$ corresponding to the input analog signal. The digital signal $V_{DIG}$ has a digital value (for example, $D_1$, $D_0$) composed of a predetermined number of bits.

An electric charge corresponding to the input analog signal $V_{S1}$ is accumulated in each of the first capacitor 25 and second capacitor 27. An electric charge $Q_1 = C_1 \times V_{S1}$ is accumulated in the first capacitor 25, and an electric charge $Q_2 = C_2 \times V_{S1}$ is accumulated in the second capacitor 27. The output 21c of the operational amplification circuit 21 is connected to the inverting input 21a, and both the output 21c and the inverting input 21a have an electric potential value equal to that of the non-inverting input 21b.

Second Sampling Operation A2 (Period $T_3$):

In the second sampling operation, either of the first capacitor 25 and second capacitor 27 (in the present embodiment, the first capacitor 25) is disconnected from the inverting input 21a of the operational amplification circuit 21 in response to a clock $\phi_{1I}$. As a result, the electric charge of the first capacitor 25 is held and an electric charge corresponding to the second analog signal $V_{S2}$ is accumulated in the other of the first capacitor 25 and second capacitor 27.

An electric charge corresponding to the analog signal $V_{S2}$ is accumulated in the second capacitor 27. The electric charge $Q_1=C_1 \times V_{S1}$ is held in the first capacitor 25, and the electric charge $Q_2=C_2 \times V_{S2}$ is accumulated in the second capacitor 27. The output 21c of the operational amplification circuit 21 is connected to the inverting input 21a, and both the output 21c and the inverting input 21a have an electric potential value equal to that of the non-inverting input 21b.

First Conversion Operation B (Period $T_2$)

In the first conversion operation, the first capacitor 25 is connected between the output 21c and inverting input 21a of the operational amplification circuit 21 correspondingly to the clocks $\phi_{1d}$, $\phi_{1I}$, $\phi_{2A}$, $\phi_{2B}$, and the conversion analog signal $V_{A/D}$ corresponding to a digital signal indicating the A/D conversion result in the A/D conversion stage is supplied to the other terminal 27b of the second capacitor 27. As a result, the first conversion value $V_{OUT1}$ (corresponds to the first input analog signal for the next A/D conversion stage is generated at the output 21c of the operational amplification circuit 21 and the electric charges of the first and second capacitors 25, 27 are rearranged.

Due to the application of the conversion analog signal $V_{A/D}$, the electric charge $\Delta Q_1=C_2 \times V_{S2} - C_2 \times D \times Vref$ is transferred from the second capacitor 27 to the first capacitor 25 (D takes a value of "+1", "0", "−1" correspondingly to the value of the conversion analog signal $V_{A/D}$). The sampling electric charge $C_1 \times V_{S1}$ and the transferred electric charge $\Delta Q_1$ are accumulated in the first capacitor 25. Because the non-inverting input 21b of the operational amplification circuit 21 is connected to the ground line, an electric charge $V_{OUT1} \times C_1$ is accumulated in the first capacitor 25. This electric charge $V_{OUT1} \times C_1$ is equal to $C_1 \times V_{S1} + C_2 \times V_{S2} - C_2 \times D \times Vref$ due to the charge conservation law. Therefore, $$C_1 \times V_{OUT1} = (C_1 \times V_{S1} + C_2 \times V_{S2} - C_2 \times D \times Vref)$$

$$V_{OUT1} = (C_1 \times V_{S1} + C_2 \times V_{S2} - C_2 \times D \times Vref)/C_1$$
$$= (1 + C_2/C_1) \times V_i - D \times Vref \times C_2/C_1 +$$
$$(1 - C_2/C_1) \times \Delta V.$$

Assuming that $V_{S1}=V_i+\Delta V$ and $V_{S2}=V_i-\Delta V$, we obtain $V_1=(V_{S1}+V_{S2})/2$. Assuming that $\Delta C=C_2-C_1$, we obtain:

$$V_{OUT1}=(2+\Delta C/C_1) \times V_i-(1+\Delta C/C_1) \times D \times Vref \times \Delta C/C_1 \times \Delta V.$$

However, because $\Delta C/C_1$ and $\Delta V$ caused by the capacitor mismatch are small, the third term can be ignored. As a result we obtain:

$$V_{OUT1}=(2+\Delta C/C_1) \times V_i-(1+\Delta C/C_1) \times D \times Vref. \quad \text{Equation (1)}$$

Second Conversion Operation C (Period $T_4$)

In the second conversion operation, the second capacitor 27 is connected between the output 21c and inverting input 21a of the operational amplification circuit 21 correspondingly to the clocks $\phi_{1d}$, $\phi_{1I}$, $\phi_{2A}$, $\phi_{2B}$, and the conversion analog signal $V_{A/D}$ corresponding to a digital signal indicating the A/D conversion result in the A/D conversion stage is supplied to the other terminal 25b of the first capacitor 25. As a result, the second conversion value $V_{OUT2}$ (corresponds to the second input analog signal for the next A/D conversion stage) is generated at the output 21c of the operational amplification circuit 21 and the electric charges of the first and second capacitors 25, 27 are rearranged.

Due to the application of the conversion analog signal $V_{A/D}$, the electric charge $\Delta Q_2=C_1 \times V_{OUT1}-C_1 \times D \times Vref$ is transferred from the first capacitor 25 to the second capacitor 27 (D takes a value of "+1", "0", "−1" correspondingly to the value of the conversion analog signal V $A/D$). The rearranged electric charge $C_2 \times V_{OUT1}$ and the transferred electric charge $\Delta Q_2$ are accumulated in the second capacitor 27. Because the non-inverting input 21b of the operational amplification circuit 21 is connected to the ground line, an electric charge $V_{REF} \times D \times C_1$ is accumulated in the first capacitor 25 and an electric charge $V_{OUT2} \times C_2$ is accumulated in the second capacitor 27. This electric charge $V_{OUT2} \times C_2$ is equal to $C_2 \times D \times Vref + C_1 \times V_{OUT1} - C_1 \times D \times Vref$ due to the charge conservation law. Therefore, $$V_{OUT2} \times C_2 = C_2 \times D \times Vref + C_1 \times V_{OUT1} - C_1 \times D \times Vref$$
$$= C_1 \times V_{S1} + C_2 \times V_{S2} - C_1 \times D \times Vref.$$

$$V_{OUT2} = (C_1 \times V_{S1} + C_2 \times V_{S2} - C_1 \times D \times Vref)/C_2$$
$$= (1 + C_1/C_2) \times V_i - D \times Vref \times C_1/C_2 + (1 - C_1/C_2) \times \Delta V.$$

Here, $V_{S1}=V_i+\Delta V$ and $V_{S2}=V_i-\Delta V$. Assuming that $\Delta C=C_1-C_2$, we obtain:

$$V_{OUT2}=(1+C_1/(C_1+\Delta C)) \times V_i-(1-C_1/(C_1+\Delta C)) \times D \times Vref \times \Delta V \times \Delta C/(C_1+\Delta C).$$

Because $\Delta C/C_1$ and $\Delta V$ caused by the capacitor mismatch are small, if the second and subsequent terms are ignored, the following approximation can be made $$V_{OUT2}=(2-\Delta C/C_1) \times V_i-(1-\Delta C/C_1) \times D \times Vref. \quad \text{Equation (2)}$$

The above-described computations are performed in the same manner in the preceding gain stage. Therefore, in the preceding stage, the following processing is performed:

$$V^{(-1)}_{OUT1}=(2+\Delta C/C_1) \times V^{(-1)}_i-(1+\Delta C/C_1) \times D \times Vref.$$

$$V^{(-1)}_{OUT2}=(2-\Delta C/C_1) \times V^{(-1)}_i-(1-\Delta C/C_1) \times D \times Vref.$$

Here, $V^{(-1)}_{OUT1}$, $V^{(-1)}_{OUT2}$ are output values corresponding to $V_{OUT1}$, $V_{OUT2}$ of the preceding gain stage, and $V^{(-1)}_i$ is the input corresponding to $V_i$ of the preceding stage. Further $$V^{(-1)}_{OUT1}=V_{S1}, V^{(-1)}_{OUT2}=V_{S2}.$$

Therefore, the input $V_i$ becomes $$V_i = (V_{S1} + V_{S2})/2$$
$$= (V^{(-1)}_{OUT1} + V^{(-1)}_{OUT2})/2$$
$$= 2 \times V^{(-1)}_i - D \times Vref.$$

It is clear that the mismatch in the preceding gain stage corresponds to the canceled input. Where such an operation is performed with respect to all the gain stages, the capacitor mismatch in all the stages is canceled.

Figure 14:
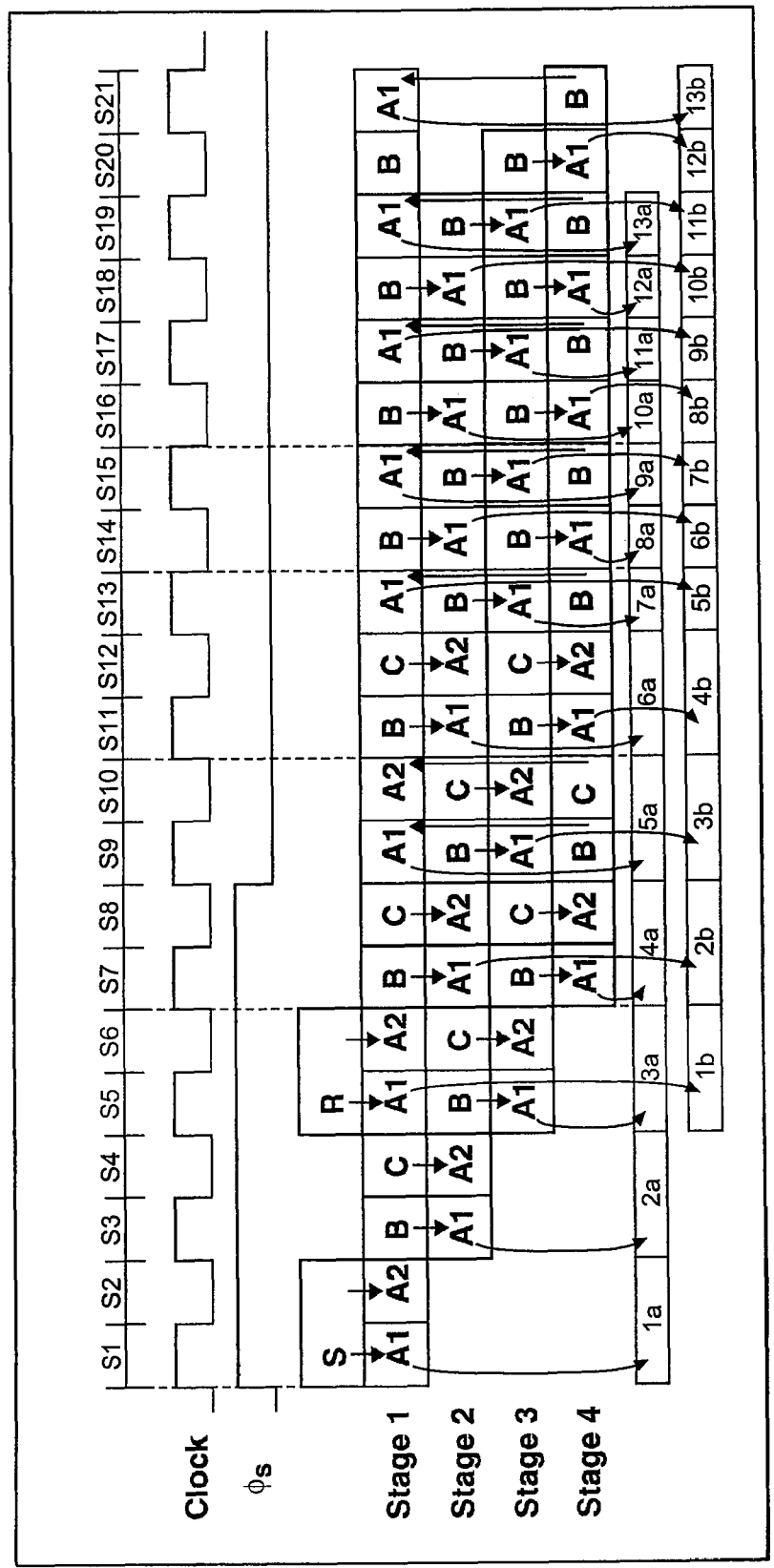
FIG. 14 illustrates a procedure of generating an A/D conversion digital code by using the analog-digital converter.

These steps A1, A2, B, C are used in the analog-digital converter shown in FIG. 14. FIG. 14 illustrates a procedure of generating an A/D conversion digital code by using the analog-digital converter 11. This procedure will be successively explained hereinbelow starting from the sampling of an analog signal. Steps S1 to S21 are shown in FIG. 14.

Step S1:

A first sample analog signal VS1 is received by a first A/D conversion stage Stage1 and the first sampling operation A1 is performed with respect to the first sample analog signal VS1. In the preferred embodiment, the first A/D conversion stage Stage1 generates a digital signal 1a corresponding to first sample analog signal VS1.

Step S2:

The first sample analog signal $V_{S1}$ is received by the first A/D conversion stage Stage1 and the second sampling operation A2 is performed with respect to the first sample analog signal $V_{S1}$.

Step S3:

The first conversion operation B is performed with respect to the analog signal sampled in the first A/D conversion stage Stage1, a first conversion D1 is generated, and the first sampling operation A1 is performed in the second A/D conversion stage Stage2 with respect to the analog signal A1 corresponding to the first conversion result D1. In the preferred example, the second A/D conversion stage Stage2 generates a digital signal 2a corresponding to the analog signal $A_{S1}$.

Step S4

The second conversion operation C is performed after the first conversion operation B in the first A/D conversion stage Stage1, a second conversion result D2 is generated, and the second sampling operation A2 is performed in the second A/D conversion stage Stage2 with respect to an analog signal corresponding to the second conversion result D2.

Step S5

The second sample analog signal $V_{S2}$ is received by the first A/D conversion stage Stage1 the first sampling operation A1 is performed with respect to the second sample analog signal $V_{S2}$, the first conversion operation B is performed with respect to the analog signal sampled in the second A/D conversion stage Stage2, a third conversion result D3 is generated, and the first sampling operation A1 is performed in the third A/D conversion stage Stage3 with respect to the analog signal corresponding to the third conversion result D3. The first A/D conversion stage Stage1 generates a digital signal 1b corresponding to the second sample analog signal VS2. In the preferred example, the third A/D conversion stage Stage3 generates a digital signal 3a.

Step 6:

The second sampling operation A2 is performed with respect to the second sample analog signal $V_{S2}$ in the first A/D conversion stage Stage6, the second conversion operation C is performed after the first conversion operation B in the second A/D conversion stage Stage2, a fourth conversion result D4 is generated, and the second sampling operation A2 is performed in the third A/D conversion stage Stage3 with respect to the analog signal corresponding to the fourth conversion result D4.

Step 7:

The first conversion operation B is performed with respect to the analog signal sampled in the first A/D conversion stage Stage1, a fifth conversion result D5 is generated, a first sampling operation A1 is performed in the second A/D conversion stage Stage2 with respect to the analog signal corresponding to the fifth conversion result D5, the first conversion processing B is performed with respect to the analog signal sampled in the third A/D conversion stage Stage3, a sixth conversion result D6 is generated, and the first sampling operation A1 is performed in the fourth A/D conversion stage Stage4 with respect to the analog signal corresponding to the sixth conversion result D6. In the preferred example, the second A/D conversion stage Stage2 generates a digital signal 4b, and the fourth A/D conversion stage Stage4 generates the digital signal 4a.

Step S8:

The second conversion operation C is performed after the first conversion operation B in the first A/D conversion stage Stage1, a seventh conversion result D7 is generated, the second sampling operation A2 is performed in the second A/D conversion stage Stage2 with respect to the analog signal corresponding to the seventh conversion result D7, the second conversion operation C is performed after the first conversion operation B in the third A/D conversion stage Stage3, an eighth conversion result D8 is generated, and the second sampling operation A2 is performed in the fourth A/D conversion stage Stage4 with respect to the analog signal corresponding to the fourth conversion result D8.

Step 9:

The first conversion operation B is performed with respect to the analog signal sampled in the second A/D conversion stage Stage2, a ninth conversion result D9 is generated, the first sampling operation A1 is performed in the third A/D conversion stage Stage3 with respect to the analog signal corresponding to the ninth conversion result D9, the first conversion operation B is performed in the fourth A/D conversion stage Stage4, a tenth conversion result D10 is generated, and the first sampling operation A1 is performed in the first A/D conversion stage Stage1 with respect to the analog signal corresponding to the tenth conversion result D10. In the preferred example, a digital signal 5a is generated in the first A/D conversion stage Stage1, and the digital signal 3b is generated in the third A/D conversion stage Stage3.

Step S10:

The second conversion operation C is performed after the first conversion operation B in the second A/D conversion stage Stage2, an eleventh conversion result D11 is generated, the second sampling operation A2 is performed in the third A/D conversion stage Stage3 with respect to the analog signal corresponding to the eleventh conversion result D11, the second conversion operation C is performed after the first conversion operation in the fourth A/D conversion stage Stage4, a twelfth conversion result D12 is generated, and the second sampling operation A2 is performed in the first A/D conversion stage Stage1 with respect to the analog signal corresponding to the twelfth conversion result D12.

If necessary, step S7 to step S10 are thereafter successively repeated. In response to the repetition of these steps, a digital signal is provided from the A/D conversion stage. This procedure describes steps for one input analog signal in the fully differential circuit. Therefore, it is understood that the three steps are applicable not only to a single-end circuit, but also to a fully differential circuit.

As shown in FIG. 13, the procedure includes four operations represented by using single-end circuits. The operation A1 is an operation of sampling an input signal in the capacitor 25 (C1), and the operation A2 is an operation of sampling an input signal in the capacitor 27 (C2). The operation B is an operation of connecting the capacitor 27 to the DACSW, connecting the capacitor 25 as a feedback capacitance to the operational amplification circuit, and amplifying the signals. The operation C is an operation of connecting the capacitor 25 to the DACSW, connecting the capacitor 27 as a feedback capacitance to the operational amplification circuit, and amplifying the signals. In the operation A1, the result of the operation B of the previous stage is sampled. In the operation A2, the result of the operation C of the previous stage is sampled; by such sampling, the average value of the result of the B operation of the previous stage and the result of the operation C of the previous stage are sampled.

In the A/D conversion of the most significant bit (MSB), the same analog values are sampled in the sampling operations A1, A2 of the first A/D conversion stage. Therefore, in the above-described formulas, $\Delta V=0$. Thus, $$V_{OUT1}^{(1)} = (2 + \Delta C/C_1) \times V_i - (1 + \Delta C/C_1) \times D \times Vref$$
$$= (2 \times V_i - D \times Vref) + (1 - D \times Vref) \times \Delta C/C_1.$$

Assuming that $\Delta C/C_1$ is sufficiently smaller than 1, we obtain:

$$V_{OUT2}^{(1)} = (2 - \Delta C/C_1) \times V_i - (1 - \Delta C/C_1) \times D \times Vref$$
$$= (2 \times V_i - D \times Vref) - (1 - D \times Vref) \times \Delta C/C_1.$$

These equations can be approximately written as $$V^{(1)}{}_{OUT1} = V^{(1)}{}_i - \Delta V^{(1)}.$$
$$V^{(1)}{}_{OUT2} = V^{(1)}{}_i + \Delta V^{(1)}.$$

Here, $V^{(1)}{}_i = 2 \times V_i - D \times Vref$, $\Delta V^{(1)} = (V_i - D \times Vref) \times \Delta C/C_1$. With the first conversion operation B, $V^{(1)}{}_{OUT1}$ is generated in the period $T_2$. With the second conversion operation C, $V^{(1)}{}_{OUT2}$ is generated in the period $T_3$.

These conversion results are provided to the second A/D conversion stage in steps 3, 4. Where a conversion operation is performed in steps 4, 5 for A/D converting the next most significant bit (MSB−1), the mismatch between the two capacitors contained in the gain stage will be compensated by the four operations A1, A2, B, D as shown by Equation (1) and Equation (2), as has already been explained hereinabove. Where such an operation is performed in all the gain stages, the mismatch in the previous gain stage can be canceled.

In the cyclic A/D conversion, the operation of doubling the input signal is repeated, while determining the values from the most significant digit. Therefore, the effect of error in computations performed to find less significant digits is decreased. It is preferred that a processing of correcting the capacitor mismatch be performed in the A/D conversion performed to determine the high order. For example, as shown in step 13 and subsequent steps in FIG. 14, in the processing of lower order in the second half of the A/D conversion, only the operations A1 and B are performed and the A/D conversion of predetermined bits can be performed with a high speed. For example, when all the operations A1, A2, B, C are performed for A/D converting 14 bits, a timing of 15 clocks is necessary. However, as shown in FIG. 14, where only the operations A1 and B are performed for the A/D conversion of low-order bits, the A/D conversion of 14 bits can be performed within a timing of 10.5 clocks.

In the present embodiment, an A/D conversion digital code can be also generated using the digital operational circuit such as shown in FIG. 10.

Third Embodiment

Figure 15:
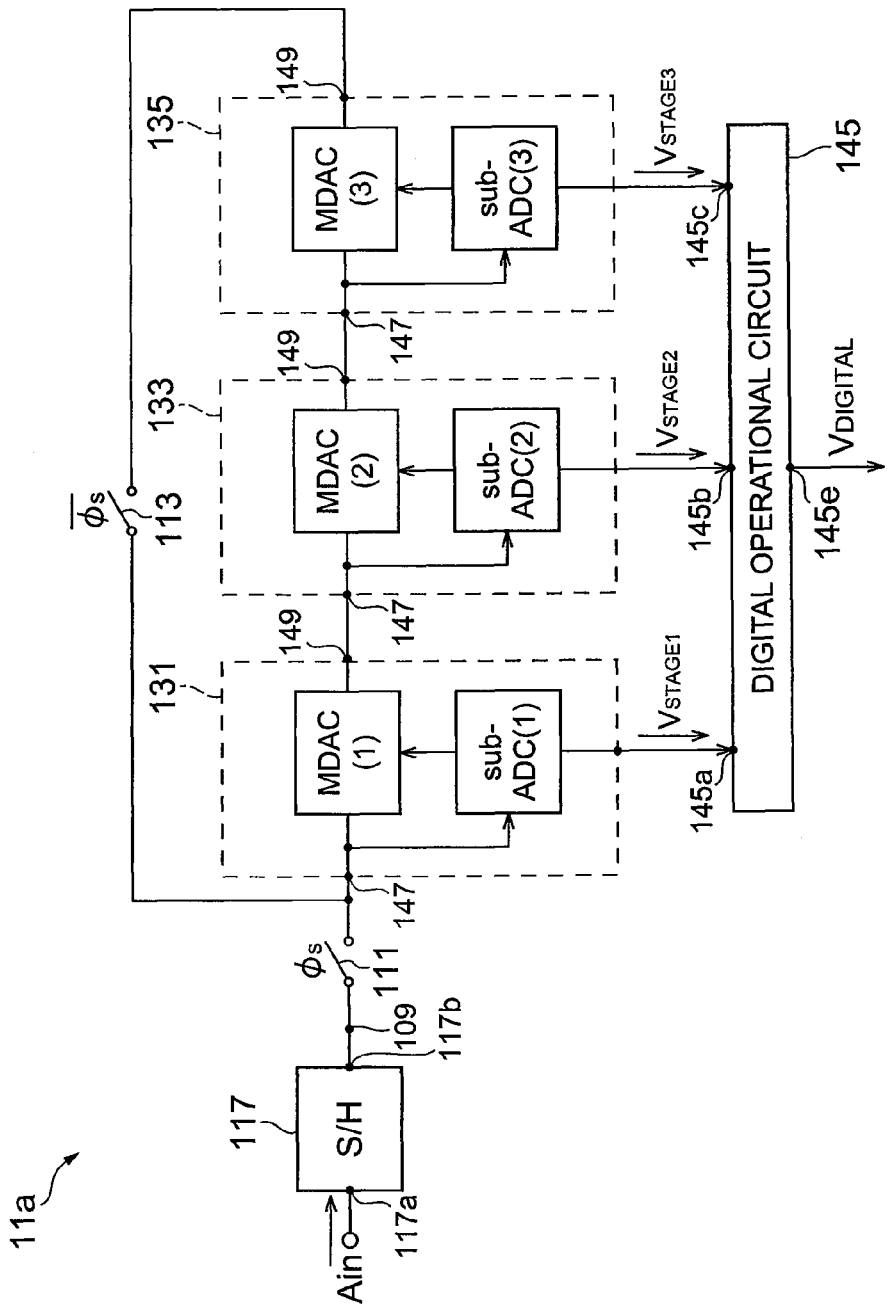
FIG. 15 is a block diagram of the analog-digital converter of the present embodiment.

FIG. 15 is a block diagram illustrating an analog-digital converter of the present embodiment. An analog-digital converter 11a is provided with a first A/D conversion stage 131, a second A/D conversion stage 133, a third A/D conversion stage 135, an analog input 109, an input switch 111, a cyclic switch 113, and a digital operational circuit 145. The first to third A/D conversion stages 131, 133, 135 are connected in series and each has a stage input 137 and a stage output 139. The analog input 109 receives an analog signal. The input switch 111 is connected between the stage input 147 and analog input 109 of the first A/D conversion stage 131 and samples a first sample analog signal VS1 and a second sample analog signal VS2 in first and second sampling periods TS1, TS2, respectively.

The cyclic switch 113 is connected between the stage input 147 of the first A/D conversion stage 131 and the stage output 149 of the third A/D conversion stage 135 and provides a path from the third A/D conversion stage 135 to the first A/D conversion stage 131 in the cyclic period $T_{FB}$, which is different from the first and second sampling periods $T_{S1}$, $T_{S2}$. The digital operational circuit 145 generates an A/D conversion digital code $V_{DIGITAL}$ indicating the analog/digital conversion results corresponding to $V_{STAGE1}$, $V_{STAGE2}$, $V_{STAGE3}$ of the conversion results from the first to third A/D conversion stages 131, 133, 135, respectively. The digital operational circuit 115 also has inputs 145a, 145b, 145c connected to the first to third A/D conversion stages 131, 133, 135, respectively, and an output 145e that provides the A/D conversion digital code $V_{DIGITAL}$. In the first and second sampling periods $T_{S1}$, $T_{S2}$, the input switch 111 is closed in response to a clock $\phi_S$ and the cyclic switch 113 is opened. In the cyclic period $T_{FB}$, the input switch 111 is opened in response to the clock $\phi_S$ and the cyclic switch 113 is closed. A sample/hold circuit 117 that holds the received analog input $A_{in}$ is also provided in the analog-digital converter 11a.

As follows from the explanation hereinbelow, with such analog-digital converter 11a, because the first to third A/D conversion stages 131, 133, 135 connected in series via the cyclic switch 113 are connected in a loop, the A/D conversion can be performed in parallel with respect to two sampling values. A clock generator 40 provides the clock signals shown in FIG. 16 and FIG. 17.

Figure 16:
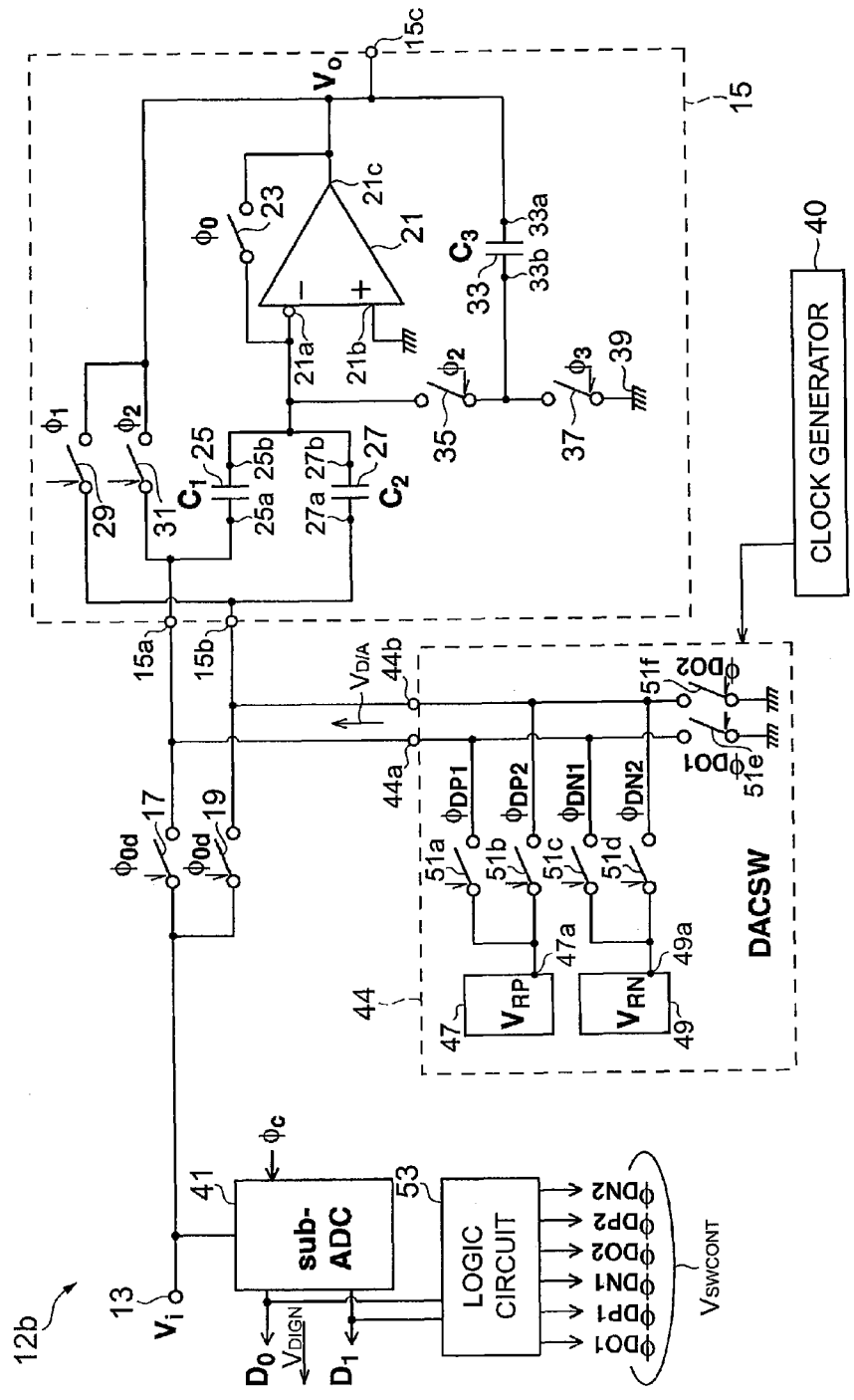
FIG. 16 is a circuit diagram illustrating an A/D conversion stage of the analog-digital converter.
Figure 17:
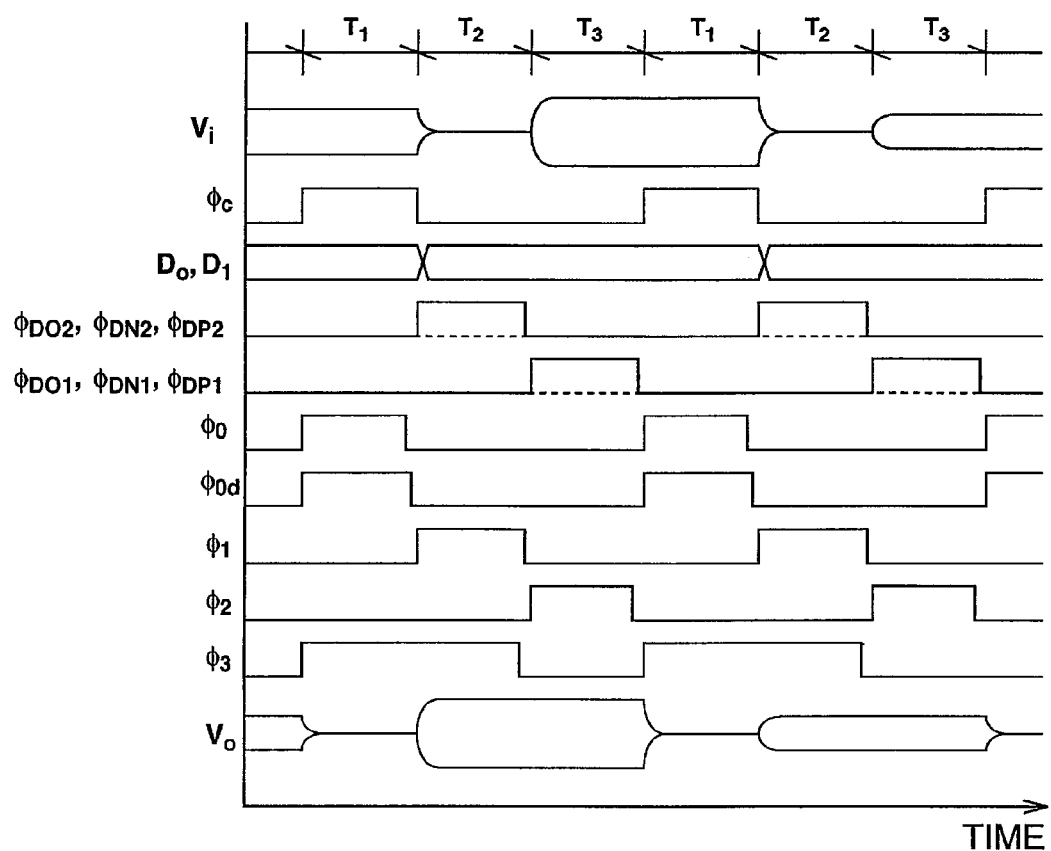
FIG. 17 is a timing chart for the A/D conversion stage shown in FIG. 16.

FIG. 16 is a circuit diagram illustrating the A/D conversion stage of the analog-digital converter. FIG. 17 shows a timing chart for the A/D conversion stage shown in FIG. 16. An A/D conversion stage 12b for the first to third A/D conversion stages is provided with an input 13, a gain stage 15, a first sampling switch 17, and a second sampling switch 19. The clock generator 40 provides clock signals shown in FIG. 16 and FIG. 17.

The gain stage 15 includes a first input 15a and a second input 15b. The first input 15a is provided for receiving either of the two analog signals: an input analog signal $V_i$ and a conversion analog signal $V_{A/D}$. The second input 15b is provided for receiving either of the two analog signals: an input analog signal $V_i$ and a conversion analog signal $V_{A/D}$. The first sampling switch 17 is connected between the first input 15a and the input 13 and provided to perform the sampling of the input analog signal $V_i$ in the first period $T_1$. The second sampling switch 19 is connected between the second input 15b and the input 13 and provided to perform the sampling of the input analog signal $V_i$ in the first period $T_1$. The gain stage 15 includes an operational amplification circuit 21, a feedback switch 23, a first capacitor 25, a second capacitor 27, a first switch 29, a second switch 31, a third capacitor 33, a third switch 35, and a fourth switch 37. The operational amplification circuit 21 includes an inverting input 21a, a non-inverting input 21b, and an output 21c. The feedback switch 23 is connected between the inverting input 21a of the operational amplification circuit 21 and the output 21c of the operational amplification circuit 21 and connects the output 21c of the operational amplification circuit 21 to the inverting input 21a of the operational amplification circuit 21 in the first period $T_1$. The first capacitor 25 has one terminal 25a connected to the first input 15a and the other terminal 25b connected to the inverting input 21a. The second capacitor 27 has one terminal 27a connected to the second input 15b and the other terminal 27b connected to the inverting input 21a. The first switch 29 is connected between the one terminal 27a of the second capacitor 27 and the output 21c of the operational amplification circuit 21 and provided for connecting the second capacitor 27 between the inverting input 21a and output 21c of the operational amplification circuit 21 in a second period $T_2$, which is different from the first period $T_1$. The second switch 31 is connected between the one terminal 25a of the first capacitor 25 and the output 21c of the operational amplification circuit 21 and provided for connecting the first capacitor 25 to the output 21c and inverting input 21a of the operational amplification circuit 21 in a third period $T_3$, which is different from the first period $T_1$ and second period $T_2$. The third capacitor 33 has one terminal 33a and another terminal 33b connected to the output 21c of the operational amplification circuit 21. The third switch 35 is connected between the other terminal and the inverting input 21a of the third capacitor 33, and is provided for connecting the third capacitor 33 between the output 21c and inverting input 21a of the operational amplification circuit 21 in the third period. The fourth switch 37 is connected between the other terminal 33b of the third capacitor 33 and a reference potential line 39 such as a ground line and serves to provide a reference potential to the other terminal 33b of the third capacitor 33 in the first period $T_1$ and second period $T_2$. The output 15c of the gain stage 15 is connected to the output 21c of the operational amplification circuit 21.

With such an A/D conversion stage 12b, an electric charge corresponding to the input analog signal $V_i$ can be accumulated with the first period $T_1$ in the first and second capacitors 25, 27. By connecting the second capacitor 27 between the inverting input 21a and output 21c of the operational amplification circuit 21 and connecting the first capacitor 25 between the first input 15a and inverting input 21c of the operational amplification circuit 21, it is possible to generate the first conversion value in the second period $T_2$ at the output 21c of the operational amplification circuit 21. Further, in the second period $T_2$, an electric charge corresponding to this first conversion value can be accumulated in the third capacitor 33. In addition, by connecting the first and third capacitors 25, 33 between the inverting input 21a and output 21c of the operational amplification circuit 21 and connecting the second capacitor 27 between the second input 15b and the output 21c of the operational amplification circuit 21, it is possible to generate the second conversion value in the third period $T_3$ at the output 21c of the operational amplification circuit 21. Because the electric charge accumulated in the third capacitor 33 is also taken into account when the second conversion value is generated, the mismatch between the first to third capacitors 25, 27, 33 is compensated. Therefore, using the three periods $T_1$, $T_2$, $T_3$, it is possible compensate the mismatch between the first to third capacitors 25, 27, 33 and convert an analog signal into a digital signal.

As shown in FIG. 16, the A/D conversion stage 12b can be provided with a sub A/D conversion circuit 41, a logic circuit 53, and a D/A conversion circuit 44. The sub A/D conversion circuit 41 is connected to the input 13 and generates a digital signal $V_{DIGN}$ in response to the input analog signal $V_i$. The digital signal $V_{DIGN}$ preferably takes a predetermined number of values, for example two values ("0", "1") or three values ("−1", "0", "+1"). The logic circuit 53 is connected to the sub A/D conversion circuit 41 and generates a control signal $V_{SWCONT}$ in response to the digital signal $V_{DIGN}$. The D/A conversion circuit 44 is connected to the logic circuit 53 and has outputs 44a, 44b for providing a conversion analog signal $V_{A/D}$. The conversion analog signal $V_{A/D}$ is generated in response to the control signal $V_{SWCONT}$. The control signal $V_{SWCONT}$ is used to provide the conversion analog signal $V_{A/D}$ to the gain stage 15 in the second period $T_2$ and third period $T_3$.

The sub A/D conversion circuit 41 is preferably activated, for example, in the first period $T_1$, as shown in FIG. 17. Further, the sub A/D conversion circuit 41 may be also activated in the third period $T_3$ instead of the first period $T_1$ or in addition to the first period $T_1$.

An output 47a of the first voltage source 47 is connected to the first input 15a via a first switch 51a and the first output 44a and connected to the second input 15b via a second switch 51b and second output 44b. An output 49a of the second voltage source 49 is connected to the first input 15a via a third switch 51c and the first output 45a and connected to the second input 15b via a fourth switch 51d and second output 44b. The first output 44a is connected to one terminal of a fifth switch 51e, and the other terminal of the fifth switch 51e is connected to the ground line. The second output 44b is connected to one terminal of a sixth switch 51f, and the other terminal of the sixth switch 51f is connected to the ground line. As shown in FIG. 1, the logic circuit 53 generates control signals $\phi_{DO1}$, $\phi_{DP1}$, $\phi_{DN1}$, $\phi_{DO2}$, $\phi_{DP2}$, $\phi_{DN2}$ for controlling the first to sixth switches 51a to 51f. As shown in FIG. 17, the control signals $\phi_{DO2}$, $\phi_{DP2}$, $\phi_{DN2}$ are provided in the second period $T_2$. The values of digital signals $D_1$, $D_0$ are determined by which of the control signals $\phi_{DO2}$, $\phi_{DP2}$, $\phi_{DN2}$ becomes active. Further, the control signals $\phi_{DO1}$, $\phi_{DP1}$, $\phi_{DN1}$ are provided in the third period $T_3$. The values of digital signals $D_1$, $D_0$ are determined by which of the control signals $\phi_{DO1}$, $\phi_{DP1}$, $\phi_{DN1}$ become active.

The D/A conversion circuit 44 operates in response to control signals from the logic circuit 53, similarly to the D/A conversion circuits 45, 46. A three-value A/D conversion is performed with respect to three regions and "−1", "0", "+1" digital codes are allocated. The initial code is the most significant digit. The following computation is performed following the characteristic shown in FIG. 3.

$$V_{OUT}=2\times V_{in}-D\times V\text{ref}.$$

Thus, in this computation the A/D conversion is performed successively from the most significant digit, the input of the gain stage is doubled, and the output of the gain stage is always confined within a range of from −Vref to +Vref by performing any operation from among:
 (1) subtracting a constant value Vref;
 (2) adding a constant value Vref;
 (3) applying zero, depending on the A/D conversion value of the gain stage.

In the preferred example, the capacity value $C_1$ of the first capacitor 25 is equal to the capacity value $C_2$ of the second capacitor 27. However, due of errors caused by a variety of factors, the capacity value $C_1$ of the first capacitor 25 is not equal to the capacity value $C_2$ of the second capacitor 27. In other words, there is a mismatch between the capacity value $C_1$ of the first capacitor 25 and the capacity value $C_2$ of the second capacitor 27. This mismatch has to be compensated to perform the analog-digital conversion with higher accuracy.

The operation of the conversion circuit and mismatch compensation will be explained below with reference to FIG. 17 and FIG. 18. The mismatch compensation is realized in the process of using the gain stage 11 and generating a digital signal corresponding to an analog signal.

Figure 18:
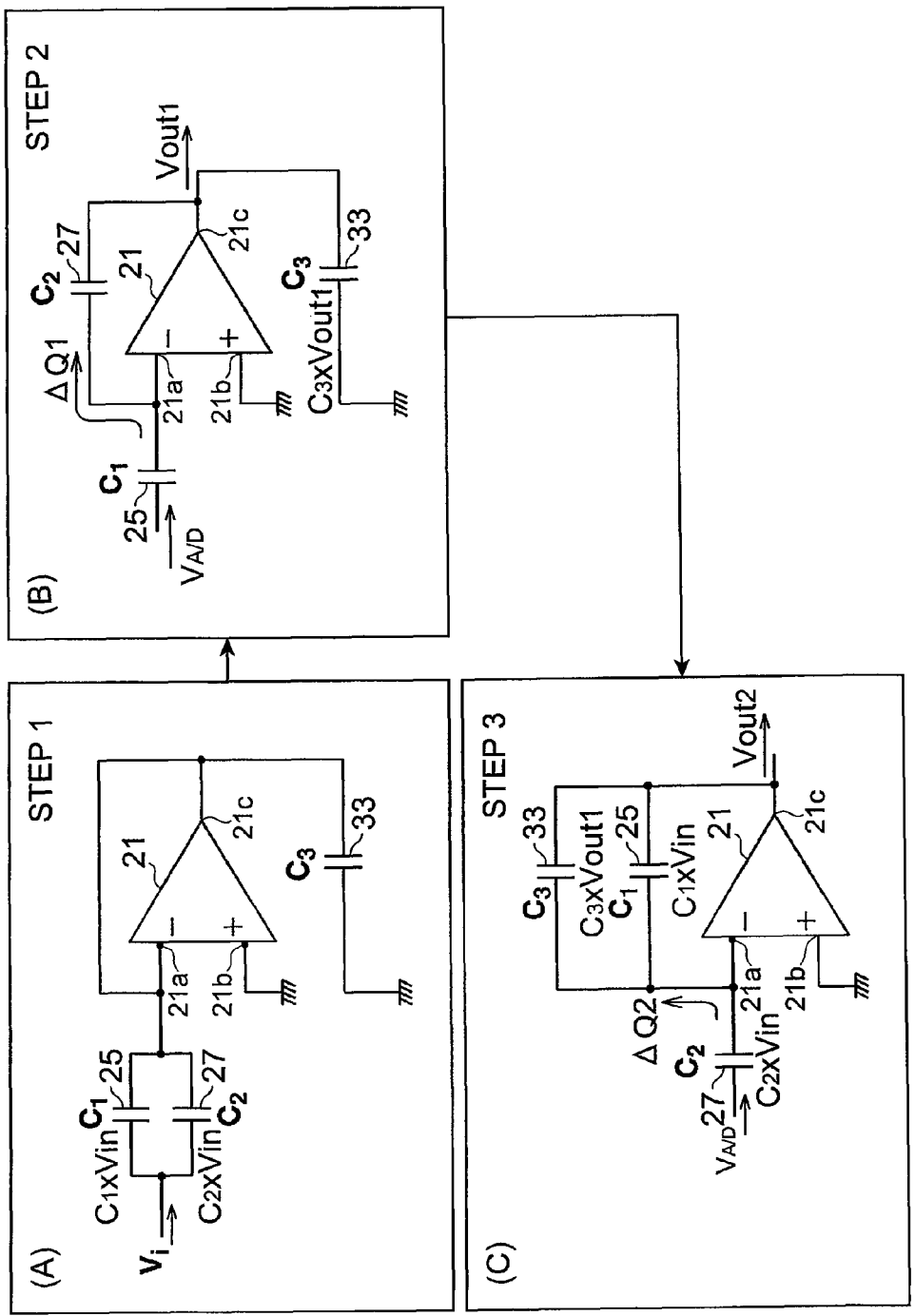
FIG. 18 explains the operation of the A/D conversion stage.

Sampling Operation A:

As shown in section (A) of FIG. 18, the first capacitor 25 and second capacitor 27 are connected to the input 13 in response to clocks $\phi_1$, $\phi_2$, $\phi_{0d}$. The inverting input 21a of the operational amplification circuit 21 is connected to the output 21c in response to clock $\phi_0$. The third capacitor 33 is connected between the output 21c of the operational amplification circuit 21 and the ground line in response to clocks $\phi_2$, $\phi_3$. The digital signal $V_{DIGN}$ corresponding to the analog signal $V_i$ is generated. The digital signal $V_{DIGN}$ has digital values (for example, $D_1$, $D_0$) composed of a predetermined number of bits. Furthermore, an electric charge corresponding to the input analog signal $V_i$ is accumulated in each of the first capacitor 25 and second capacitor 27. An electric charge $Q_1=C_1\times V_i$ is accumulated in the first capacitor 25, and an electric charge $Q_2=C_2\times V_i$ is accumulated in the second capacitor 27. The output 21c of the operational amplification circuit 21 is connected to the inverting input 21a, and both the output 21c and the inverting input 21a have an electric potential value equal to that of the non-inverting input 21b.

First Conversion Operation B:

The first capacitor 25 and second capacitor 27 are disconnected from the input 13 in response to the clock $\phi_{0d}$. The other terminal of the first capacitor 25 is connected to the output 21c of the conversion amplifier 21 in response to the clock $\phi_1$. The third capacitor 33 is connected between the output 21c of the operational amplification circuit 21 and the ground line in response to the clocks $\phi_2$, $\phi_3$. The inverting input 21a of the operational amplification circuit 21 is disconnected from the output 21c in response to the clock $\phi_0$. As shown in section (B) of FIG. 18, the second capacitor 27 is connected between the output 21c and inverting input 21a of the operational amplification circuit 21, and the conversion analog signal $V_{A/D}$ corresponding to the digital signal $V_{DIGN}$ is supplied to the other terminal 25b of the first capacitor 25. As a result, the first conversion value $V_{OUT1}$ relating to the input analog signal $V_i$ is generated at the output 21c of the operational amplification circuit 21 and electric charges of the first and second capacitors 25, 27 are rearranged.

Due to the application of the conversion analog signal $V_{A/D}$, the electric charge $\Delta Q_1 = C_1 \times V_i - C_1 \times D \times \text{Vref}$ is transferred from the first capacitor 25 to the second capacitor 27 (D takes a value of "+1", "0", "−1" correspondingly to the value of the conversion analog signal $V_{A/D}$). The sampling electric charge $C_2 \times V_i$ and the transferred electric charge $\Delta Q_1$ are accumulated in the second capacitor 27. Because the non-inverting input 21b of the operational amplification circuit 21 is connected to the ground line, an electric charge $V_{OUT1} \times C_2$ is accumulated in the second capacitor 27. This electric charge $V_{OUT1} \times C_2$ is equal to $C_2 \times V_i + C_1 \times V_i - C_1 \times D \times \text{Vref}$ due to the charge conservation law. Therefore, $$V_{OUT1} = (C_2 \times V_i + C_1 \times V_1 - C_1 \times D \times Vref)/C_2$$
$$= (1 + C_1/C_2) \times V_i - D \times Vref \times C_1/C_2.$$

Further, an electric charge $V_{OUT1} \times C_3$ is accumulated in the third capacitor 33.

Second Conversion Operation C:

The second capacitor 27 is disconnected from the output 21c of the operational amplification circuit 21 in response to the clock $\phi_1$. The other terminal of the first capacitor 25 is connected to the output 21c of the operational amplification circuit 21 in response to the clock $\phi_2$. The other terminal of the third capacitor 33 is connected to the output 21c of the operational amplification circuit 21 in response to the clocks $\phi_2$, $\phi_3$. As shown in section (C) of FIG. 18, the first and third capacitors 25, 33 are connected between the output 21c and inverting input 21a of the operational amplification circuit 21, and the conversion analog signal VA/D is supplied to the other terminal 25b of the second capacitor 25. As a result, the second conversion value $V_{OUT2}$ is generated at the output 21c of the operational amplification circuit 21. The second conversion value $V_{OUT2}$ relates to the input analog signal $V_i$. An electric charge $(C_1+C_3) \times V_{OUT2}$ is accumulated in the first and third capacitors 25, 33.

The digital signal $V_{DIGN}$ corresponding to the analog signal $V_i$ is outputted in response to the clock $\phi_1$. According to the explanation above, an electric charge $V_{OUT1} \times C_2 (= C_2 \times V_1 + C_1 \times V_i - C_1 \times D \times Vref)$ is accumulated in the second capacitor 27, and due to the application of the conversion analog signal $V_{A/D}$, an electric charge $\Delta Q_2 = V_{OUT1} \times C_2 - C_2 \times D \times Vref = C_2 \times V_i + C_1 \times V_i - C_1 \times D \times Vref - C_2 \times D \times Vref$ is transferred from the second capacitor 27 to the first and third capacitors 25, 33 (D takes a value of "+1", "0", "−1" correspondingly to the value of the conversion analog signal VA/D). As a result of this charge transfer, the total electric charge of the first and third capacitors 25, 33 can be represented as a sum of the following three electric charges:

Transfer charge: $C_2 \times V_i + C_1 \times V_i - C_1 \times D \times Vref - C_2 \times D \times Vref$,
Third capacitor charge: $C_3 \times V_{OUT1}$,
Second capacitor charge: $C_1 \times D \times Vref$, that is, by $C_2 \times V_i + C_1 \times V_i - C_2 \times D \times Vref + C_3 \times V_{OUT1}$.

The total electric charge of the first and third capacitors 25, 33 is $$(C_1+C_3) \times V_{OUT2},$$

and because of the charge conservation law, the two are equal. Therefore, $$(C_1+C_3) \times V_{OUT2} = C_2 \times V_i + C_1 \times V_i - C_2 \times D \times Vref + C_3 \times V_{OUT1}.$$

Substituting $$V_{OUT1} = (1+C_1/C_2) \times V_i - D \times Vref \times C_1/C_2$$

into this equation, we obtain
$(C_1+C_3) \times V_{OUT2} = (C_1 + C_2 + (1+C_1/C_2) \times C_3) \times V_i - (C_2 + C_3 \times C_1/C_2) \times D \times Vref$, and the second conversion value can be represented as:

$$V_{OUT2} = V_i \times (C_1 + C_2) \times (1+C_3/C_2)/(C_1+C_3) - D \times Vref \times (C_2 + C_3 \times C_1/C_2).$$

This equation can be rewritten as follows by using $\Delta C_3 = C_3 - C_1$, $\Delta C_2 = C_2 - C_1$:

$$V_{OUT2} = V_i \times (2 + (\Delta C_2 - \Delta C_3) \times \Delta C_2/(2 \times \Delta C_1 + \Delta C_3)/(C_1 + \Delta C_2)) - D \times Vref \times (1 + \Delta C_2 \times (4 \times \Delta C_2 - 3 \times \Delta C_3)/2/(2 \times C_1 + \Delta C_3)/(C_1 + \Delta C_2)).$$

The error term is:

$$(\Delta C_2 - \Delta C_3) \times \Delta C_2/(2 \times \Delta C_1 + \Delta C_3)/(C_1 + \Delta C_2).$$

For example, assuming that $\Delta C_2/C_1 = 0.01$ and $\Delta C_3/C_1 = 0.01$, the contribution of the error term is about 0.0001. In other words, even when the spread in capacitance value is about 1%, using the conversion circuit of the present embodiment makes it possible to reduce the contribution of the spread in capacity value to about 0.01%. As a result, using such a conversion circuit makes it possible to realize an analog-digital converter with an accuracy of 13 bit to 14 bit.

The operation of the A/D conversion stage of a configuration in which the mismatch between the capacity values of capacitors is not compensated can be understood from the explanation given with reference to section (A) and section (B) of FIG. 18. In other words, $$V_{OUT1}=(1+C_2/C_1) \times V_i - D \times Vref \times C_2/C_1.$$

Assuming that $\Delta C_2 = C_2 - C_1$, $$V_{OUT1}=(2+\Delta C_2/C_1) \times V_i - D \times Vref \times (1+\Delta C_2/C_1).$$

Where $\Delta C_2/C_1$ is taken as 0.01, the contribution of the error term is 1%.

As described hereinabove, with the present embodiment, it is possible to provide a conversion circuit that can compensate the mismatch between the capacitors by a minimum 1.5 clock operation.

This procedure describes the steps for one input analog signal in an entirely differential circuit. Therefore, it is clear that the three steps can be also applied to an entirely differential circuit, rather than only to a single-end circuit.

Figure 19:
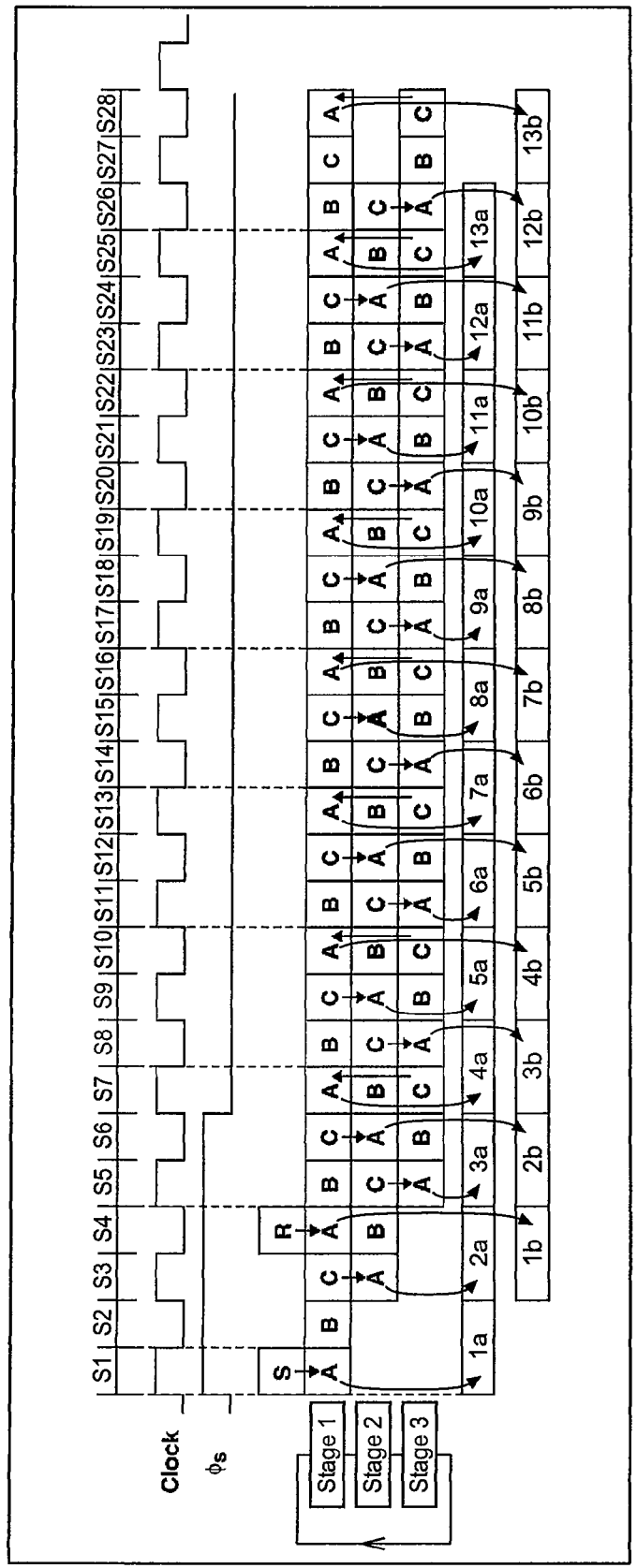
FIG. 19 illustrates a procedure of generating an A/D conversion digital code by using the analog-digital converter.

These steps A, B, C are used in an analog-digital converter shown in FIG. 19. FIG. 19 is a diagram illustrating the procedure of generating an A/D conversion digital code by using the analog-digital converter 11a. In the explanation below, this procedure will be described successively, starting from the sampling of analog signals.

FIG. 19 shows steps S1 to S28.

Step S1

A first sample analog signal VS1 is received by the first A/D conversion stage 131, and the sampling operation A is performed with respect to the first sample analog signal VS1. The first A/D conversion stage Stage1 generates a digital signal 1a corresponding to the first sample analog signal VS1.

Step S2

The first conversion operation B is performed with respect to the analog signal sampled in the first A/D conversion stage 131.

Step S3

The second conversion operation C is performed with respect to the first conversion value obtained by the first conversion operation, and a sampling operation is performed in the second A/D conversion stage 133 with respect to the analog signal corresponding to the second conversion value obtained by the second conversion operation C. In the preferred example, the second A/D conversion stage 133 generates a digital signal 2a.

Step S4

The first A/D conversion stage 131 receives the second sample analog signal R, the sampling operation A is performed with respect to the second sample analog signal R, and the first conversion operation B is performed with respect to the analog signal sampled in the second A/D conversion stage 133. In the preferred example, the first A/D conversion stage 131 generates a digital signal 1b corresponding to the second sample analog signal R.

Step S5

The first conversion operation B is performed with respect to the analog signal sampled in the first A/D conversion stage 131, a first conversion value for the first A/D conversion stage 131 is generated, the second conversion operation C is performed after the first conversion operation B in the second A/D conversion stage 133, a second conversion value for the second A/D conversion stage 133 is generated, and the sampling operation A is performed with respect to the analog signal corresponding to the second conversion value in the third A/D conversion stage 135. In the preferred example, the third A/D conversion stage 135 generates a digital signal 3a.

Step S6

The second conversion operation C is performed after the first conversion operation B in the first A/D conversion stage 131, a second conversion value for the first A/D conversion stage 131 is generated, and the sampling operation A is performed in the second A/D conversion stage 135 with respect to the analog signal corresponding to the second conversion value. In the preferred example, the second A/D conversion stage 133 generates a digital signal 2b. Furthermore, the first conversion operation B is performed with respect to the analog signal sampled in the third A/D conversion stage 135 and first conversion value for the third A/D conversion stage 135 is generated.

Step S7

The first conversion operation B is performed with respect to the analog signal sampled in the second A/D conversion stage 135 to a first conversion value for the second A/D conversion stage 133, the second conversion operation B is performed in the third A/D conversion stage 135, the second conversion value in the third A/D conversion stage 135 is generated, and the sampling operation A is performed in the first A/D conversion stage 131 with respect to the analog signal corresponding to the second conversion value. In the preferred example, the first A/D conversion stage 131 generates a digital signal 4a.

Steps S8 to S21

The remaining digital signals 5a to 13a, 3b to 13b are then generated by successively repeating steps S5, S5, S7. With the A/D converter 11a, the mismatch between capacitors of each A/D conversion stage can be compensated and the repetition of procedure makes it possible to perform the A/D conversion of the desired number of bits.

The A/D converter 11a is provided with an S/H circuit 117 similarly to the converter of the first embodiment. As a result, the effect produced by the offset of the S/H circuit 117 can be reduced. For example, as shown in FIG. 9, a signal $A_{in}$ received by the input 91a is held in the initial sampling period $T_{S1}$. In the single-end S/H circuit, the non-inverting input 92a of the operational amplification circuit 92 is grounded. In this case, the S/H circuit provides the output value $V_{SHO1}$.

$$V_{SHO1}=V_{OP}-V_{ON}=(A_{IN}-Aref) \times C_{S1}/C_{S2}+V_{OFFSET}+V_{C1}.$$

In the first half of the next sampling period $T_{S2}$, the switch 93a is closed in response to the clock signal $\phi_{S2}$, and the S/H circuit provides the output $V_{SHO2}$ after the sampling period $T_{S2}$. The output value $V_{SHO2}$ does not include the analog signal inputted to the S/H circuit. For this reason, the output $V_{SHO2}$ can be represented by $V_{SHO2}=V_{OP}-V_{ON}=V_{OFFSET}+V_{C1}$. These two signals, that is, the output value $V_{SHO1}$ and output value $V_{SHO2}$ are used as signals "S" and "R" shown in FIG. 19. The signals "S" and "R" are subjected to A/D conversion.

Figure 20:
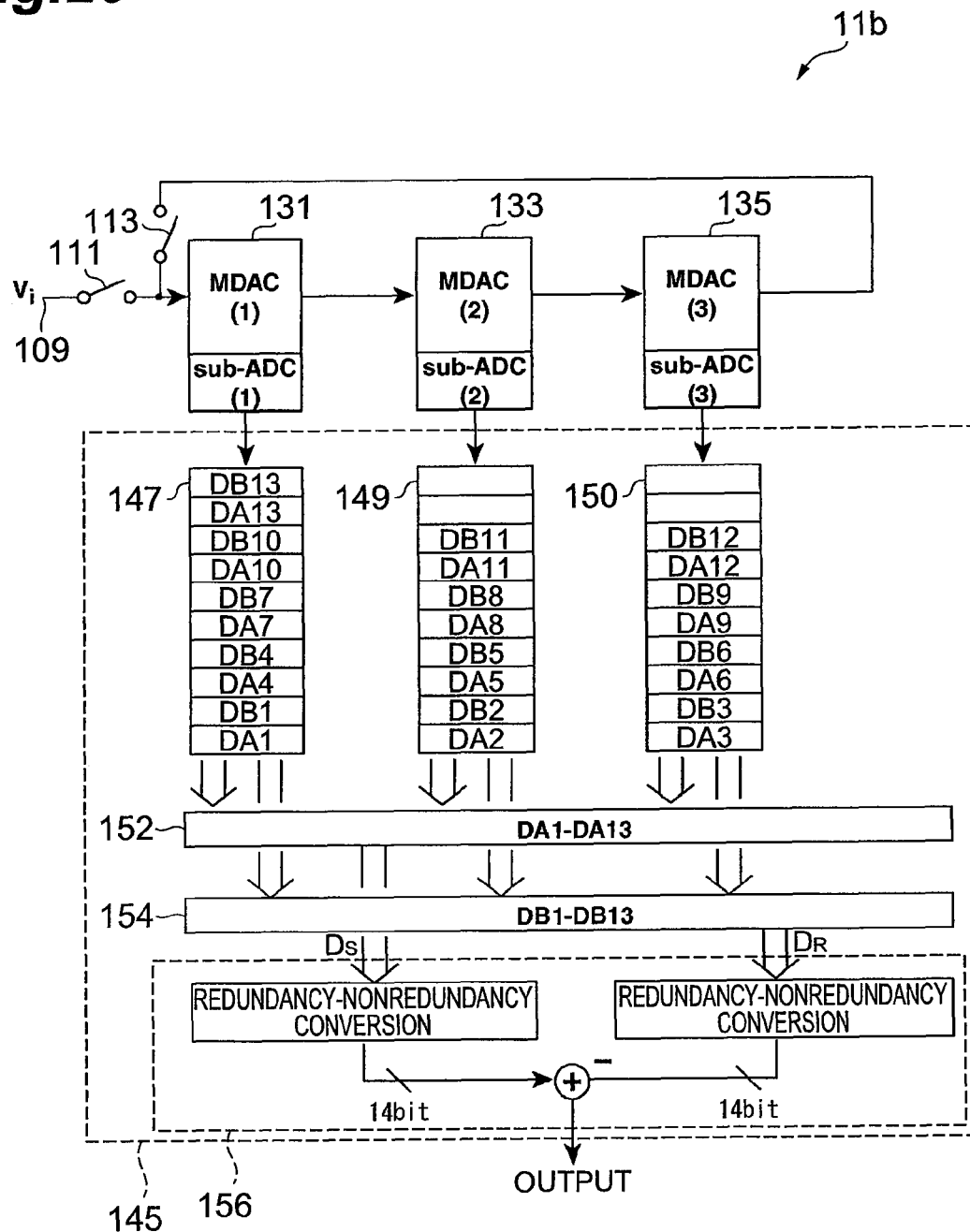
FIG. 20 is a block diagram of an analog-digital converter that can perform correction.

FIG. 20 is a block diagram illustrating an analog digital converter in which correction can be performed. A digital computational circuit 145 comprises first to third storage circuits 147, 149, 150, a first circuit 152, a second circuit 154, and a correction circuit 156. Each of the first to third storage circuits 147, 149, 150 stores a first data group (DA1 to DA13) and second data group (DB1 to DB13) composed of digital signals from the first to third A/D conversion stages 131, 133, 135, 137 and corresponding to the first and second sample signals S, R, respectively. The first circuit 152 is connected to the first to third storage circuits 147, 149, 150 and generates a first digital code DS (for example, 14 bit) corresponding to the first sample analog signal S by using the digital signals of the first data group (DA1 to DA13). The second circuit 154 is connected to the first to third storage circuits 147, 149, 150 and generates a second digital code $D_R$ (for example, 14 bit) corresponding to the second sample analog signal R by using the digital signals of the second data group (DB1 to DB13). The correction circuit 156 uses one of the first and second digital codes $D_S$, $D_R$ to correct the other of the first and second digital codes $D_S$, $D_R$ and generate an A/D conversion digital code (for example, 14 bit). The A/D conversion digital code cancels the offset of the S/H circuit 117 and makes it possible to obtain an A/D conversion value with increased accuracy.

With the A/D converter 11a, the offset of the operational amplification circuit of the S/H circuit can be generated.

As described hereinabove, with the embodiment of the present invention, an A/D conversion stage is provided that can provide an error relating to a circuit element by using a simple configuration. Furthermore, with the embodiment of the present invention, an analog-digital converter including the A/D conversion stage can be provided. In addition, with the embodiment of the present invention, a method for generating a signal indicating a conversion error in the A/D conversion stage and a method for generating a digital signal corresponding to an analog signal can be provided. For example, in the present embodiment, an A/D converter having an S/H circuit at the input is explained, but the present invention is also applicable to the configuration having no S/H stage. Further, in the present embodiment, a circuit of an entirely differential configuration is used for the circuit configured using a single-end circuit. A single-end circuit can be also used for the circuit configured using a circuit of an entirely differential configuration.

Fourth Embodiment

The A/D conversion stage, analog-digital converter, a method for generating a signal indicating a conversion error in an A/D conversion stage, and a method for generating a digital signal corresponding to an analog signal according to the fourth embodiment of the present invention will be described below with reference to the appended drawings.

Figure 21:
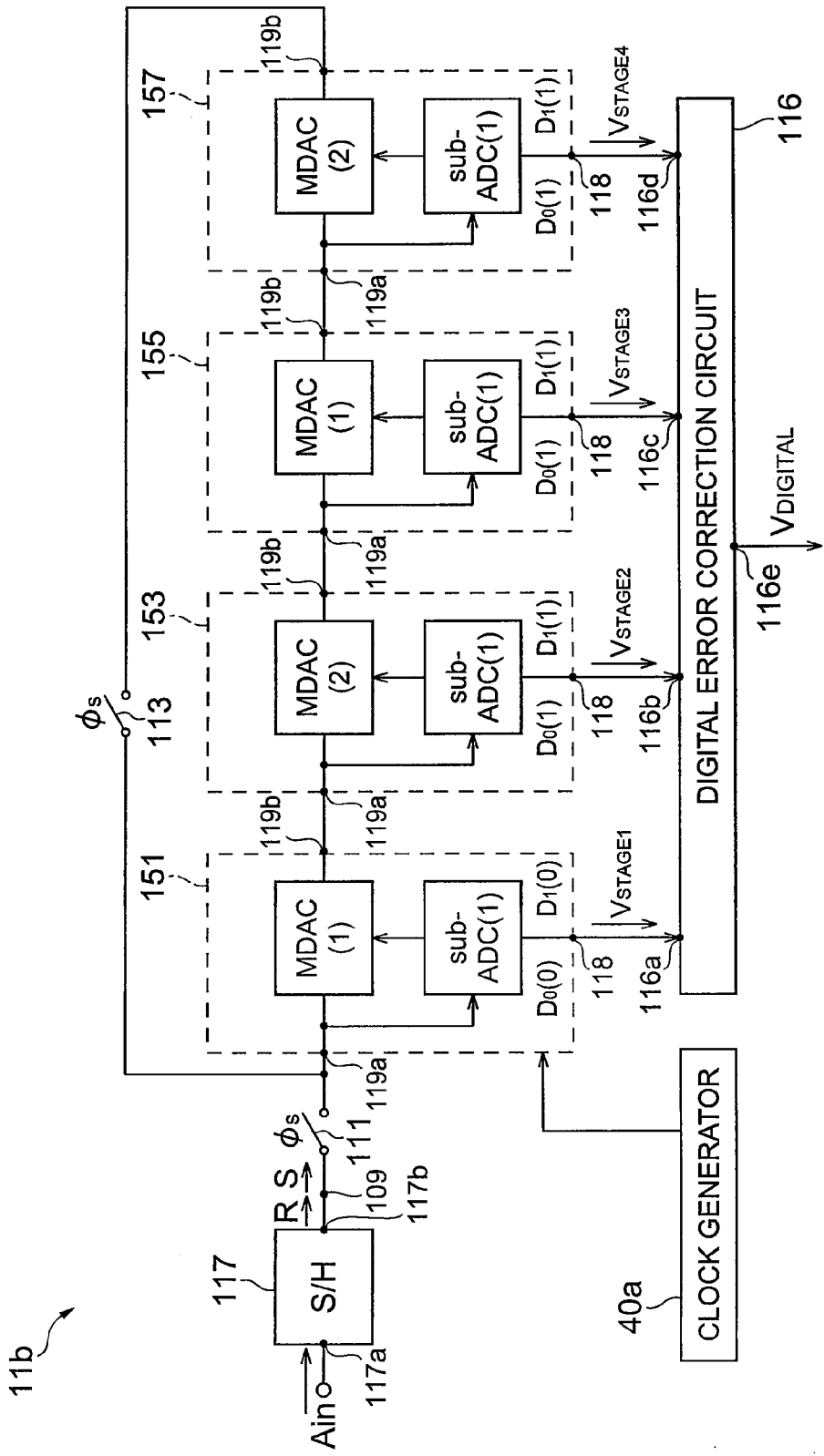
FIG. 21 is a block diagram of the A/D converter of the present embodiment.

FIG. 21 is a block-diagram illustrating the analog-digital converter of the present embodiment. An analog-digital converter 11b is provided with a first A/D conversion stage 151, a second A/D conversion stage 153, a third A/D conversion stage 155, a fourth A/D conversion stage 157, an analog input 109, an input switch 111, a cyclic switch 113, and a digital error correction circuit 116. The first to fourth A/D conversion stages 151, 153, 155, 157 are connected in series, and each of them has a digital output 118, a stage input 119a, and a stage output 119b. The first to fourth A/D conversion stages 151, 153, 155, 157 operate synchronously with the clock signals. The analog input 109 receives an analog signal.

The input switch 111 is connected between the stage input 119a of the first A/D conversion stage 151 and the analog input 109 and samples a first sample analog signal S and a second sample analog signal R in first and second sampling period $T_{S1}$, $T_{S2}$, respectively. The cyclic switch 113 is connected between the stage input 119a of the first A/D conversion stage 151 and the stage output 119b of the fourth A/D conversion stage 157 and provides a path from the fourth A/D conversion stage 157 to the first A/D conversion stage 151 in a cyclic period $T_{FB}$ that is different from the first and second sampling periods $T_{S1}$, $T_{S2}$. The digital error correction circuit 116 generates an A/D conversion digital code $V_{DIGITAL}$ indicating the A/D conversion results corresponding to signals $V_{STAGE1}$, $V_{STAGE2}$, $V_{STAGE3}$, $V_{STAGE4}$ of the conversion results from the first to fourth A/D conversion stages 151, 153, 155, 157, respectively. Further, the digital error correction circuit 116 has inputs 116a, 116b, 116c, 116d connected to the first to fourth A/D conversion stages 151, 153, 155, 157, respectively, and an output 116e that provides the A/D conversion digital code $V_{DIGITAL}$. In a period including the first and second sampling periods $T_{S1}$, $T_{S2}$, the input switch 111 is closed in response to a clock signal $\phi_S$, and the cyclic switch 113 is opened. In the cyclic period $T_{FB}$, the input switch 111 is opened in response to a clock signal $\phi_S$, and the cyclic switch 113 is closed. The analog-digital converter 11 is further provided with a sample/hold (S/H) circuit 117 that holds the received analog signal $A_{in}$. The S/H circuit 117 successively samples the analog signals that are subjected to A/D conversion in the A/D converter and provides the sampled signals to the stage input 119a of the first A/D conversion stage 151 via the input switch 111. The S/H circuit 117 has an input 117a that receives the input analog signal $A_{in}$ and an output and 117b that provides analog signals S, R. A clock generator 40a provides clock signals shown in FIG. 21 to FIG. 23.

As can be clearly understood from the following explanation, with the analog-digital converter 11b, because the first to fourth A/D conversion stages 151, 153, 155, 157 are connected in series via the cyclic switch 113, the A/D conversion can be performed in parallel with respect to two sampling values.

Figure 22:
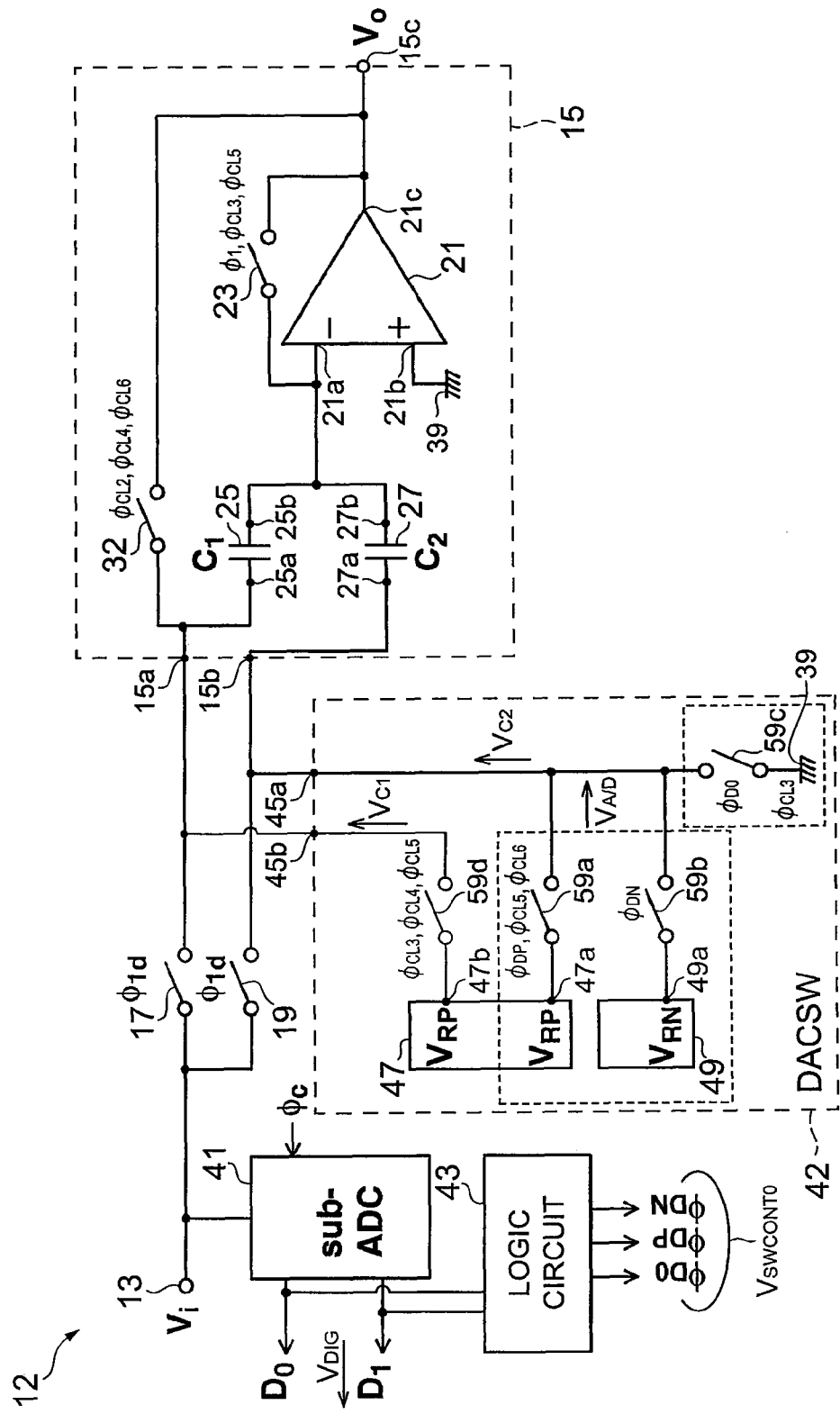
FIG. 22 is a circuit diagram illustrating an A/D conversion stage of the A/D converter.
Figure 23:
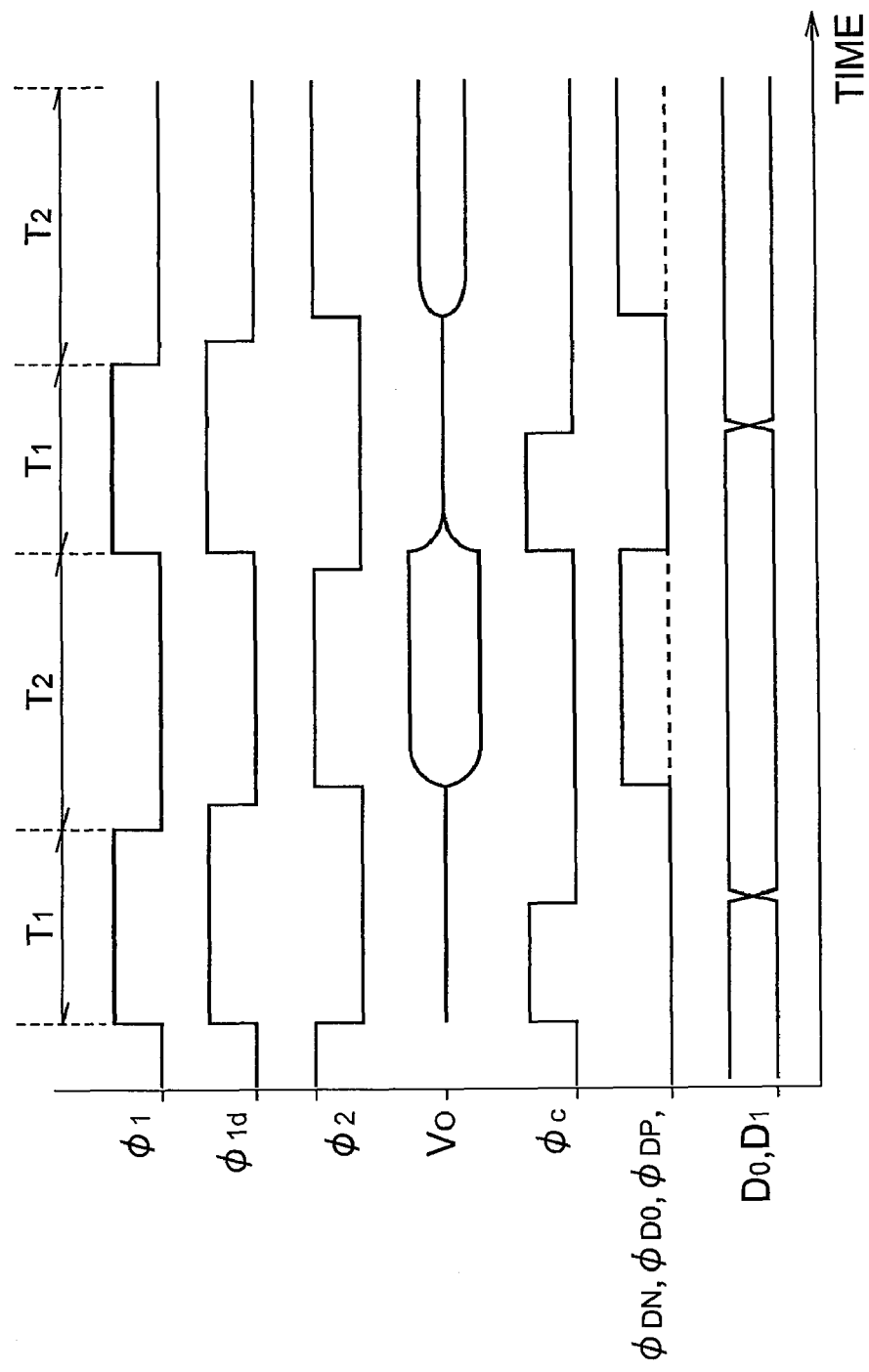
FIG. 23 is a timing chart for the A/D conversion stage shown in FIG. 22.

FIG. 22 is a circuit diagram illustrating the A/D conversion stage of the analog-digital converter. FIG. 23 is a diagram illustrating a timing chart for the A/D conversion stage shown in FIG. 22. The A/D conversion stage 12 for the first to fourth A/D conversion stages is provided with an input 13, a gain stage 15, a first sampling switch 17, and a second sampling switch 19.

A first input 15a of the gain stage 15 is provided for receiving an input analog signal $V_i$ or a signal $V_{C1}$ for correction. A second input 15b of the gain stage 15 is provided for receiving either of the two analog signals: an input analog signal Vi and a conversion analog signal $V_{A/D}$, or the signal for correction $V_{C2}$. The first sampling switch 17 is connected between the first input 15a and the input 13 and provided to perform the sampling of the input analog signal $V_i$ in the first period $T_1$. The second sampling switch 19 is connected between the second input 15b and the input 13 and provided to perform the sampling of the input analog signal $V_i$ in the first period $T_1$.

A feedback switch 23 is connected between an output 21c and an inverting input 21a of an operational amplification circuit 21 and connects the output 21c to the inverting input 21a in the first period $T_1$ in response to a clock $\phi_1$. A first capacitor 25 has one terminal 25a connected to the first input 15a and another terminal 25b connected to the inverting input 21a. A second capacitor 27 has one terminal 27a connected to the second input 15b and another terminal 27b connected to the inverting input 21a. A first switch 32 is connected between the capacitor terminal 25a and the output 21c and provided for connecting the first capacitor 25 between the output 21c and inverting input 21a in a second period $T_2$, which is different from the first period $T_1$, in response to a clock $\phi_2$. An output 15c of the gain stage 15 is connected to the output 21c. A non-inverting input 21b is connected to a reference potential line (for example, a ground line 39). In an example, each A/D conversion stage is composed of an MDAC circuit and a sub A/D conversion circuit.

As shown in FIG. 22, the A/D conversion stage 12 can be provided with a sub A/D conversion circuit 41, a logic circuit 43, and a D/A conversion circuit 42. The sub A/D conversion circuit 41 is connected to the input 13 and generates a digital signal $V_{DIG}$ correspondingly to the inputted analog signal $V_i$. The digital signal $V_{DIG}$ takes a predetermined number of values and preferably has, for example, two values ("0", "1") or three values ("−1", "0", "+1"). The logic circuit 43 is connected to the sub A/D conversion circuit 41 and generates a control signal $V_{SWCONT0}$ in response to the digital signal $V_{DIG}$. The D/A conversion circuit 42 is connected to the logic circuit 43 and has an output 45a for providing a conversion analog signal $V_{A/D}$. The conversion analog signal $V_{A/D}$ is generated in response to the control signal $V_{SWCONT0}$. The control signal $V_{SWCONT0}$ is used to generate the conversion analog signal $V_{A/D}$ to the gain stage 15 in the second period $T_2$.

The A/D conversion stage 12 generates a signal for correcting the effect of capacitor mismatch in third and fourth periods $T_3$, $T_4$. The third period $T_3$ is a period for receiving a signal for capacitor mismatch correction, and the fourth period $T_4$ is a period for generating a signal for correcting the capacitor mismatch. These periods will be explained below in greater detail with reference to FIG. 25. The A/D conversion stage 12 also generates a signal for correcting the effect of finite gain of the operational amplification circuit in fifth and sixth periods $T_5$, $T_6$. The fifth period $T_5$ is a period for receiving a signal for correcting the effect of finite gain, and the sixth period $T_6$ is a period for generating a signal for correcting the effect of finite gain. These periods will be explained below in greater detail with reference to FIG. 26. The feedback switch 23 connects the inverting input 21a to the output 21c in response to clock signals $\phi_{CL3}$ and $\phi_{CL5}$ in the third and fifth periods $T_3$, $T_5$, respectively, in addition to the first period $T_1$. The first switch 32 connects the capacitor terminal 25a to the output 21c in the fourth and sixth periods $T_4$, $T_6$ in response to clock signals, $\phi_{CL4}$ and $\phi_{CL6}$, respectively, in addition to the second period $T_2$. In the state shown in FIG. 22, the clock signal $\phi_{CL3}$ is active in the third period $T_3$. The clock signal $\phi_{CL4}$ is active in the fourth period $T_4$. The clock signal $\phi_{CL5}$ is active in the fifth period $T_5$. The clock signal $\phi_{CL6}$ is active in the sixth period $T_6$.

The sub A/D conversion circuit 41 can include, for example, one comparator. The comparator will compare the input analog signal with a predetermined reference signal and provide a signal indicating the comparison result. A 1-bit digital signal is obtained using such a conversion circuit. Where the number of comparators is increased, a digital signal with a number of bits in excess of 1 bit can be obtained. The sub A/D conversion circuit 41 can include, for example, two comparators. The comparators will compare the input analog signals with the predetermined respective reference signals $V_{REF1}$, $V_{REF2}$ and provide the comparison result signals $D_0$, $D_1$, as shown in FIG. 21. The reference signal $V_{REF1}$ can be, for example, −Vref/4, as shown in FIG. 23, and the reference signal $V_{REF2}$ can be, for example, +Vref/4.

Range of Input Analog Signal $V_i$, Digital Signals $$-Vref/4 > V_i, -1 (D_1=0, D_0=0). \quad (1)$$

$$Vref/4 \geq V_i \geq -Vref/4, 0 (D_1=0, D_0=1). \quad (2)$$

$$V_i > +Vref/4, +1 (D_1=1, D_0=1). \quad (3)$$

By comparing the input analog signal with two predetermined reference signals the sub A/D conversion circuit can generate a three-value redundant digital signal. With such a conversion circuit, the input analog signal is compared with two predetermined reference signals. Therefore, a three-value digital signal is obtained. The sub A/D conversion circuit 41 is preferably activated, for example, in the first period $T_1$, as shown in FIG. 23.

In the usual A/D conversion, the D/A converter 46 provides a predetermined voltage corresponding to control signals $\phi_{DO}$, $\phi_{DP}$, $\phi_{DN}$ to the capacitor terminal 27a in the second period $T_2$. The D/A conversion circuit 42 includes first and second voltage sources 47, 49. The first voltage source 47 provides a voltage VRP (for example, Vref). The second voltage source 49 provides a voltage $V_{RN}$ (for example, −Vref). An output 47a of the first voltage source 47 is connected to the second input 15b via a first switch 59a and the output 45a. The first switch 59a operates in response to clocks $\phi_{DP}$, $\phi_{CL5}$, $\phi_{CL6}$. An output 49a of the second voltage source 49 is connected to the second input 15b via a second switch 59b and the output 45a. The first switch 59b operates in response to clock $\phi_{DN}$. The output 47a is connected to the ground line via a third switch 59c. The third switch 59c operates in response to clocks $\phi_{DO}$, $\phi_{CL3}$. The output 45b is connected to the output 47b of the first voltage source 47 via a fourth switch 59d. The fourth switch 59d operates in response to clocks $\phi_{CL3}$, $\phi_{CL4}$, $\phi_{CL5}$. As shown in FIG. 23, the logic circuit 53 generates control signals $\phi_{DO}$, $\phi_{DP}$, $\phi_{DN}$ for controlling the first to third switches 59a to 59c, respectively. The values of digital signals $D_1$, $D_0$ determine which of the control signals $\phi_{DO}$, $\phi_{DP}$, $\phi_{DN}$ becomes active.

For example, as shown in FIG. 4, in response to control signals from the logic circuit 43, the D/A conversion circuit 42:

(1) provides $V_{A/D}$=Vref when the condition (−Vref/4>$V_i$) is satisfied;

(2) provides $V_{A/D}$=0 when the condition (Vref/4≧$V_i$≧−Vref/4) is satisfied;

(3) provides $V_{A/D}$=−Vref when the condition ($V_i$>+Vref/4) is satisfied.

A three-value A/D conversion is performed with respect to these three regions and "−1", "0", "+1" digital codes are allocated. The initial code is the most significant digit. The following computation is performed according to the characteristic shown in FIG. 4.

$$V_{OUT} = 2 \times V_{in} - D \times Vref.$$

Thus, in this computation, the A/D conversion is successively performed from the high-order digit, the input of the gain stage is doubled, and the output of the gain stage is always confined within the −Vref to +Vref range by performing:

(1) subtraction of a constant value Vref, (2) addition of a constant value Vref, (3) providing zero, depending on the A/D conversion value of the gain stage.

By thus performing the A/D conversion with three values, redundancy is provided in the digital value. This redundancy makes it possible to perform highly accurate A/D conversion, while greatly relaxing the accuracy requirement relating to the comparator in the sub A/D circuit. Each digit of binary number takes two values: "0" and "1", but the digital signal of each gain stage takes three values: "−1", "0", "+1". Therefore, it can be assumed that a 1.5-bit A/D conversion has been performed for one gain stage.

In the A/D conversion stage 12, in addition to the A/D conversion of analog signal, a signal for correcting the effect of capacitor mismatch is generated in the third and fourth periods $T_3$, $T_4$ and a signal for correcting the effect of finite gain of the operational amplification circuit is generated in the fifth and sixth periods $T_5$, $T_6$. The D/A converter 42 for correcting the capacitor mismatch and correcting the finite gain performs the following operations: a predetermined voltage corresponding to the control signal $V_{SWCONT0}$ is provided to the capacitor terminal 25a in the second period $T_2$ and the reference potential line is connected to the capacitor terminal 27a in the third period $T_3$. The reference voltage $V_R$ is provided to the capacitor terminal 27a in the fourth to sixth periods $T_4$ to $T_6$. The reference voltage $V_R$ is provided to the capacitor terminal 25a in the fifth and third periods $T_5$, $T_3$.

Further, in the A/D conversion stage 12, in addition to the A/D conversion of analog signal, the D/A converter that generates a signal for correcting the effect of capacitor mismatch in the third and fourth periods $T_3$, $T_4$ performs the following operations: a predetermined voltage corresponding to the control signal $V_{SWCONT0}$ is provided to the one terminal 27a of the second capacitor 27 in the second period $T_2$. The reference potential line is connected to the capacitor terminal 27a in the third period $T_3$. The reference voltage $V_R$ is provided to the capacitor terminal 25a in the third period $T_3$. The reference voltage $V_R$ is provided to the capacitor terminal 27a in the fourth periods $T_4$.

Further, in the A/D conversion stage 12, in addition to the A/D conversion of analog signal, the D/A converter that generates a signal for correcting the effect finite gain of the operational amplification circuit in the fifth and sixth periods $T_5$, $T_6$ performs the following operations: a predetermined voltage corresponding to the control signal $V_{SWCONT0}$ is provided to the capacitor terminal 27a in the second period $T_2$. The reference voltage $V_R$ is provided to the capacitor terminal 27a in the fifth and sixth periods $T_5$, $T_6$. The reference voltage $V_R$ is provided to the capacitor terminal 25a in the fifth periods $T_5$.

Figure 24:
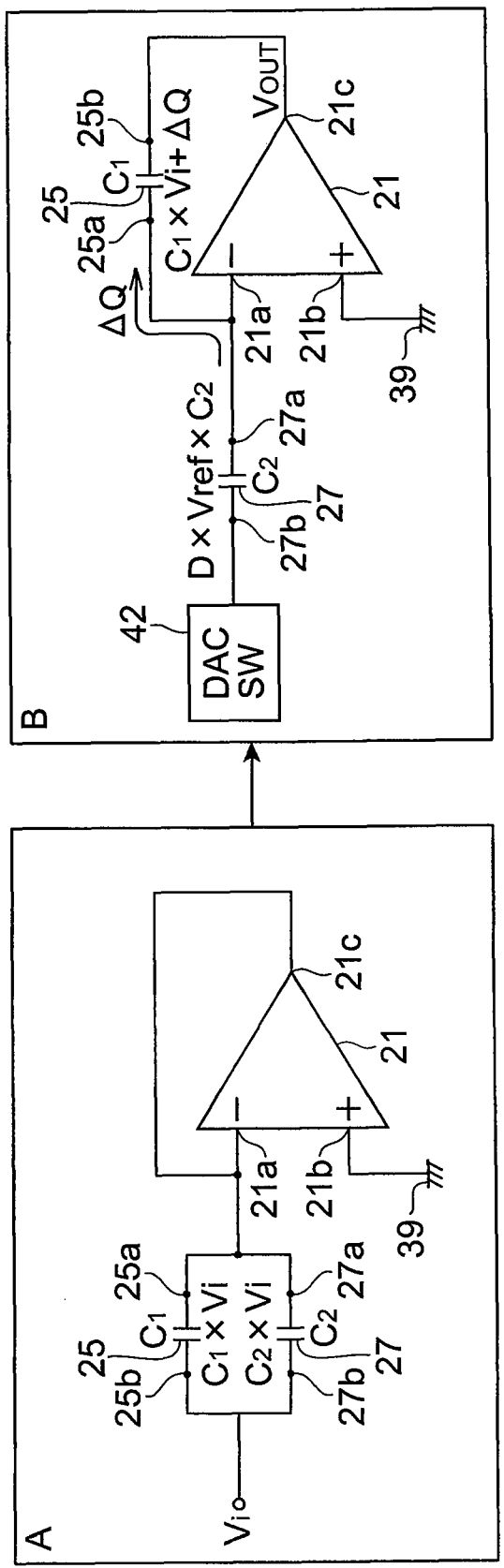
FIG. 24 illustrates a step of generating a digital signal corresponding to an analog signal.

Sections (A) and (B) of FIG. 24 illustrate the steps of generating a digital signal corresponding to an analog signal. The operation of the A/D conversion stage includes a sampling operation A and a conversion operation B.

Sampling Operation A:

Electric charges $Q_1=C_1 \times V_i$, $Q_2=C_2 \times V_i$ corresponding to the input analog signal $V_1$ are accumulated in the first capacitor 25 and second capacitor 27.

Conversion Operation B:

A conversion value $V_{OUT}$ is generated at the output 21c and the electric charges of the first and second capacitors 25, 27 are rearranged by connecting the first capacitor 25 between the output 21c and inverting input 21a of the operational amplification circuit 21 and supplying a conversion analog signal $V_{A/D}$ corresponding to a digital signal indicating the A/D conversion result in the A/D conversion stage to the capacitor terminal 27b by using a D/A converter DACSW. The electric charge of the first capacitor 25 is $C_1 \times V_{OUT}$. An electric charge $\Delta Q = C_2 \times V_i - D \times Vref \times C_2$ moves from the second capacitor 27 to the first capacitor 25 and the electric charge accumulated in the first capacitor 25 becomes $C_1 \times V_1 + \Delta Q$ according to a charge preservation rule. Because this electric charge is equal to $C_1 \times V_{OUT}$, $$V_{OUT}=(1+C_2/C_1)\times V_i - D \times Vref \times C_2/C_1.$$

The procedure shown in FIG. 24 represents steps for one input analog signal in an entirely differential circuit. Therefore, it is clear that two steps can be also applied to an entirely differential circuit, rather than only to a single-end circuit. In other words, although the gain stage 15 shown in FIG. 22 has a single-end circuit structure, a gain stage having an entirely differential structure also can be used in the present embodiment.

Figure 25:
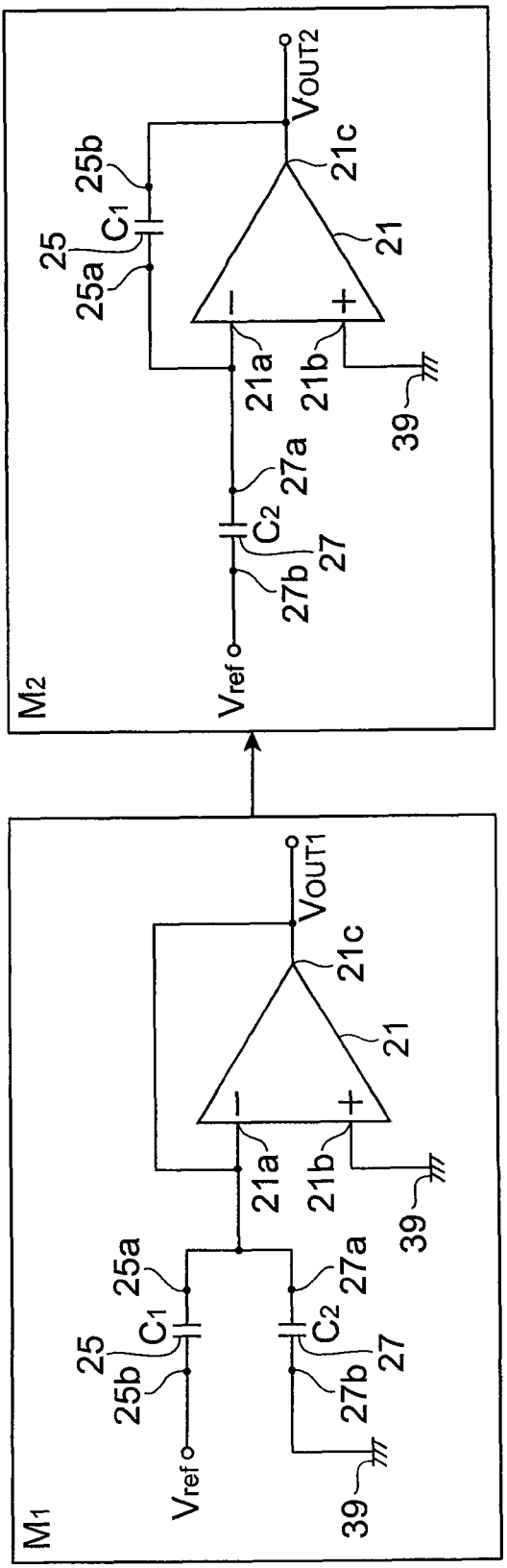
FIG. 25 illustrates a step of generating a signal indicating a conversion difference (effect of capacitor mismatch) in the A/D conversion stage for generating a digital signal corresponding to an analog signal.

Sections (A) and (B) of FIG. 25 illustrate the steps for generating a signal indicating a conversion error (effect of capacitor mismatch) in the A/D conversion stage for generating a digital signal corresponding to the analog signal.

First Mismatch Correction Operation M1:

A first conversion value $V_{OUT1}$ is generated at the output 21c and the electric charges of the first and second capacitors 25, 27 are rearranged by connecting the output 21c and inverting input 21a of the operational amplification circuit 21, connecting the capacitor other terminal 27b, for example, to the ground line 39, and applying the reference voltage $V_R$ to the capacitor terminal 25b. The accumulated electric charge of the second capacitor 27 is zero. The accumulated electric charge of the first capacitor 25 is $V_R \times C_1$.

Second Mismatch Correction Operation M2:

A second conversion value $V_{OUT2}$ is generated at the output 21c and the electric charges of the first and second capacitors 25, 27 are rearranged by connecting the first capacitor 25 between the output 21c and inverting input 21a of the operational amplification circuit 21 and applying the reference voltage $V_R$ to the capacitor terminal 27b. The electric charge transferred from the second capacitor to the first capacitor 25 is $\Delta Q_1 = -V_R \times C_2$, and due to the charge conservation law, the accumulated electric charge of the first capacitor 25 is $C_1 \times V_{OUT2}$. Therefore, $$V_{OUT2}=(1-C_2/C_1)\times V_R = m \times V_R.$$

Here, $m=\Delta C_2/C_1$ ($\Delta C_2 = C_2 - C_1$).

The second conversion value $V_{OUT2}$ generated by these two steps M1, M2 includes an error m originating from the mismatch between the first and second capacitors 25, 27, and this error m is directly provided by the second conversion value $V_{OUT2}$.

Figure 26:
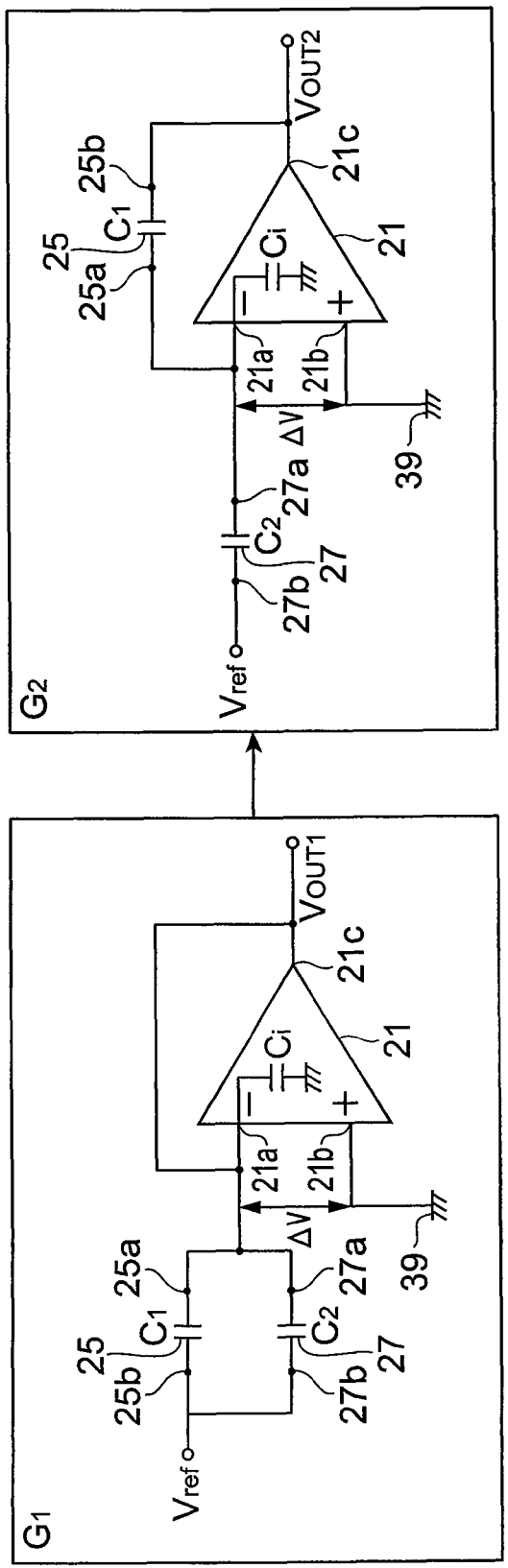
FIG. 26 illustrates a step of generating a signal indicating a conversion difference (effect of finite gain of an operational amplification circuit) in the A/D conversion stage for generating a digital signal corresponding to an analog signal.

The sections (A) and (B) of FIG. 26 generate a signal indicating a conversion error (effect of finite gain) in the A/D conversion stage for generating a digital signal corresponding to the analog signal.

First Finite Gain Correction Operation G1:

The first conversion value $V_{OUT1}$ is generated at the output 21c and the electric charges are arranged in the first and second capacitors 25, 27 by applying the reference voltage VR to the capacitor terminals 25b, 27b and connecting the output 21c and inverting input 21c of the operational amplification circuit 21. The accumulated charge of the first and second capacitors 25, 27 is represented by $V_R \times C_1$ and $V_R \times C_2$, respectively. Because the gain A of the operational amplification circuit 21 is a finite value, the difference in electric potential $\Delta V$ between the inverting input 21a and non-inverting input 21b is not zero, and the input capacitance $C_i$ of the operational amplification circuit 21 cannot be ignored. Therefore, an electric charge $C_i \times \Delta V$ can be accumulated in the input capacitor.

Second Finite Gain Correction Operation G2:

The second conversion value $V_{OUT2}$ is generated at the output 21c and electric charges are rearranged at the first and second capacitors 25, 27 by connecting the first capacitor 25 between the output 21c and inverting input 21a of the operational amplification circuit 21 and applying the reference voltage $V_R$ to the capacitor terminal 27b. The gain A of the operational amplification circuit 21 is a finite value. Therefore, the following relationship is valid: $V_{OUT2} = -A \times \Delta V$.

Applying an electric charge conservation law to the node of the inverting input 21a, we obtain:

$$V_{OUT2}=-1/(1+(C_1+C_2+C_i)/(C_2 \times A)) \times V_R.$$

Because the gain is large, this equation can be expanded up to a primary term:

$$= -/(1-(C_1+C_2+C_i)/(C_2 \times A))V_R$$
$$= -(1-g)\times V_R.$$

The second conversion value $V_{OUT2}$ generated by these two steps G1, G2 includes an error g originating from the finite gain A of the conversion amplifier 21, and this error g can be approximately represented as a difference between a voltage indicating the second conversion value and the reference voltage $V_R$.

When the A/D conversion stage includes the errors originating from both the capacitor mismatch and the finite gain, the conversion value of the A/D conversion stage can be approximately represented as follows:

$$V_{OUT} = (C_1 + C_2)/C_2 \times (1 - (C_1 + C_2 + C_i)/(C_2 \times A)) \times V_i - C_1/C_2 \times (1 - (C_1 + C_2 + C_i)/(C_2 \times A)) \times V_R \times D.$$

In a certain A/D conversion stage, an error (e) with respect to the ideal value is:

$$e = (m - 2 \times g) \times V_i - (m - g) \times V_R \times D.$$

This error value is provided as a digital value. The error value is found in all the stages or a necessary stage. Error correction is performed by subtracting an error correction value of this digital value from the output. A circuit for performing such computation will be described below with reference to FIG. 28.

Figure 27:
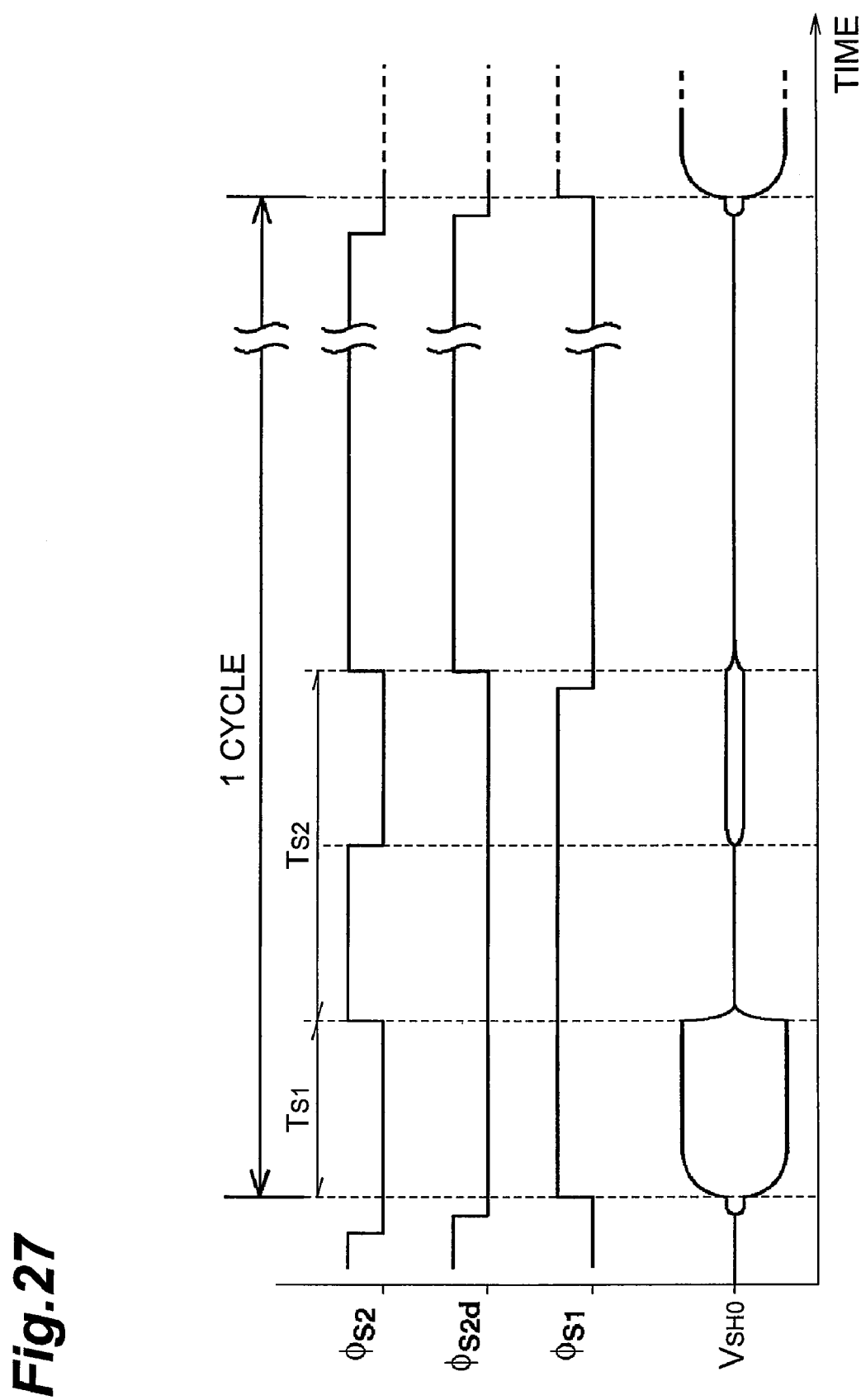
FIG. 27 illustrates a timing chart for the S/H circuit shown in FIG. 8.

Referring again to FIG. 21, the analog-digital converter 11b includes the S/H circuit 117. FIG. 8 is a circuit diagram illustrating an example of the S/H circuit. FIG. 27 is a diagram illustrating a timing chart for the S/H circuit shown in FIG. 8. The S/H circuit 117 includes an input 91a for receiving an input analog signal $A_{in}$ and an output 91b for providing the analog signal $V_i$ to the analog input 109. The S/H circuit 117 also includes the operational amplification circuit 92 and a feedback switch 93. The feedback switch 93a is connected between the inverting input 92a and non-inverting output 92b. By using the feedback switch 93a, it is possible to generate a signal corresponding to the offset amount of the operational amplification circuit 92. In the S/H circuit 117, a capacitor $C_{S1}$ is connected to the sample input 91a and also connected between the sample input 91a and inverting input 92a via a switch 94a. The capacitor $C_{S2}$ is connected between the non-inverting output 92b and inverting input 92a. The first switch 94a is closed in a period serving for sampling and open in a period serving for A/D conversion. In a single-end S/H circuit, the non-inverting input 92a is grounded.

The feedback switch 93a is open in either the entire first sampling period or the entire second sampling period. In this period, the input analog signal $A_{in}$ is generated as either of the first and second sample analog signals. This signal can be provided to the A/D conversion stage as an analog signal serving as an A/D conversion object.

The S/H circuit 117 of the entirely differential configuration can include a feedback switch 93b. The feedback switch 93b is connected between the non-inverting input 92c and inverting output 92d of the operational amplification circuit 92. By using the feedback switches 93a, 93b, it is possible to generate a signal corresponding to the offset amount of the operational amplification circuit 92. In the S/H circuit 117, a capacitor $C_{S3}$ is connected to the sample input 91c and also between a sample input 91c and the non-inverting input 92c via a first switch 94b. A capacitor $C_{S4}$ is connected between the non-inverting output 92c and inverting input 92d. A second switch 94b is closed in the sampling period and open in the period for A/D conversion. A switch 94c is connected between one terminal of a capacitor $C_{S1}$ and one terminal of the capacitor CS3. Capacitors $C_{i1}$ and $C_{i2}$ are connected to the sample input 91a and sample input 91c, respectively.

The feedback switch 93a is closed in part of the other of the first and second sampling periods, and the other of the first and second sample analog signals is held after the feedback switches 93a, 93b of the sample/hold circuit 117 have been opened. Where the feedback switches 93a, 93b are thus operated, a signal including the offset amount of the operational amplification circuit 92 can be provided to the A/D conversion stage.

For example, as shown in FIG. 27, the signal $A_{in}$ received by the input 91a is held in the initial sampling period $T_{S1}$. The output of the S/H circuit can be represented as follows.

$$V_{SHO1} = V_{OP} - V_{ON} = (A_{IN} - A_{ref}) \times C_{S1}/C_{S2} + V_{OFFSET} + V_{CI}.$$

In the first half of the next sampling period $T_{S2}$, the switches 93a, 93b are closed in response to the clock signal $\phi_{S2}$, and after the sampling period $T_{S2}$, the S/H circuit provides an output $V_{SHO2}$. The output value $V_{SHO2}$ does not include the analog signal inputted to the S/H circuit. For this reason, the output value $V_{SHO2}$ includes an amount $V_{OFFSET}$ correlated with the offset of the operational amplification circuit 92, a noise $V_{CI}$ occurring when the switch 93a is opened and closed (for example, when the switch 93a is a MOS analog switch and the MOS analog switch is opened, the noise is generated by the channel charge), and other noise. This output value is represented by $$V_{SHO2} = V_{OP} - V_{ON} = V_{OFFSET} + V_{CI}.$$

These signals, output values $V_{SHO1}$, $V_{SHO2}$, are used as signals "S" and "R" shown in FIG. 21. Where the signals "S" and "R" are A/D converted, the respective conversion values $D_S$, $D_R$ can be represented as follows.

$$D_S = D((A_{IN} - A_{ref}) \times C_{S1}/C_{S2} + V_{OFFSET} + V_{CI})$$
$$= D((A_{IN} - A_{ref}) \times C_{S1}/C_{S2}) + D(V_{OFFSET}) + D(V_{CI}).$$

$$D_R = D(V_{OFFSET} + V_{CI})$$
$$= D(V_{OFFSET}) + D(V_{CI}).$$

Here, "D" is an operator indicating A/D conversion.

Figure 28:
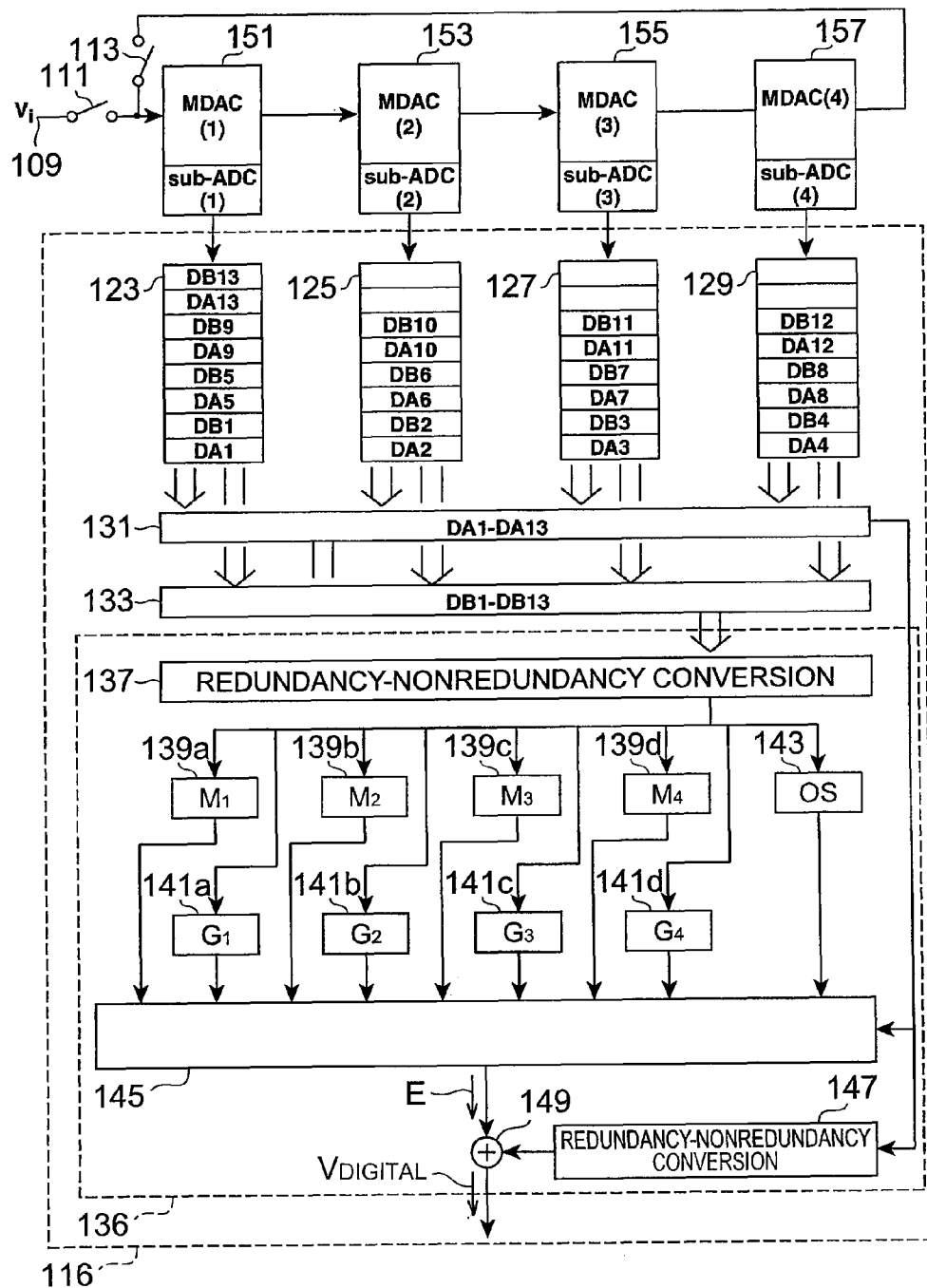
FIG. 28 is a block diagram of an A/D converter that can perform correction.

FIG. 28 is a block diagram illustrating an analog-digital converter that can perform the correction by using the correction signals generated in the above-described manner. A digital error correction circuit 116 includes first to fourth storage circuits 123, 125, 127, 129, a first circuit 131, a second circuit 133, and a correction circuit 136. Each of the first to fourth storage circuits 123, 125, 127, 129 stores a first data group (DA1 to DA13) and a second data group (DB1 to DB13) composed of digital signals from the first to fourth A/D conversion stages 151, 153, 155, 017. The first data group (DA1 to DA13) and second data group (DB1 to DB13) correspond to the first and second sample signals S, R, respectively. The first circuit 131 is connected to the first to fourth storage circuits 123, 125, 127, 129 and generates a first digital code DS corresponding to the first sample analog signal S by using digital signals of the first data group (DA1 to DA13). The second circuit 133 is connected to the first to fourth storage circuits 123, 125, 127, 129 and generates a second digital code DR corresponding to the second sample analog signal R by using digital signals of the second data group (DB1 to DB13).

In the correction value generation circuit 136, the capacitor error signals $M_1$ to $M_4$ from the second circuit 133 are stored in capacitor error registers 139a to 139d via a redundant-nonredundant representation conversion circuit 137. Gain error signals $G_1$ to $G_4$ from the second circuit 133 are stored in gain error registers 141a to 141d via the redundant-nonredundant representation conversion circuit 137. An offset error signal OS from the second circuit 133 is stored in an offset error register 143 via the redundant-nonredundant representation conversion circuit 137. The first circuit 131 is connected to a correction value operational circuit 145 and an addition circuit 149 via the redundant-nonredundant representation conversion circuit 137. Further, the correction value operational circuit 145 generates a signal E for performing correction from the most significant digit to the M-th digit by using the signals from the capacitor error registers 139a to 139d, gain error registers 141a to 141d, and offset error register 143. The addition circuit 149 receives the signal E from the correction value operational circuit 145 and a digital signal $V_{NOCORRECT}$ in nonredundant representation and provides the error-corrected A/D conversion digital code VDIGITAL. The offset error of the S/H circuit 117, charge injection error, and capacitor mismatch error and gain error occurring in the A/D conversion stage are removed from the digital code $V_{DIGITAL}$ and an A/D conversion value of desired accuracy is provided.

Figure 29:
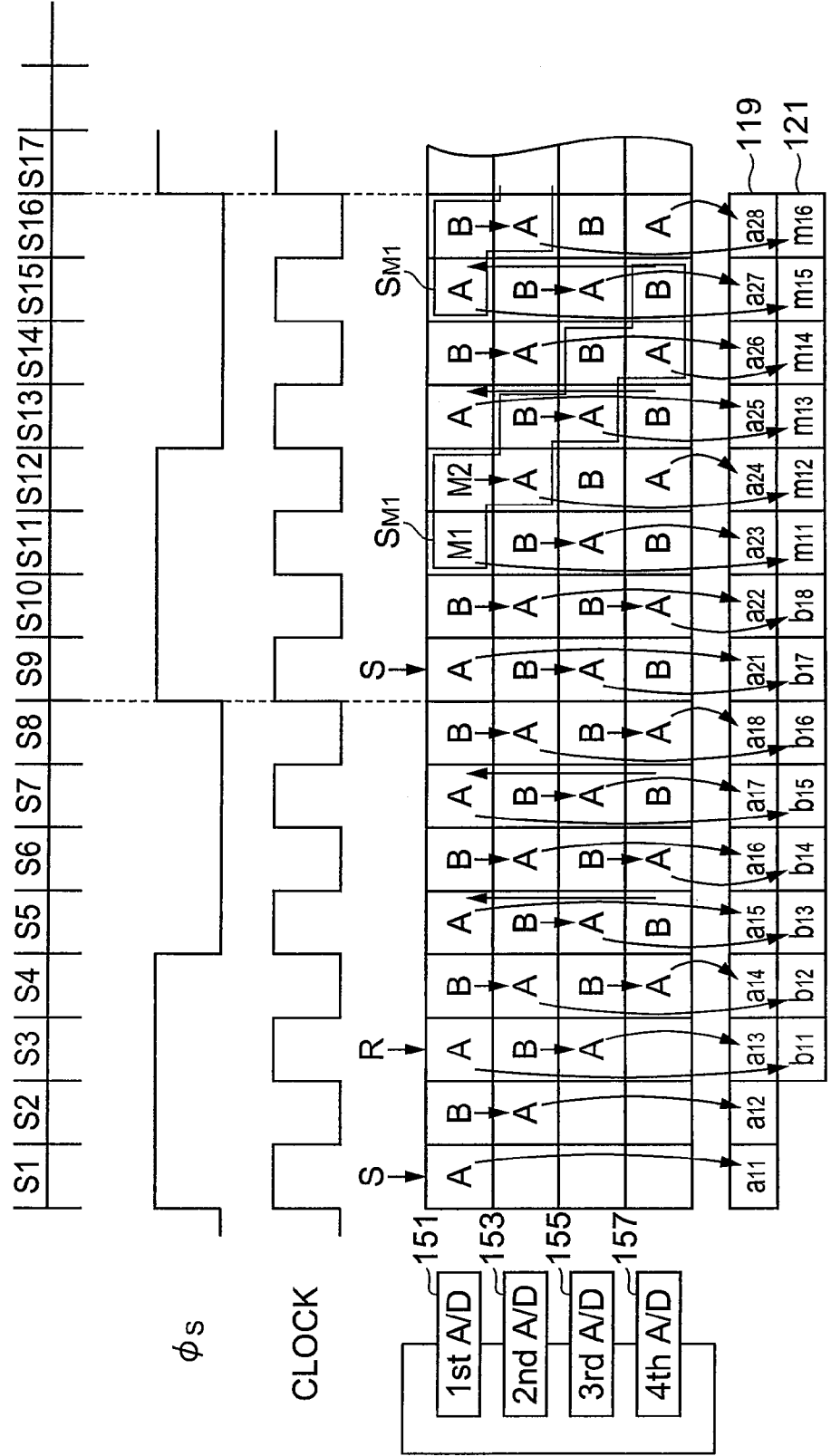
FIG. 29 illustrates a step of generating a correction value for correcting a capacitor mismatch in an A/D conversion stage.
Figure 30:
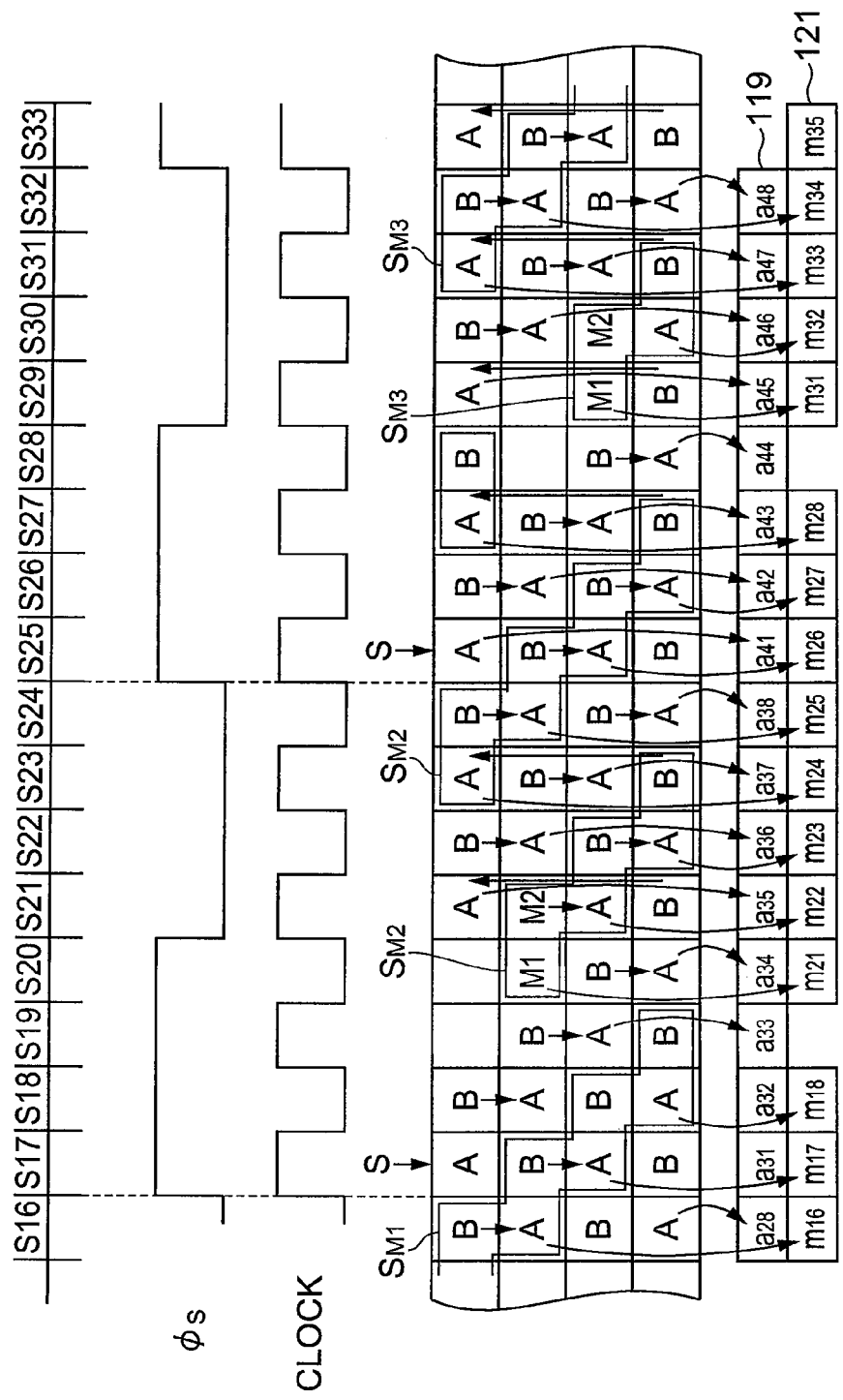
FIG. 30 illustrates a step of generating a correction value for correcting a capacitor mismatch in an A/D conversion stage.
Figure 31:
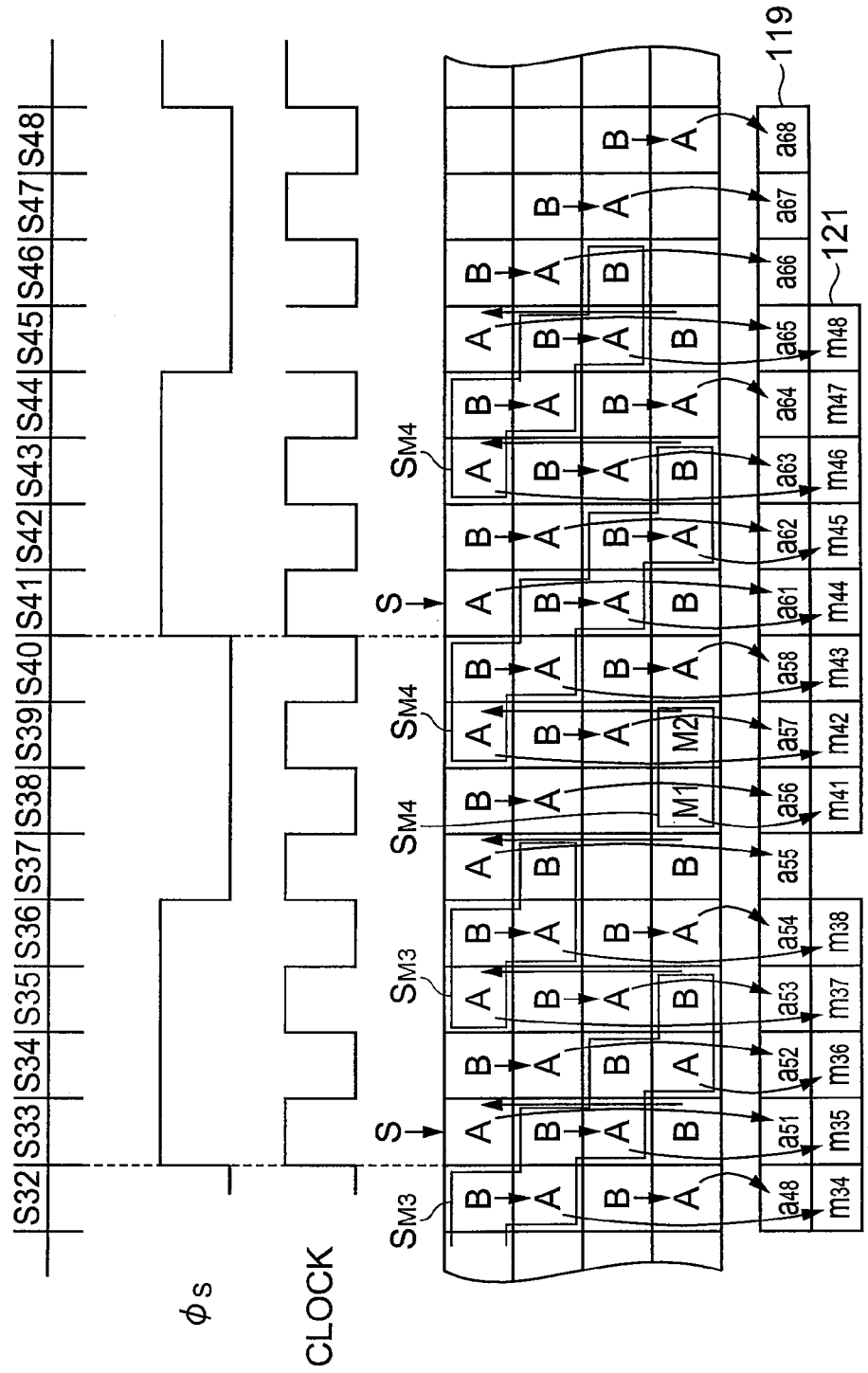
FIG. 31 illustrates a step of generating a correction value for correcting a capacitor mismatch in an A/D conversion stage.

FIGS. 29, 30, 31 illustrate sequences for generating correction values for correcting a capacitor mismatch in an A/D conversion stage. Steps S1 to S48 are described with reference to FIGS. 29 to 31. Steps S1 to S15 are shown in FIG. 29.

Step S1: a first sample analog signal S is received by the A/D conversion stage 151, and the sampling operation A is performed with respect to the first sample analog signal S. The A/D conversion stage 151 generates a digital signal a11.

Step S2: the conversion operation B is performed with respect to the analog signal sampled in the A/D conversion stage 151, a first conversion result is generated, and the sampling operation A is performed in the A/D conversion stage 153 with respect to the analog signal corresponding to the first conversion result. The A/D conversion stage 151 generates a digital signal a12.

Step S3: the A/D conversion stage 151 receives the second sample analog signal R, the sampling operation A is performed with respect to the second sample analog signal R, the conversion operation B is performed with respect to the analog signal sampled in the A/D conversion stage 153, a second conversion result is generated, and the sampling operation A is performed in the A/D conversion stage 155 with respect to an analog signal corresponding to the second conversion result. The A/D conversion stage 153 generates a digital signal b11. The A/D conversion stage 151 generates a digital signal a13.

By these operations, the first and second analog signals S, R are fetched to the A/D conversion stage. These two sample analog signals S, R are successively provided to the A/D conversion stage 151, thereby making it possible to link any of the first to fourth A/D conversion stages to a procedure of performing either of the sampling operation A and conversion operation B, as will be described hereinbelow.

Step S4: The conversion operation B is performed with respect to the analog signal R sampled in the A/D conversion stage 151, a third conversion result is generated, the sampling operation A is performed in the A/D conversion stage 153 with respect to an analog signal corresponding to the third conversion result, the conversion operation B is performed with respect to the analog signal sampled in the A/D conversion stage 155, a fourth conversion result is generated, and the sampling operation A is performed in the A/D conversion stage 157 with respect to an analog signal corresponding to the fourth conversion result. The A/D conversion stage 153 generates a digital signal b12. The A/D conversion stage 157 generates a digital signal a14.

Step S5: the conversion operation B is performed with respect to the analog signal sampled in the A/D conversion stage 157, a fifth conversion result is generated, the sampling operation A is performed in the A/D conversion stage 151 with respect to an analog signal corresponding to the fifth conversion result, the conversion operation B is performed with respect to the analog signal sampled in the A/D conversion stage 153, a sixth conversion result is generated, and the sampling operation A is performed in the A/D conversion stage 155 with respect to an analog signal corresponding to the sixth conversion result. The A/D conversion stage 151 generates a digital signal a15. The A/D conversion stage 155 generates a digital signal b13.

With these steps, either of the sampling operation A and conversion operation B is performed in any of the first to fourth A/D conversion stages. Therefore, the first to fourth A/D conversion stages operate efficiently. Furthermore, two signals are A/D converted in parallel.

As shown in FIG. 29, steps S6 to S10 are performed similarly to steps S4, S5. Digital signals a11 to a18 are provided from steps S1 to S8. The digital signals b11 to b18 are provided from steps S3 to S10. The digital signals a11 to a18, b11 to b18 are generated by the A/D conversion circuits located in the first to fourth A/D conversion stages. These digital signals are stored in storage elements 119, 121 located in the digital error correction circuit 116.

In the sequence for correcting the errors caused by the S/H circuit, in steps S1, S3, the sample analog signals S, R are provided, and in steps S1 to S10, digital signals a11 to a18, b11 to b18 are generated from the A/D conversion stage. Where the sample analog signals S, R are signals $V_{SHO1}$, $V_{SHO2}$ from the S/H circuit 117, a digital signal indicating an error such as an offset of S/H circuit 117 can be obtained.

In steps S11, S12, the operations M1, M2 are performed in the A/D conversion stage 151. As a result, a signal indicating the capacitor mismatch is generated as a conversion value of the A/D conversion stage 151, digital values m11 to m18 are generated by a procedure $S_{M1}$ by this signal. The digital values m11 to m18 are provided to the digital error correction circuit 116. They are used for error correcting the A/D conversion values. In step S9, the sample analog signal S is inputted from the S/H circuit 117 to the first A/D conversion stage 151. The A/D conversion of the analog signals is performed in parallel with the procedure $S_{M1}$, and digital signals 1a21 to a28 are generated.

In steps S20, S21, the operations M1, M2 are performed in the A/D conversion stage 153. As a result, the conversion value of the A/D conversion stage 153 is generated as a signal indicating a capacitor mismatch, and this signal results in the generation of digital values m21 to m28 by the procedure $S_{M2}$. The digital values m21 to m28 are provided to the digital error correction circuit 116. The provided signals are used for error correcting the A/D conversion value. In step S17, the sample analog signal S is inputted from the S/H circuit 117 to the first A/D conversion stage 151. This A/D conversion of analog signals is performed in parallel with a procedure $S_{M2}$, and digital values a31 to a38 are generated.

In steps S29, S30, the operations M1, M2 are performed in the A/D conversion stage 155. The conversion value of the A/D conversion stage 157 is generated as a signal indicating a capacitor mismatch, and this signal results in the generation of digital values m31 to m38 by the procedure $S_{M3}$. The digital values m31 to m38 are provided to the digital error correction circuit 116 and used for error correcting the A/D conversion value. In steps S25, the sample analog signal S is inputted from the S/H circuit 117 to the first A/D conversion stage 151. This A/D conversion of analog signals is performed in parallel with a procedure $S_{M3}$, and digital values a41 to a48 are generated.

In steps S38, S39, the operations M1, M2 are performed in the A/D conversion stage 157. The conversion value of the A/D conversion stage 157 is generated as a signal indicating a capacitor mismatch, and this signal results in the generation of digital values m41 to m48 by the procedure $S_{M4}$. The digital values m41 to m48 are provided to the digital error correction circuit 116 and used for error correcting the A/D conversion value. In steps S33, S41, the sample analog signal S is inputted from the S/H circuit 117 to the first A/D conversion stage 151. This A/D conversion of analog signals is performed in parallel with a procedure $S_{M4}$, and digital values a51 to a58, 61a to a68 are generated.

Figure 32:
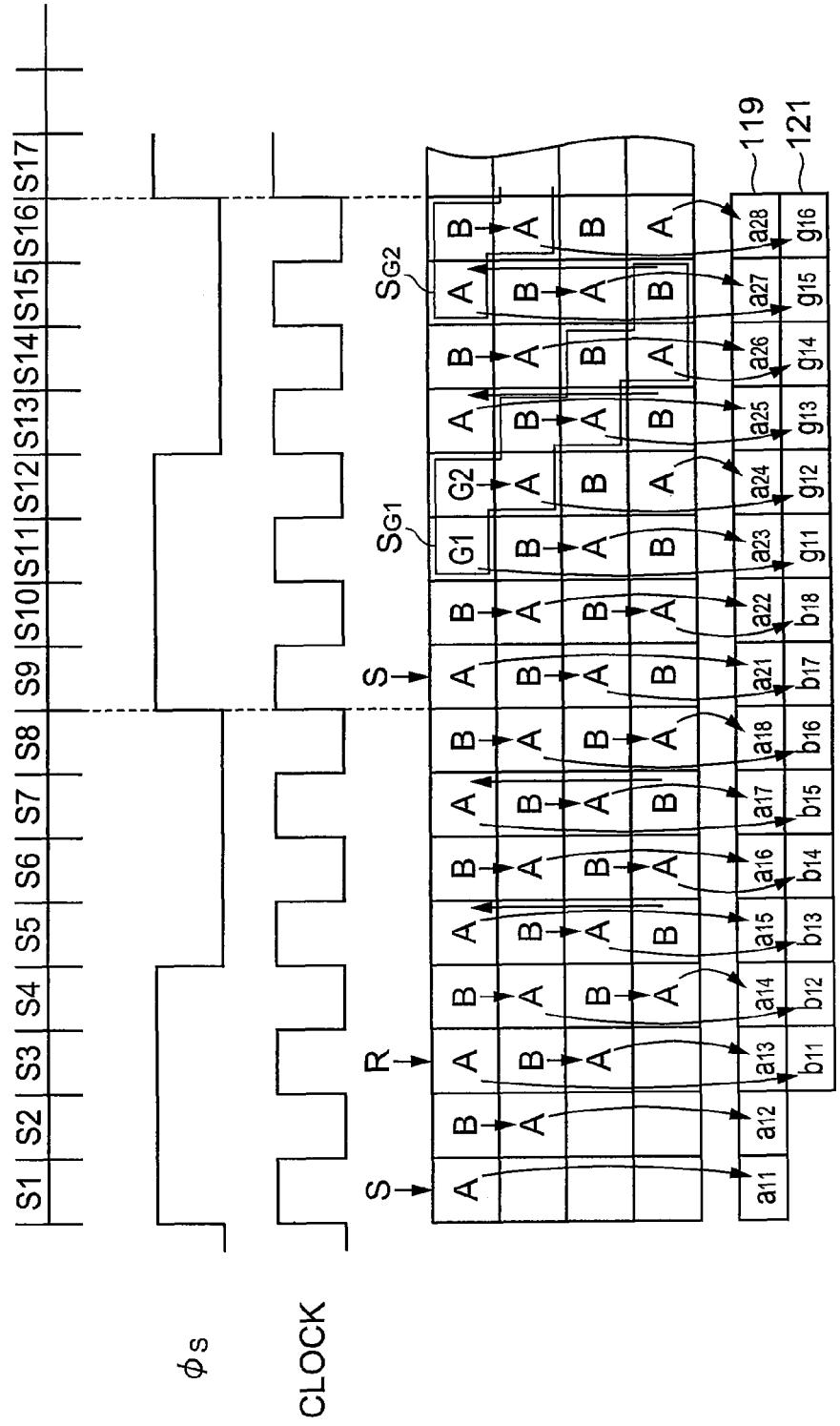
FIG. 32 illustrates a step of generating a correction value for correcting a finite gain difference of an operation amplification circuit in an A/D conversion stage.
Figure 33:
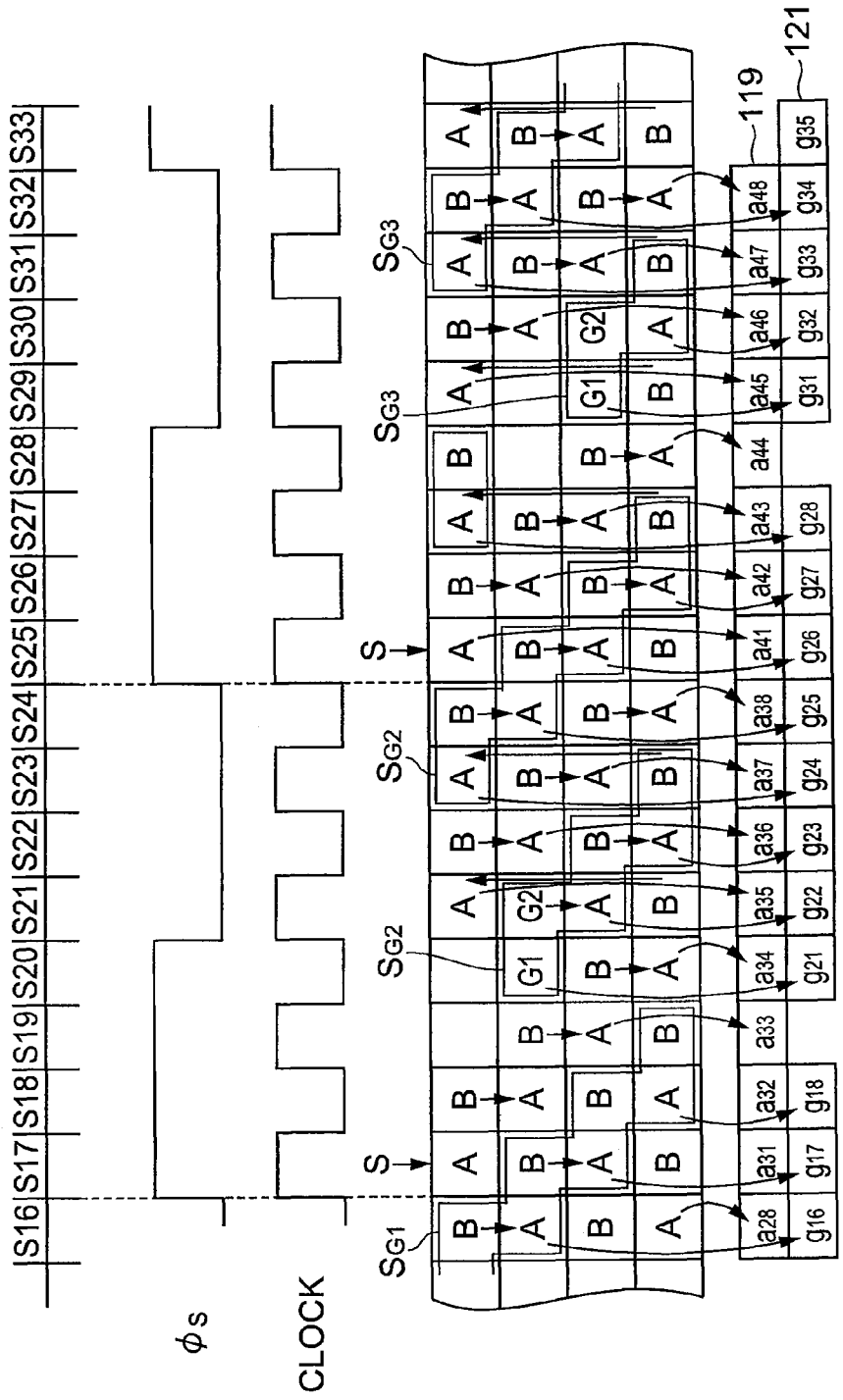
FIG. 33 illustrates a step of generating a correction value for correcting a finite gain difference of an operation amplification circuit in an A/D conversion stage.
Figure 34:
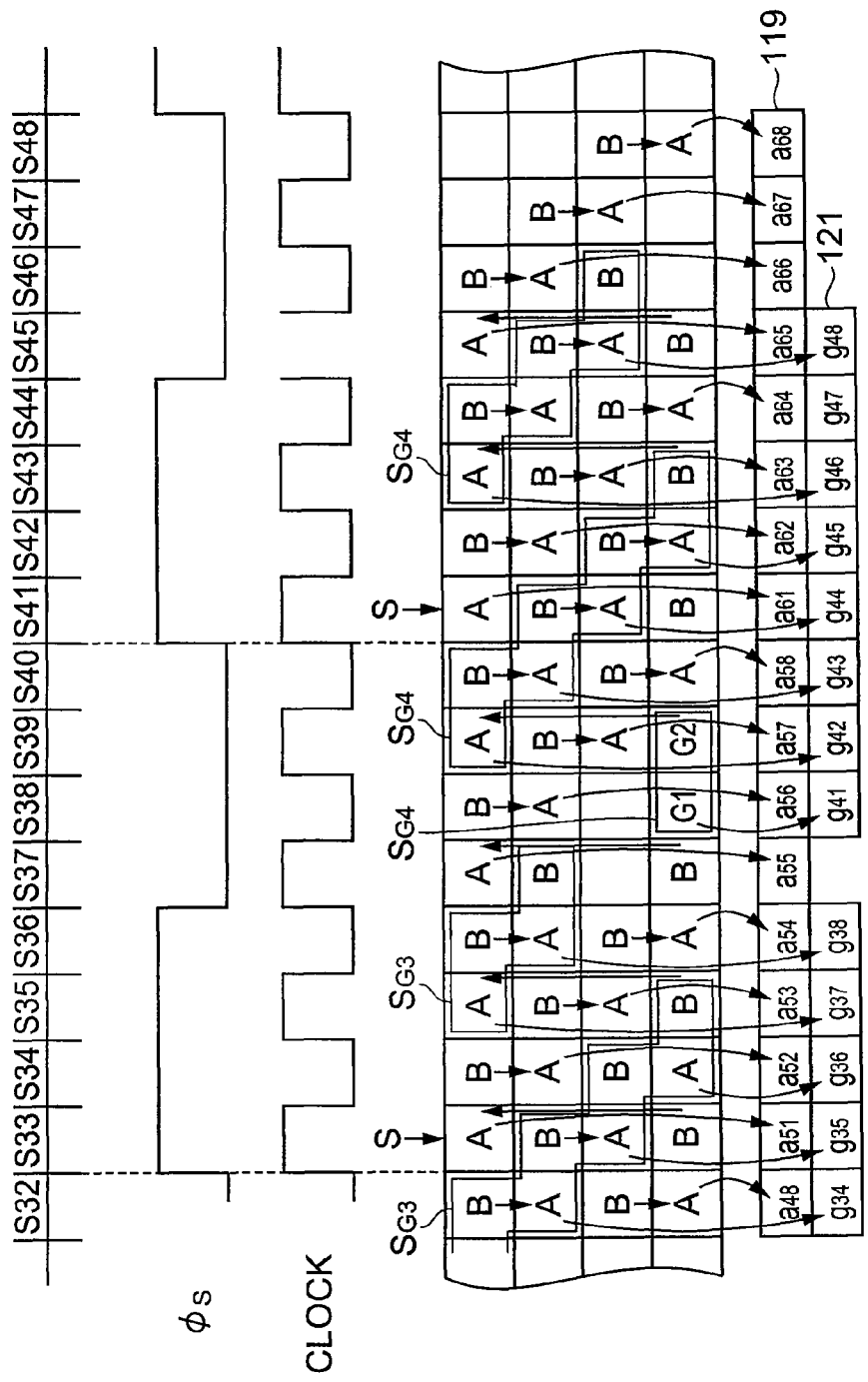
FIG. 34 illustrates a step of generating a correction value for correcting a finite gain difference of an operation amplification circuit in an A/D conversion stage.

FIGS. 32, 33, 34 illustrate the sequence for generating correction values for correcting a finite gain error of the operational amplification circuit in an A/D conversion stage. The steps S1 to S48 are shown with reference to FIGS. 32 to 34. In these steps, the operations G1, G2 are performed instead of operations M1, M2 shown in FIGS. 29 to 31. As a result, the conversion values of A/D conversion stages 151, 153, 155, 157 are generated as signals indicating the effect of finite gain of the operational amplification circuit. The signals are generated as digital values g11 to g18, g21 to g28, g31 to g38, g41 to g48 by procedures SG1 to SG4. These digital values are provided to the digital error correction circuit 116 and used for error correcting the A/D conversion values.

Figure 35:
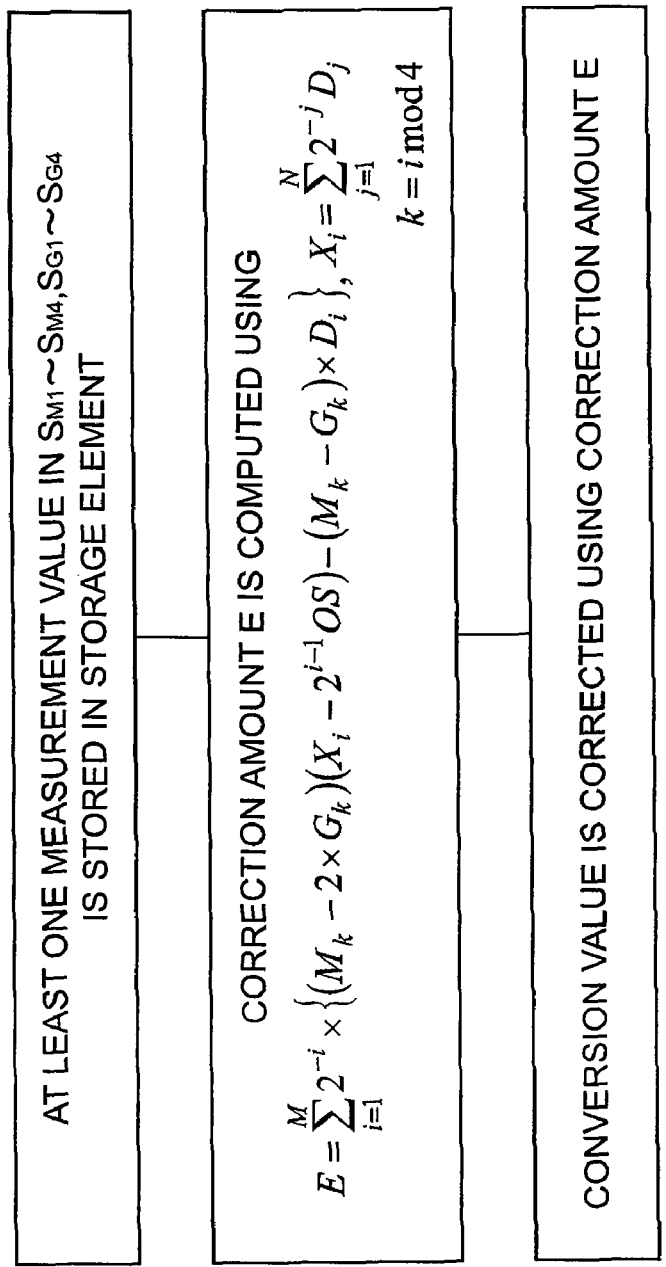
FIG. 35 is a flowchart for finding the correction values.

As shown in FIG. 35, a procedure is performed, if necessary, for correcting an error originating in the analog-digital converter 11b according to at least any one of the error measurement sequences shown in FIGS. 29 to 31 (and/or FIGS. 32 to 34). Once this sequence is completed, if necessary, the identical or another sequence is repeated. The error correction values obtained by these procedures are stored in a storage circuit (for example, registers 139a to 139d, 141a to 141d, 143) shown in FIG. 28 to be used for digital error correction. For example, the following computations are performed. In the computational formula shown in FIG. 35, the error of digital value is represented using an A/D conversion value X, a digital value OS of the S/H circuit offset and also the capacitor mismatch Mi and gain error Gi in the i-th A/D conversion stage. In this computational formula, the symbol X represents an A/D conversion value, "OS" indicates a digital value of the measured S/H stage offset, "Mi" is a capacitor mismatch error, and "Gi" is a gain error; k=i mod 4. In this computational formula, the symbol M indicates that the correction is performed from the most significant digit of the digital value to the M-th digit. Further, the symbol N indicates the order of the A/D conversion value used for digital correction and means that the values are used to the N-th order, counting from the most significant digit of the A/D conversion output. When redundant representation is used, a value of the redundant representation of the A/D conversion value is used. The symbol Di indicates the i-th value of the A/D conversion output (redundancy code), and when redundant representation is used, it can take three values: −1, 0, +1. In a cyclic A/D converter, an input signal in each A/D conversion stage is increased by a factor of two. Therefore, as the number of computation cycles increases, the effect of error is decreased. As a result, the M-th order is determined according to the value of error induced by capacitor mismatch or finite gain that is the object of correction.

In the embodiments of the present invention, a circuit of an entirely differential configuration can be used as the circuit configured, for example, by using a single-end circuit. Furthermore, a single-end circuit can be used for circuit configured using a circuit of an entirely differential configuration.

The background art relating to the fourth embodiment will be explained below. Background calibration is described in Non-Patent Document 6. Cyclic analog-digital converters are described in Patent Documents 3 and 4. A sample/hold (S/H) circuit is provided at the input of the cyclic analog-digital converter. The cyclic analog-digital converter includes two-stage circuit blocks connected in series. Patent Document 5 describes the digital correction of capacity.

Each circuit block in the cyclic analog-digital converter includes a MDAC circuit and a sub A/D conversion circuit. The input of the first-stage circuit block is connected via a switch to the output of the S/H circuit. The output of the second-stage circuit block is connected via a switch to the input of the first-stage circuit block. The sub A/D conversion circuit generates a two value (0, 1) A/D conversion result or a three-value (−1, 0, +1) A/D conversion result (digital value) at the output thereof. The MDAC circuit amplifies the input signal by a factor of two and performs any of the "Addition", "Subtraction", and "No Computation" actions for the reference value with respect to the digital value. The aforementioned operation is successively performed in each circuit block, and the output value of each circuit block is provided successively to the circuit block of the next stage in the loop. The operation is controlled by clock signals.

In the cyclic analog-digital converter, when an analog signal received from the S/H circuit is subjected to a two-value A/D conversion in each circuit block, a one-bit digital signal can be obtained for each circuit block. Further, when the three-value A/D conversion is performed in each circuit block, a 1.5-bit digital value can be obtained for each circuit block. Where cyclic operations of N clocks are performed using two-stage circuit blocks, the 2N-bit (two-value A/D conversion) and (2N+1)-bit (three-value A/D conversion) A/D conversions are performed. For example, when one-bit A/D conversion is performed for each stage, a 13-bit A/D conversion can be performed by 6.5-clock cyclic operations. When 1.5-bit A/D conversion is performed per one stage, 14-bit A/D conversion can be performed by 6.5-clock cyclic operations.

In the cyclic A/D converters described in Non-Patent Documents 3 to 5 and Patent Documents 3 to 4, no measures are taken against the offset voltage of the converter, fluctuations of the offset voltage, and finite gas of the amplifier, and although no difficulties are encountered in typical applications, problems arise in applications requiring very stable operation and high accuracy.

Furthermore, in Patent Document 5, digital correction of capacitance is described; in this system, the processing of finding a digital correction value prior to the A/D conversion is performed. In the background calibration described in Non-Patent Document 6, error correction is performed in a digital region by using pseudo-random numbers, and such a correction requires a complex circuit configuration.

With the fourth embodiment, an A/D conversion stage is provided in which the correction of errors relating to circuit elements can be performed with a simple configuration. Furthermore, with the fourth embodiment, an analog-digital converter including the A/D conversion stage can be provided. In addition, with the fourth embodiment, a method for generating a signal indicating a conversion difference in an A/D conversion stage and a method for generating a digital signal corresponding to an analog signal are provided.

While the principle of the present invention has been illustrated by reference to the preferred embodiments, it will be appreciated by those skilled in the art that the present invention can be modified in arrangement and details, without departing from the principle thereof. The present invention is not limited to the specific configuration described in the embodiments. Therefore the inventors demand the right in all the modifications and variations derived from the scope of the accompanying claims and the scope of the spirit of the invention.

The invention claimed is:

1. An analog-digital converter comprising:

first to N-th A/D conversion stages connected in series, each stage having a stage input and a stage output, each of the first to N-th A/D conversion stages including a sub A/D conversion circuit, a control circuit, a D/A converter and a gain stage, the sub A/D conversion circuit generating a digital signal of a predetermined number of bits in response to a signal from the stage input, the digital signal indicating a conversion result, the control circuit generating a control signal from the digital signal, the D/A converter generating a predetermined voltage in accordance with the control signal, the gain stage having a first input, a second input and an output, the first input of the gain stage receiving the signal from the stage input, the second input of the gain stage receiving one of the predetermined voltage and the signal from the stage input, the output of the gain stage being connected to the stage output, and the number "N" being 3 or 4;

an analog input for receiving an analog signal;

an input switch, connected between the analog input and the stage input of the first A/D conversion stage, for sampling first and second sample analog signals in first and second sampling periods, respectively;

a cyclic switch, connected between the stage input of the first A/D conversion stage and the stage output of the N-th A/D conversion stage, for providing a path from the N-th A/D conversion stage to the first A/D conversion stage in a cycle period, the cycle period being different from the first and second sampling periods; and a digital operational circuit, the digital operational circuit receiving the conversion result from each of the first to N-th A/D conversion stages, the digital operational circuit generating an A/D conversion digital code, and the A/D conversion digital code indicating a analog/digital conversion result;

wherein the gain stage has first and second capacitors and an operational amplification circuit, the gain stage stores electric charges from the stage input in the first and second capacitors, again stores an electric charge from the stage input in one of the first and second capacitors, rearranges the electric charges using the first and second capacitors and the operational amplification circuit in response to application of the predetermined voltage to one of the first and second capacitors, and rearranges the rearranged electric charges in the first and second capacitors in response to application of the predetermined voltage to another one of the first and second capacitors to generate the operational value in the output of the operational amplification circuit; and the gain stage comprises:

a first switch for connecting one terminal of the first capacitor to the stage input in a first period;

a second switch for connecting one terminal of the second capacitor to the stage input in the first period;

a third switch for connecting the one terminal of the first capacitor to the output of the operational amplification circuit in a second period, the second period being different from the first period;

a fourth switch, connected between the other terminal of the first capacitor and an inverting input of the operational amplification circuit, for disconnecting the other terminal of the first capacitor from the inverting input in a third period, the third period being between the first period and the second period; and a fifth switch, connected between the one terminal of the second capacitor and the output of the operational amplification circuit, for connecting the one terminal of the second capacitor to the output of the operational amplification circuit in a fourth period that is different from the first to third periods, and wherein the inverting input of the operational amplification circuit is connected to another terminal of the first capacitor and to another terminal of the second capacitor in the second period, and the output of the operational amplification circuit is connected to the stage output, and wherein the D/A converter provides the predetermined voltage to the one terminal of the second capacitor in the second period and provides the predetermined voltage to the one terminal of the first capacitor in the fourth period.

2. The analog-digital converter according to claim 1, wherein the number N of the series-connected first to N-th A/D conversion stages is 4;

the gain stage has first and second capacitors and an operational amplification circuit; and the gain stage stores electric charges from the stage input in the first and second capacitors, rearranges the electric charges stored in the first and second capacitors in response to application of the predetermined voltage to one of the first and second capacitors to generate an operational value in an output of the operational amplification circuit.

3. The analog-digital converter according to claim 2, wherein the gain stage includes:

a first switch for connecting one terminal of the first capacitor to the stage input in a first period;

a second switch for connecting one terminal of the second capacitor to the stage input in the first period; and a third switch for connecting the one terminal of the first capacitor to the output of the operational amplification circuit in a second period, the second period being different from the first period, wherein an inverting input of the operational amplification circuit is connected to another terminal of the first capacitor and to another terminal of the second capacitor in the second period, and the output of the operational amplification circuit is connected to the stage output, and wherein the D/A converter provides the predetermined voltage to the one terminal of the second capacitor in the second period.

4. The analog-digital converter according to any one of claims 2, 3 and 1, wherein the digital operational circuit includes:

first to fourth storage circuits for storing digital signals from the first to fourth A/D conversion stages, respectively, the digital signals being divided into first and second data groups, the first data group being composed of the digital signals associated with the first sample analog signal, and the second data group being composed of the digital signals associated with the second sample analog signal;

a first circuit, connected to the first to fourth storage circuits, for generating a first digital code by using the digital signals of the first data group, the first digital code being associated with the first sample analog signal;

a second circuit, connected to the first to fourth storage circuits, for generating a second digital code by using the digital signals of the second data group, the second digital code being associated with the second sample analog signal; and a correction circuit for correcting one of the first and second digital codes using another of the first and second digital codes to generate the A/D conversion digital code.

5. The analog-digital converter according to claim 2, wherein the gain stage in each A/D conversion stage generates a mismatch value in the output of the operational amplification circuit, the mismatch value indicates an error due to mismatch in capacitance of the first capacitor and the second capacitor; and each of the first to fourth A/D conversion stages provides an operation signal for the mismatch value in the cycle period.

6. The analog-digital converter according to claim 5, wherein the gain stage has first and second mismatch correction operations;

in the first mismatch correction operation, an input and the output of the operational amplification circuit and the second capacitor are connected to each other to equalize electric potentials of the operational amplification circuit and the second capacitor, an electric charge is stored in the first capacitor in response to application of a reference signal to the first capacitor, and the D/A converter provides the reference signal; and in the second mismatch correction operation, the electric charge is rearranged in the first and second capacitors in response to application of the reference signal to the second capacitor to generate the mismatch value in the output of the operational amplification circuit.

7. The analog-digital converter according to claim 5, wherein the first and second capacitors are connected to the stage input in a first period to sample the analog signal;

wherein the D/A converter provides the predetermined voltage to one terminal of the second capacitor in a second period for processing the analog signal, provides one terminal of the second capacitor with a reference potential in a third period for receiving a signal for compensating the mismatch in capacitance, provides a reference voltage to the one terminal of the first capacitor in the third period, and provides the reference voltage to the one terminal of the second capacitor in the fourth period for processing the signal for compensating the mismatch in capacitance; and wherein the gain stage includes:

a feedback switch for connecting an inverting input of the operational amplification circuit to the output of the operational amplification circuit in the first and third periods; and a first switch for connecting the one terminal of the first capacitor to the output of the operational amplification circuit in the second and fourth periods.

8. The analog-digital converter according to claim 2, wherein the gain stage in each A/D conversion stage generates a gain error value in the output of the operational amplification circuit, and the gain error value indicates an finite gain error due to a finite gain of the operational amplification circuit; and wherein each of the first to fourth A/D conversion stages generates an operational value for the gain error value in the cycle period.

9. The analog-digital converter according to claim 8, wherein the gain stage has first and second finite gain correction operations;

in the first finite gain correction operation, the input and the output of the operational amplification circuit are connected to each other to equalize an electric potential of the operational amplification circuit, and electric charges are stored in the first and second capacitors in response to application of a reference signal to the first and second capacitors, and the D/A converter provides the reference signal;

in the second finite gain correction operation, the first capacitor is connected to the input and the output of the operational amplification circuit to rearrange the electric charges in the first and second capacitors in response to application of the reference signal to the second capacitor, and the gain error value is generated in the output of the operational amplification circuit.

10. The analog-digital converter according to claim 8, wherein the first and second capacitors are connected to the stage input in a first period for sampling the analog signal;

the D/A converter provides the predetermined voltage to one terminal of the second capacitor in a second period for processing the analog signal, provides a reference voltage to the one terminal of the second capacitor in a third period for receiving a signal for compensating the finite gain error and a fourth period for processing the signal for compensating the finite gain error, and provides the reference signal to one terminal of the first capacitor in the third period; and wherein the gain stage includes:

a feedback switch for connecting an inverting input of the operational amplification circuit to the output of the operational amplification circuit in the first and third periods; and a first switch for connecting the one terminal of the first capacitor to the output of the operational amplification circuit in the second and fourth periods.

11. The analog-digital converter according to claim 2, wherein, in each of the first to fourth A/D conversion stages, the first and second capacitors are connected to the stage input in a first period for sampling the analog signal;

the D/A converter provides the predetermined voltage to one terminal of the second capacitor in a second period for processing the analog signal, provides the one terminal of the second capacitor with a reference potential in a third period for receiving a signal for compensating the mismatch in capacitance, provides a reference voltage to the one terminal of the second capacitor in a fourth period for processing the signal for compensating the mismatch in capacitance, a fifth period for receiving a signal for compensating the finite gain error, and a sixth period for processing the signal for compensating the finite gain error, and provides the reference voltage to one terminal of the first capacitor in the fifth period and the third period; and the gain stage includes:

a feedback switch for connecting an inverting input of the operational amplification circuit to the output of the operational amplification circuit in the first, third, and fifth periods; and a first switch for connecting the one terminal of the first capacitor to the output of the operational amplification circuit in the second, fourth, and sixth periods.

12. The analog-digital converter according to any one of claims 5 to 11, wherein
the digital operational circuit generates a correction digital code, and corrects a digital code by using the correction digital code, the digital code is associated with the analog signal and is generated from the digital signals from the first to fourth A/D conversion stages, and the correction digital code represents an error due to at least one from among an offset of a sample/hold circuit, a noise caused by a feedback switching of the sample/hold circuit, the mismatch in capacitance in the first to fourth A/D conversion stages, and the finite gain error of each gain stage of the first to fourth A/D conversion stages.

13. The analog-digital converter according to claim 1,
wherein the number "N" of the series-connected first to N-th A/D conversion stages is 3;
the gain stage has a first to third capacitors and an operational amplification circuit; and
the gain stage stores electric charges from the stage input in the first and second capacitors, the electric charges are rearranged in the first and second capacitors in response to application of the predetermined voltage to the first capacitor to generate an operational result in the output of the operational amplification circuit, the gain stage stores an electric charge in the third capacitor, this electric charge being associated with the operational result, the rearranged electric charges are rearranged in the first to third capacitor in response to application of the predetermined voltage to the second capacitor to generate the operational value in the output of the operational amplification circuit.

14. The analog-digital converter according to claim 13,
wherein the gain stage includes:
a first switch for connecting one terminal of the first capacitor to the stage input in a first period;
a second switch for connecting one terminal of the second capacitor to the stage input in the first period;
a third switch, connected between the one terminal of the second capacitor and the output of the operational amplification circuit, for connecting the one terminal of the second capacitor to the output of the operational amplification circuit in a second period, the second period being different from the first period;
a fourth switch, connected between the one terminal of the first capacitor and the output of the operational amplification circuit, for connecting the one terminal of the first capacitor to the output in a third period, the third period being different from the first and second periods;
a fifth switch, connected between one terminal of the third capacitor and the inverting input of the operational amplification circuit, for connecting the one terminal of the third capacitor to the inverting input of the operational amplification circuit in the third period; and
a sixth switch, connected between the one terminal of the third capacitor and a reference potential line, for providing the reference potential to the one terminal of the third capacitor in the first and second periods;
wherein the inverting input of the operational amplification circuit is connected to another terminal of the first capacitor and to another terminal of the second capacitor, and the output of the operational amplification circuit is connected to another terminal of the third capacitor and to the stage output; and
wherein the D/A converter provides the predetermined voltage to the one terminal of the first capacitor in the second period, and provides the predetermined voltage to the one terminal of the second capacitor in the third period.

15. The analog-digital converter according to claim 13 or 14,
wherein the digital operational circuit includes:
first to third storage circuits for storing digital signals from the first to third A/D conversion stages, respectively, the digital signals being divided into first and second data groups, the first data group being composed of the digital signals associated with the first sample analog signal, and the second data group being composed of the digital signals associated with the second sample analog signal;
a first circuit, connected to the first to third storage circuits, for generating a first digital code by using the digital signals of the first data group, the first digital code being associated with the first sample analog signal;
a second circuit, connected to the first to third storage circuits, for generating a second digital code by using the digital signals of the second data group, the second digital code being associated with the second sample analog signal; and
a correction circuit for correcting one of the first and second digital codes using another of the first and second digital codes to generate the A/D conversion digital code.

16. The analog-digital converter according to claim 1, wherein the sub A/D conversion circuit comprises a comparator, the comparator compares a signal from the stage input with a predetermined reference signal, and the sub A/D conversion circuit provides a comparison result signal.

17. The analog-digital converter according to claim 1, wherein the sub A/D conversion circuit compares a signal from the stage input with two predetermined reference signals to generate a three-value redundant digital signal.

18. The analog-digital converter according to claim 1, further comprising
a sample/hold circuit having an input that receives an input analog signal, and an output that provides the analog signal to the analog input, the sample/hold circuit comprising an operational amplification circuit, the operational amplification circuit having an inverting input, a non-inverting output and a feedback switch, and the feedback switch being connected between the inverting input and the non-inverting output.

19. The analog-digital converter according to claim 18, wherein the operational amplification circuit of the sample/hold circuit further comprises a non-inverting input and an inverting output; and the sample/hold circuit comprises another feedback switch connected between the non-inverting input of the operational amplification circuit and the inverting output of the operational amplification circuit.

20. An analog-digital converter comprising:
first to N-th A/D conversion stages connected in series, each stage having a stage input and a stage output, each of the first to N-th A/D conversion stages including a sub A/D conversion circuit, a control circuit, a D/A converter and a gain stage, the sub A/D conversion circuit generating a digital signal of a predetermined number of bits in response to a signal from the stage input, the digital signal indicating a conversion result, the control circuit generating a control signal from the digital signal, the D/A converter generating a predetermined voltage in accordance with the control signal, the gain stage having a first input, a second input and an output, the first input of the gain stage receiving the signal from the stage input, the second input of the gain stage receiving one of the predetermined voltage and the signal from the stage input, the output of the gain stage being connected to the stage output, and the number "N" being 3 or 4;

an analog input for receiving an analog signal;

an input switch, connected between the analog input and the stage input of the first A/D conversion stage, for sampling first and second sample analog signals in first and second sampling periods, respectively;

a cyclic switch, connected between the stage input of the first A/D conversion stage and the stage output of the N-th A/D conversion stage, for providing a path from the N-th A/D conversion stage to the first A/D conversion stage in a cycle period, the cycle period being different from the first and second sampling periods;

a digital operational circuit, the digital operational circuit receiving the conversion result from each of the first to N-th A/D conversion stages, the digital operational circuit generating an A/D conversion digital code, and the A/D conversion digital code indicating a analog/digital conversion result; and a sample/hold circuit having an input that receives an input analog signal, and an output that provides the analog signal to the analog input, the sample/hold circuit comprising an operational amplification circuit, the operational amplification circuit having an inverting input, a non-inverting output and a feedback switch, and the feedback switch being connected between the inverting input and the non-inverting output;

wherein one of the first and second sample analog signals is prepared as the input analog signal, and the feedback switch of the sample/hold circuit is opened in the entire period of one of the first and second sampling periods.

21. The analog-digital converter according to claim 20, wherein the feedback switch of the sample/hold circuit is closed in another of the first and second sampling periods; and another of the first and second sample analog signals is provided after the feedback switch of the sample/hold circuit is opened.

22. An A/D conversion stage comprising:

a stage input;

a stage output;

a sub A/D conversion circuit that generates a digital signal in response to an analog signal from the stage input, the digital signal indicating a conversion result of a predetermined number of bits;

a control circuit that generates a control signal, the control signal being associated with the digital signal; and a gain stage having a first input, a second input and an output, the first input receiving an analog signal from the stage input, the second input receiving the control signal, and the output being connected to the stage output, the gain stage including:

a first capacitor having one terminal and another terminal;

a second capacitor having one terminal and another terminal;

a first sampling switch for connecting the one terminal of the first capacitor to the stage input in a first period for sampling the analog signal;

a second sampling switch for connecting the one terminal of the second capacitor to the stage input in the first period;

an operational amplification circuit having an inverting input and an output, the inverting input being connected to the other terminal of the first capacitor and to the other terminal of the second capacitor, and the output being connected to the stage output;

a D/A converter having first and second outputs, the first and second outputs being connected to the one terminal of the first capacitor and the one terminal of the second capacitor, respectively, the D/A converter providing a predetermined voltage to the one terminal of the second capacitor in a second period for processing the analog signal, the predetermined voltage being associated with the control signal, the D/A converter providing the one terminal of the second capacitor with a reference potential in a third period for receiving a signal for compensating mismatch in capacitance, the D/A converter providing a reference voltage to the one terminal of the second capacitor in a fourth period for processing the signal for compensating the mismatch in capacitance, a fifth period for receiving a signal for correcting a finite gain, and a sixth period for processing the signal for correcting a finite gain, and the D/A converter providing the reference voltage to the one terminal of the first capacitor in the fifth period and the third period;

a feedback switch for connecting the inverting input to the output of the operational amplification circuit in the first, third, and fifth periods; and a first switch for connecting the one terminal of the first capacitor to the output of the operational amplification circuit in the second, fourth, and sixth periods.

23. An A/D conversion stage comprising:

a stage input;

a stage output;

a sub A/D conversion circuit that generates a digital signal in response to application of an analog signal from the stage input, the digital signal indicating a conversion result of a predetermined number of bits;

a control circuit that generates a control signal, the control signal being associated with the digital signal; and a gain stage having a first input, a second input and an output, the first input receiving an analog signal from the stage input, the second input receiving the control signal, and the output being connected to the stage output, the gain stage including:

a first capacitor having one terminal and another terminal;

a second capacitor having one terminal and another terminal;

a first sampling switch for connecting the one terminal of the first capacitor to the stage input in a first period for sampling the analog signal;

a second sampling switch for connecting the one terminal of the second capacitor to the stage input in the first period;

an operational amplification circuit having an inverting input and an output, the inverting input being connected to the other terminal of the first capacitor and to the other terminal of the second capacitor, and the output being connected to the stage output;

a D/A converter having first and second outputs, the first and second outputs being connected to the one terminal of the first capacitor and the one terminal of the second capacitor, respectively, the D/A converter providing a predetermined voltage to the one terminal of the second capacitor in a second period for processing the analog signal, the predetermined voltage being associated with the control signal, the D/A converter providing the one terminal of the second capacitor with a reference potential in a third period for receiving a signal for compensating mismatch in capacitance, the D/A converter providing a reference voltage to the one terminal of the first capacitor in the third period, and the D/A converter providing the reference voltage to the one terminal of the second capacitor in a fourth period for processing the signal for compensating the mismatch in capacitance;

a feedback switch for connecting the inverting input to the output of the operational amplification circuit in the first and third periods; and a first switch for connecting the one terminal of the first capacitor to the output of the operational amplification circuit in the second and fourth periods.

24. An A/D conversion stage comprising:

a stage input;

a stage output;

a sub A/D conversion circuit that generates a digital signal in response to a signal from the stage input, the digital signal indicating a conversion result of a predetermined number of bits;

a control circuit that generates a control signal, the control signal being associated with the digital signal; and a gain stage having a first input, a second input and an output, the first input receiving an analog signal from the stage input, the second input receiving the control signal, and the output being connected to the stage output, the gain stage including:

a first capacitor having one terminal and another terminal;

a second capacitor having one terminal and another terminal;

a first sampling switch for connecting the one terminal of the first capacitor to the stage input in a first period for sampling the analog signal;

a second sampling switch for connecting the one terminal of the second capacitor to the stage input in the first period;

an operational amplification circuit having an inverting input and an output, the inverting input being connected to the other terminal of the first capacitor and to the other terminal of the second capacitor, and the output being connected to the stage output;

a D/A converter having first and second outputs, the first and second outputs being connected to the one terminal of the first capacitor and the one terminal of the second capacitor, respectively, the D/A converter providing a predetermined voltage to the one terminal of the second capacitor in a second period for processing the analog signal, the predetermined voltage being associated with the control signal, the D/A converter providing a reference signal to the one terminal of the second capacitor in a third period for receiving a signal for compensating a finite gain error and a fourth period for processing the signal for compensating the finite gain error, and the D/A converter providing the reference signal to the one terminal of the first capacitor in the third period;

a feedback switch for connecting the inverting input to the output of the operational amplification circuit in the first and third periods; and a first switch for connecting the one terminal of the first capacitor to the output of the operational amplification circuit in the second and fourth periods.

25. A method of generating a digital signal corresponding to an analog signal by using a gain stage, the gain stage comprising first and second capacitors and an operational amplification circuit, the method comprising the steps of:

(a) generating a digital signal having a digital value of a predetermined number of bits, the digital signal being associated with one of first and second input analog signals;

(b) storing an electric charge in the first capacitor and an electric charge in the second capacitor, the electric charges being associated with the first input analog signal;

(c) after the electric charges has been stored in the first and second capacitors, holding the electric charge in one of the first capacitor and the second capacitor, and sampling the second input analog signal to store an electric charge in another of the first capacitor and the second capacitor, and the electric charge being associated with the second input analog signal;

(d) after the sampling has been performed for the first and second capacitors, connecting the first capacitor between an output of the operational amplification circuit and an inverting input of the operational amplification circuit, and supplying a conversion analog signal to one terminal of the second capacitor to generate a first conversion value for the output of the operational amplification circuit and to rearrange the electric charges stored in the first and second capacitors, the conversion analog signal being associated with the digital signal; and (e) after the sampling has been performed in the first and second capacitors, connecting the second capacitor between the output and the inverting input of the operational amplification circuit, and supplying the conversion analog signal to one terminal of the first capacitor to generate a second conversion value for the output of the operational amplification circuit and to rearrange the electric charges stored in the first and second capacitors.

26. The method according to claim 25, further comprising the steps of:

sampling a signal to a sample/hold circuit, bringing the sample/hold circuit to a holding operation state to hold the sampled signal, and providing the held signal as one of the first and second sample analog signals, the sample/hold circuit having an operational amplification circuit; and closing a switch connected between an input of the operational amplification circuit of the sample/hold circuit and an output of the operational amplification circuit of the sample/hold circuit, opening the closed switch to bring the sample/hold circuit to a holding operation state, and preparing the held signal as another one of the first and second sample analog signals.

27. A method of generating a digital signal corresponding to an analog signal by using first to fourth A/D conversion stages, each of the first to fourth A/D conversion stages comprising first and second capacitors and an operational amplification circuit, the method comprising the steps of:

(a) performing a predetermined conversion operation of an analog signal sampled in the first A/D conversion stage to generate a first conversion result in the first A/D conversion stage, performing a predetermined sampling operation of an first analog signal in the second A/D conversion stage, performing the predetermined conversion operation of an analog signal sampled in the third A/D conversion stage to generate a second conversion result in the third A/D conversion stage, and performing the predetermined sampling operation of an second analog signal in the fourth A/D conversion stage, the first analog signal being associated with the first conversion result, and the second analog signal being associated with the second conversion result;

(b) performing the predetermined conversion operation of an analog signal sampled in the fourth A/D conversion stage to generate a third conversion result in the fourth A/D conversion stage, performing the predetermined sampling operation of an third analog signal in the first A/D conversion stage, performing the predetermined conversion operation of an analog signal sampled in the second A/D conversion stage to generate a fourth conversion result in the second A/D conversion stage, and performing the predetermined sampling operation of an fourth analog signal in the third A/D conversion stage, the third analog signal being associated with the third conversion result, and the fourth analog signal being associated with the fourth conversion result; and (c) repeating the step (a) and the step (b), wherein the predetermined sampling operation comprises the step of storing electric charges in the first capacitor and the second capacitor, the electric charges being associated with an input analog signal supplied to the relevant A/D conversion stage; and wherein the predetermined conversion operation comprises the step of connecting the first capacitor between an output of the operational amplification circuit and an inverting input of the operational amplification circuit, and supplying a conversion analog signal to one terminal of the second capacitor to generate a conversion value in the output of the operational amplification circuit and rearrange the electric charges stored in the first and second capacitors, the conversion analog signal being associated with a digital signal, and the digital signal indicating an A/D conversion result in the relevant A/D conversion stage.

28. The method according to claim 27, comprising the steps of:

prior to the steps (a) and (b), receiving a first sample analog signal in the first A/D conversion stage, and performing the predetermined sampling operation of the first sample analog signal;

performing the predetermined conversion operation of an analog signal sampled in the first A/D conversion stage to generate a fifth conversion result in the first A/D conversion stage, and performing the predetermined sampling operation of an fifth analog signal in the second A/D conversion stage, the fifth analog signal being associated with the fifth conversion result;

receiving a second sample analog signal in the first A/D conversion stage, performing the predetermined sampling operation of the second sample analog signal, performing the predetermined conversion operation of an analog signal sampled in the second A/D conversion stage to generate a sixth conversion result in the second A/D conversion stage, and performing the predetermined sampling operation of a six analog signal in the third A/D conversion stage, the six analog signal being associated with the sixth conversion result.

29. A method of generating a digital signal corresponding to an analog signal by using first to fourth A/D conversion stages, each of the first to fourth A/D conversion stages having first and second capacitors and an operational amplification circuit, the method comprising the steps of:

(a) performing a first conversion operation of an analog signal sampled in the first A/D conversion stage to generate a first conversion result in the first A/D conversion stage, performing a first sampling operation of a first analog signal in the second A/D conversion stage, performing the first conversion operation of an analog signal sampled in the third A/D conversion stage to generate a second conversion result in the third A/D conversion stage, and performing the first sampling operation of a second analog signal in the fourth A/D conversion stage, the first analog signal being associated with the first conversion result, and the second analog signal being associated with the second conversion result;

(b) performing a second conversion operation in the first A/D conversion stage to generate a third conversion result in the first A/D conversion stage after the first conversion operation in the first A/D conversion stage, performing a second sampling operation of a third analog signal in the second A/D conversion stage, performing the second conversion operation in the third A/D conversion stage to generate a fourth conversion result in the third A/D conversion stage after the first conversion operation in the third A/D conversion stage, and performing the second sampling operation of a fourth analog signal in the fourth A/D conversion stage, the third analog signal being associated with the third conversion result, and the fourth analog signal being associated with the fourth conversion result;

(c) performing the first conversion operation of an analog signal sampled in the second A/D conversion stage to generate a fifth conversion result, performing the first sampling operation of an fifth analog signal in the third A/D conversion stage, performing the first conversion operation in the fourth A/D conversion stage to generate a sixth conversion result in the fourth A/D conversion stage, and performing the first sampling operation of a sixth analog signal in the first A/D conversion stage, the fifth analog signal being associated with the fifth conversion result, and the sixth analog signal being associated with the sixth conversion result;

(d) performing the second conversion operation to generate a seventh conversion result after the first conversion operation in the second A/D conversion stage, performing the second sampling operation of a seventh analog signal in the third A/D conversion stage, performing the second conversion operation in the fourth A/D conversion stage to generate an eighth conversion result in the fourth A/D conversion stage after the first conversion operation in the fourth A/D conversion stage, and performing the second sampling operation in the first A/D conversion stage of a eighth analog signal, the seventh analog signal being associated with the seventh conversion result, and the eighth analog signal being associated with the eighth conversion result, wherein the first sampling operation comprises the step of storing an electric charge in the first capacitor and storing an electric charge in the second capacitor, the electric charge corresponding to a first input analog signal;

wherein the second sampling operation comprises the step of, prior to rearranging the electric charges of the first and second capacitors, holding an electric charge of one of the first capacitor and the second capacitor, and sampling an electric charge in another of the first capacitor and the second capacitor, this electric charge corresponding to a second analog signal;

wherein the first conversion operation comprises the step of connecting the first capacitor between the output of the operational amplification circuit and an inverting input of the operational amplification circuit, and supplying a conversion analog signal to another terminal of the second capacitor to generate a first conversion value for a subsequent A/D conversion stage in the output of the operational amplification circuit and to rearrange the electric charges of the first and second capacitors, the first conversion value being associated with a first input analog signal, the conversion analog signal being associated with a digital signal, and the digital signal indicating an A/D conversion result in the relevant A/D conversion stage; and wherein the second conversion operation comprises the step of connecting the second capacitor between the output of the operational amplification circuit and the inverting input of the operational amplification circuit, and supplying a conversion analog signal to the other terminal of the first capacitor to generate a second conversion value for a subsequent A/D conversion stage in the output of the operational amplification circuit and to rearrange the electric charges of the first and second capacitors, the second conversion value being associated with a second input analog signal, the conversion analog signal being associated with a digital signal, and the digital signal indicating an A/D conversion result in the relevant A/D conversion stage.

30. The method according to claim 29, further comprising a step of successively repeating the step (a) to the step (d).

31. The method according to claim 29, comprising the steps of:

prior to the steps (a) to (d), receiving a first sample analog signal in the first A/D conversion stage and successively performing the first and second sampling operations of the first sample analog signal;

performing a first conversion operation of an analog signal sampled in the first A/D conversion stage to generate a ninth conversion result in the first A/D conversion stage, and performing a first sampling operation of a ninth analog signal in the second A/D conversion stage, the ninth analog signal corresponding to the ninth conversion result;

after the first conversion operation in the first A/D conversion stage, performing a second conversion operation in the first A/D conversion stage to generate a tenth conversion result in the first A/D conversion stage, and performing a second sampling operation of a tenth analog signal in the second A/D conversion stage, the tenth analog signal being associated with the tenth conversion result;

receiving a second sample analog signal in the first A/D conversion stage, performing the first sampling operation of the second sample analog signal, performing the first conversion operation of an analog signal sampled in the second A/D conversion stage to generate an eleventh conversion result in the second A/D conversion stage, and performing the first sampling operation of an eleventh analog signal in the third A/D conversion stage, the eleventh analog signal being associated with the eleventh conversion result; and performing the second sampling operation of the second sample analog signal in the first A/D conversion stage, and after the first conversion operation in the second A/D conversion stage, performing the second conversion operation in the second A/D conversion stage to generate a twelfth conversion result in the second A/D conversion stage, and performing a second sampling operation of a twelfth analog signal in the third A/D conversion stage, the twelfth analog signal being associated with the twelfth conversion result.

32. The method according to claim 29, comprising the steps of:

sampling a signal to a sample/hold circuit, then holding the sampled signal in the sample/hold circuit, and generating one of the first and second sample analog signals in the sample/hold circuit, the sample/hold circuit having an operational amplification circuit; and closing a switch connected between an input and an output of the operational amplification circuit, opening the closed switch to bring the sample/hold circuit to a holding operation stage to hold a signal, and preparing the held signal as another one of the first and second sample analog signals.

33. A method of generating a digital signal corresponding to an analog signal by using first to third AM conversion stages, each of the first to third A/D conversion stages including an operational amplification circuit, first and second capacitors and a third capacitor, each of the first and second capacitors having one terminal connected to an inverting input of the operational amplification circuit, and the third capacitor having one terminal connected to an output of the operational amplification circuit, the method comprising the steps of:

(a) performing a first conversion operation of an analog signal sampled in the first A/D conversion stage to generate a first conversion value for the first A/D conversion stage, and after the first conversion operation in the second A/D conversion stage, performing a second conversion operation in the second A/D conversion stage to generate a second conversion value for the second A/D conversion stage, and in the third A/D conversion stage, performing a sampling operation of an analog signal associated with the second conversion value;

(b) after the first conversion operation in the first A/D conversion stage, performing a second conversion operation in the first A/D conversion stage to generate a second conversion value for the first A/D conversion stage, performing the sampling operation of an analog signal associated with the second conversion value in the second A/D conversion stage, performing the first conversion operation of an analog signal sampled in the third A/D conversion stage to generate a first conversion value for the third A/D conversion stage;

(c) performing the first conversion operation of an analog signal sampled in the second A/D conversion stage to generate a first conversion value for the second A/D conversion stage, performing the second conversion operation in the third A/D conversion stage to generate a second conversion value in the third A/D conversion stage, and in the first A/D conversion stage, performing the sampling operation of an analog signal associated with the second conversion value, wherein the sampling operation comprises a step of storing electric charges in the first capacitor and the second capacitor, the electric charges being associated with an analog signal inputted to the relevant A/D conversion stage;

wherein the first conversion operation comprises the steps of connecting the second capacitor between the output and the inverting input of the operational amplification circuit, and supplying a conversion analog signal to the other terminal of the first capacitor to generate the first conversion value in the output of the operational amplification circuit and rearrange the electric charges in the first and second capacitors and to store an electric charge in the third capacitor, the electric charge being associated with the first conversion value, the conversion analog signal being associated with a digital signal, and the digital signal indicating an A/D conversion result in the relevant A/D conversion stage; and the second conversion operation comprises the step of connecting the first and third capacitors between the output of the operational amplification circuit and the inverting input of the operational amplification circuit, and supplying a conversion analog signal to another terminal of the second capacitor to generate the second conversion value for the output of the operational amplification circuit and to rearrange the electric charges of the first, second and third capacitors, the conversion analog signal being associated with a digital signal, and the digital signal indicating an A/D conversion result in the relevant A/D conversion stage.

34. The method according to claim 33, further comprising a step of successively repeating the step (a) to the step (c).

35. The method according to claim 33, comprising the steps of:
prior to the steps (a) to (c), receiving a first sample analog signal in the first A/D conversion stage and performing the sampling operation with respect to the first sample analog signal;
prior to the steps (a) to (c), performing the first and second conversion operations of an analog signal sampled in the first A/D conversion stage, and, in the relevant second A/D conversion stage, performing a sampling operation of an analog signal associated with a conversion value obtained in the second conversion operation; and
prior to the steps (a) to (c), receiving a second sample analog signal in the first A/D conversion stage, performing the sampling operation of the second sample analog signal, and performing the first conversion operation of an analog signal sampled in the second A/D conversion stage.

36. The method according to claim 33, further comprising the steps of:
sampling a signal to a sample/hold circuit, then holding the sampled signal in the sample/hold circuit, and generating one of the first and second sample analog signals in the sample/hold circuit, the sample/hold circuit having an operational amplification circuit; and
closing a switch connected between an input and an output of the operational amplification circuit of the sample/hold circuit, opening the closed switch to bring the sample/hold circuit to a holding operation state to hold a signal, and preparing the held signal as another one of the first and second sample analog signals.

37. A method of generating a signal indicating a conversion error in an A/D conversion stage for generating a digital signal corresponding to an analog signal, the A/D conversion stage including first and second capacitors and an operational amplification circuit, the operational amplification circuit having an inverting input connected to one terminal of the first and second capacitors, and the conversion error being associated with mismatch in capacitance of the first and second capacitors,
the method comprising the steps of:
(a) connecting an output of the operational amplification circuit and the inverting input of the operational amplification circuit with each other and connecting another terminal of the second capacitor to a reference potential line, and applying a reference voltage to the other terminal of the first capacitor to generate a first conversion value in the output of the operational amplification circuit and arrange electric charges in the first and second capacitors; and
(b) connecting the first capacitor between an output and the inverting input of the operational amplification circuit and applying the reference voltage to the other terminal of the second capacitor to generate a second conversion value in the output of the operational amplification circuit and rearrange electric charges in the first and second capacitors.

38. A method of generating a digital signal corresponding to an analog signal by using four A/D conversion stages STG1, STG2, STG3, STG4 connected in a loop, each of these A/D conversion stages including first and second capacitors and an operational amplification circuit, the operational amplification circuit having an inverting input connected to one terminal of the first and second capacitors, and each A/D conversion stage generating a signal of a digital value in the relevant A/D conversion stage;
the method comprising the steps of:
(a) connecting another terminal of the second capacitor to a reference potential line, connecting an output of the operational amplification circuit and the inverting input of the operational amplification circuit with each other, and applying a reference voltage to another terminal of the first capacitor to arrange electric charges in the first and second capacitors of the A/D conversion stage STG1, and further performing a predetermined conversion operation of an analog signal in the A/D conversion stage STG2 to generate a conversion value in the output of the operational amplification circuit, and providing the conversion value to the A/D conversion stage STG3, and performing a predetermined sampling operation in the A/D conversion stage STG3, the conversion value corresponding to the analog signal;
(b) after the step (a), connecting the first capacitor between an output and the inverting input of the operational amplification circuit in the A/D conversion stage STG1 and applying the reference voltage to the other terminal of the second capacitor to generate a conversion value in the output of the operational amplification circuit, to supply the conversion value to the A/D conversion stage STG2 and to perform the predetermined sampling operation in the A/D conversion stage STG2,
performing the predetermined conversion operation of a signal sampled in the A/D conversion stage STG3 to generate a conversion value in the output of the operational amplification circuit, supplying this conversion value to the A/D conversion stage STG4 to perform the predetermined sampling operation in the A/D conversion stage STG4, the conversion value being associated with the sampled signal;
(c) performing the predetermined conversion operation of a signal sampled in the A/D conversion stage STG2 to generate a conversion value in the output of the operational amplification circuit, and supplying this conversion value to the A/D conversion stage STG3, the conversion value being associated with the sampled signal,
performing the predetermined sampling operation in the A/D conversion stage STG3, then performing the predetermined conversion operation of a signal sampled in the A/D conversion stage STG4 to generate a conversion value in the output of the operational amplification circuit, and supplying this conversion value to the A/D conversion stage STG1 to perform the predetermined sampling operation in the A/D conversion stage STG1, the conversion value being associated with the sampled signal; and
(d) performing the predetermined conversion operation of a signal sampled in the A/D conversion stage STG3 to generate a conversion value in the output of the operational amplification circuit, supplying this conversion value to the A/D conversion stage STG4 to perform the predetermined sampling operation in the A/D conversion stage STG4, the conversion value being associated with the sampled signal, then performing the predetermined conversion operation of a signal sampled in the A/D conversion stage STG1 to generate a conversion value in the output of the operational amplification circuit, supplying this conversion value to the A/D conversion stage STG2 to perform a predetermined sampling operation in the A/D conversion stage STG2, the conversion value being associated with the sampled signal, wherein the predetermined sampling operation comprises the step of storing electric charges in the first capacitor and the second capacitor, the electric charges corresponding to an input analog signal; and wherein the predetermined conversion operation comprises the step of connecting the first capacitor between an output of the operational amplification circuit and an inverting input of the operational amplification circuit, and supplying a conversion analog signal to another terminal of the second capacitor to generate a conversion value in the output of the operational amplification circuit and rearrange the electric charges of the first and second capacitor, the conversion analog signal being associated with a digital signal, and the digital signal indicating an A/D conversion result in the A/D conversion stage.

39. The method according to claim 38, wherein a sample/hold circuit is connected to an input of any one A/D conversion stage from among the A/D conversion stages STG1 to STG4; and the analog signal in the step (a) is associated with a sample analog signal.

40. A method of generating a signal indicating a conversion error in an A/D conversion stage for generating a digital signal corresponding to an analog signal, the A/D conversion stage including first and second capacitors and an operational amplification circuit, the operational amplification circuit having an inverting input connected to one terminal of the first and second capacitors, and the conversion error includes a finite gain error due to a finite gain of the operational amplification circuit, the method comprising the steps of:
(a) connecting an output of the operational amplification circuit and the inverting input of the operational amplification circuit with each other and applying a reference voltage to another terminal of the second capacitor to another terminal of the first capacitor to generate a first conversion value in the output of the operational amplification circuit and to arrange electric charges in the first and second capacitors; and
(b) connecting the first capacitor between an output of the operational amplification circuit and the inverting input of the operational amplification circuit, and applying the reference voltage to the other terminal of the second capacitor to generate a second conversion value in the output of the operational amplification circuit and to rearrange electric charges in the first and second capacitors.

41. A method of generating a digital signal corresponding to an analog signal by using four A/D conversion stages STG1, STG2, STG3, STG4 connected in a loop, each of these A/D conversion stages including first and second capacitors and an operational amplification circuit, the operational amplification circuit having an inverting input connected to one terminal of the first and second capacitors, and each A/D conversion stage generating a signal of a digital value of the relevant A/D conversion stage;

the method comprising the steps of:
(a) connecting an output of the operational amplification circuit and the inverting input of the operational amplification circuit with each other and applying a reference voltage to another terminal of the second capacitor and another terminal of the first capacitor to arrange electric charges in the first and second capacitors in the A/D conversion stage STG1, and further performing a predetermined conversion operation of an analog signal in the A/D conversion stage STG2 to generate a conversion value in the output of the operational amplification circuit, supplying this conversion value to the A/D conversion stage STG3 to perform a predetermined sampling operation in the A/D conversion stage STG3, the conversion value corresponding to the analog signal;

(b) after the step (a), connecting the first capacitor between an output and the inverting input of the operational amplification circuit in the A/D conversion stage STG1 and applying the reference voltage to the other terminal of the second capacitor to generate a conversion value in the output of the operational amplification circuit, to supply the conversion value to the A/D conversion stage STG2, and to perform the predetermined sampling operation in the A/D conversion stage STG2, and further performing the predetermined conversion operation of a signal sampled in the A/D conversion stage STG3 to generate a conversion value, providing this conversion value to the A/D conversion stage STG4, and performing the predetermined sampling operation in the A/D conversion stage STG4, the conversion value being associated with the sampled signal for the output of the operational amplification circuit;

(c) performing the predetermined conversion operation of a signal sampled in the A/D conversion stage STG2 to generate a conversion value in the output of the operational amplification circuit, and supplying this conversion value to the A/D conversion stage STG3 to perform the predetermined sampling operation in the A/D conversion stage STG3, the conversion value being associated with a sampled signal, and performing the predetermined conversion operation of a signal sampled in the A/D conversion stage STG4 to generate a conversion value in the output of the operational amplification circuit, and supplying this conversion value to the A/D conversion stage STG1 to perform the predetermined sampling operation in the A/D conversion stage STG1, the conversion value being associated with a sampled signal; and (d) performing the predetermined conversion operation of a signal sampled in the A/D conversion stage STG3 to generate a conversion value in the output of the operational amplification circuit, supplying this conversion value to the A/D conversion stage STG4 to perform the predetermined sampling operation in the A/D conversion stage STG4, the conversion value being associated with the sampled signal, and performing the predetermined conversion operation of a signal sampled in the A/D conversion stage STG1 to generate a conversion value in the output of the operational amplification circuit, supplying this conversion value to the A/D conversion stage STG2 to perform the predetermined sampling operation in the A/D conversion stage STG2, the conversion value being associated with the sampled signal, wherein the predetermined sampling operation comprises the step of storing an electric charge in the first capacitor and the second capacitor, the electric charge being associated with an input analog signal; and wherein the predetermined conversion operation comprises the step of connecting the first capacitor between an output of the operational amplification circuit and an inverting input of the operational amplification circuit, and supplying a conversion analog signal to the other terminal of the second capacitor to generate a conversion value in the output of the operational amplification circuit and to rearrange the electric charges of the first and second capacitors, the conversion analog signal being associated with a digital signal, and the digital signal indicating an A/D conversion result in the relevant A/D conversion stage.

42. The method according to claim 41, wherein a sample/hold circuit is connected to an input of any one of A/D conversion stage from among the A/D conversion stages STG1 to STG4; and the analog signal in the step (a) is associated with a sample analog signal.

* * * * *